(12) United States Patent
Shinohara et al.

(10) Patent No.: US 9,666,584 B2
(45) Date of Patent: *May 30, 2017

(54) METHOD OF MANUFACTURING SEMICONDUCTOR INTEGRATED CIRCUIT DEVICE

(71) Applicant: Renesas Electronics Corporation, Tokyo (JP)

(72) Inventors: Masaaki Shinohara, Kanagawa (JP); Satoshi Iida, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/216,856

(22) Filed: Jul. 22, 2016

(65) Prior Publication Data

US 2016/0329330 A1 Nov. 10, 2016

Related U.S. Application Data

(63) Continuation of application No. 15/053,551, filed on Feb. 25, 2016, now Pat. No. 9,418,996, which is a (Continued)

(30) Foreign Application Priority Data

Jul. 1, 2014 (JP) .................................. 2014-135896

(51) Int. Cl.
*H01L 27/092* (2006.01)
*H01L 29/06* (2006.01)
(Continued)

(52) U.S. Cl.
CPC ........ *H01L 27/0922* (2013.01); *H01L 21/308* (2013.01); *H01L 21/76205* (2013.01); (Continued)

(58) Field of Classification Search
None
See application file for complete search history.

(56) References Cited

U.S. PATENT DOCUMENTS 6,984,553 B2 1/2006 Jeng
8,692,352 B2 4/2014 Onishi et al.
(Continued)

FOREIGN PATENT DOCUMENTS

| JP | 2011-066067 A | 3/2011 |
| JP | 2011-187530 A | 9/2011 |
| JP | 2012-018973 A | 1/2012 |

*Primary Examiner* — Angel Roman
(74) *Attorney, Agent, or Firm* — Shapiro, Gabor and Rosenberger, PLLC

(57) ABSTRACT

Using an STI insulating film in a high breakdown voltage MOSFET leads to deterioration in reliability due to impact ionization near the bottom corner of a drain isolation insulating film.

The invention provides a method of manufacturing a semiconductor integrated circuit device including forming a hard mask film, an opening therein, and a sidewall insulating film on the side surface thereof; forming a shallow trench in the opening with the hard mask film as a mask and oxidizing at least an exposed portion; filling the trench with an insulating film and then removing it so as to leave it outside the trench in the opening and thereby forming a drain offset STI insulating film inside and outside the trench; and forming a gate electrode extending from the upper portion of a gate insulating film in an active region contiguous thereto to the upper portion of the drain offset insulating film.

4 Claims, 54 Drawing Sheets

Related U.S. Application Data continuation of application No. 14/738,846, filed on Jun. 13, 2015, now Pat. No. 9,305,824.

(51) Int. Cl.

| | | |
|---|---|---|
| *H01L 29/49* | (2006.01) | |
| *H01L 21/762* | (2006.01) | |
| *H01L 29/66* | (2006.01) | |
| *H01L 29/78* | (2006.01) | |
| *H01L 21/308* | (2006.01) | |
| *H01L 21/8238* | (2006.01) | |
| *H01L 29/10* | (2006.01) | |
| *H01L 29/423* | (2006.01) | |
| *H01L 29/08* | (2006.01) | |

(52) U.S. Cl.
CPC ......... *H01L 21/76224* (2013.01); *H01L 21/823878* (2013.01); *H01L 29/0653* (2013.01); *H01L 29/1083* (2013.01); *H01L 29/4916* (2013.01); *H01L 29/6659* (2013.01); *H01L 29/66681* (2013.01); *H01L 29/66689* (2013.01); *H01L 29/7816* (2013.01); *H01L 29/7833* (2013.01); *H01L 29/0878* (2013.01); *H01L 29/42368* (2013.01); *H01L 29/665* (2013.01)

(56) References Cited

U.S. PATENT DOCUMENTS

| | | | |
|---|---|---|---|
| 9,418,996 B2* | 8/2016 | Shinohara | H01L 21/76224 |
| 2004/0157405 A1 | 8/2004 | Lee | |
| 2008/0057612 A1 | 3/2008 | Doan et al. | |
| 2010/0062579 A1 | 3/2010 | Juengling et al. | |
| 2011/0003458 A1 | 1/2011 | Lee et al. | |
| 2011/0215423 A1 | 9/2011 | Iwamatsu et al. | |
| 2012/0007151 A1 | 1/2012 | Yoshimori et al. | |
| 2012/0168897 A1 | 7/2012 | Ma et al. | |
| 2013/0062680 A1 | 3/2013 | Kato | |

* cited by examiner

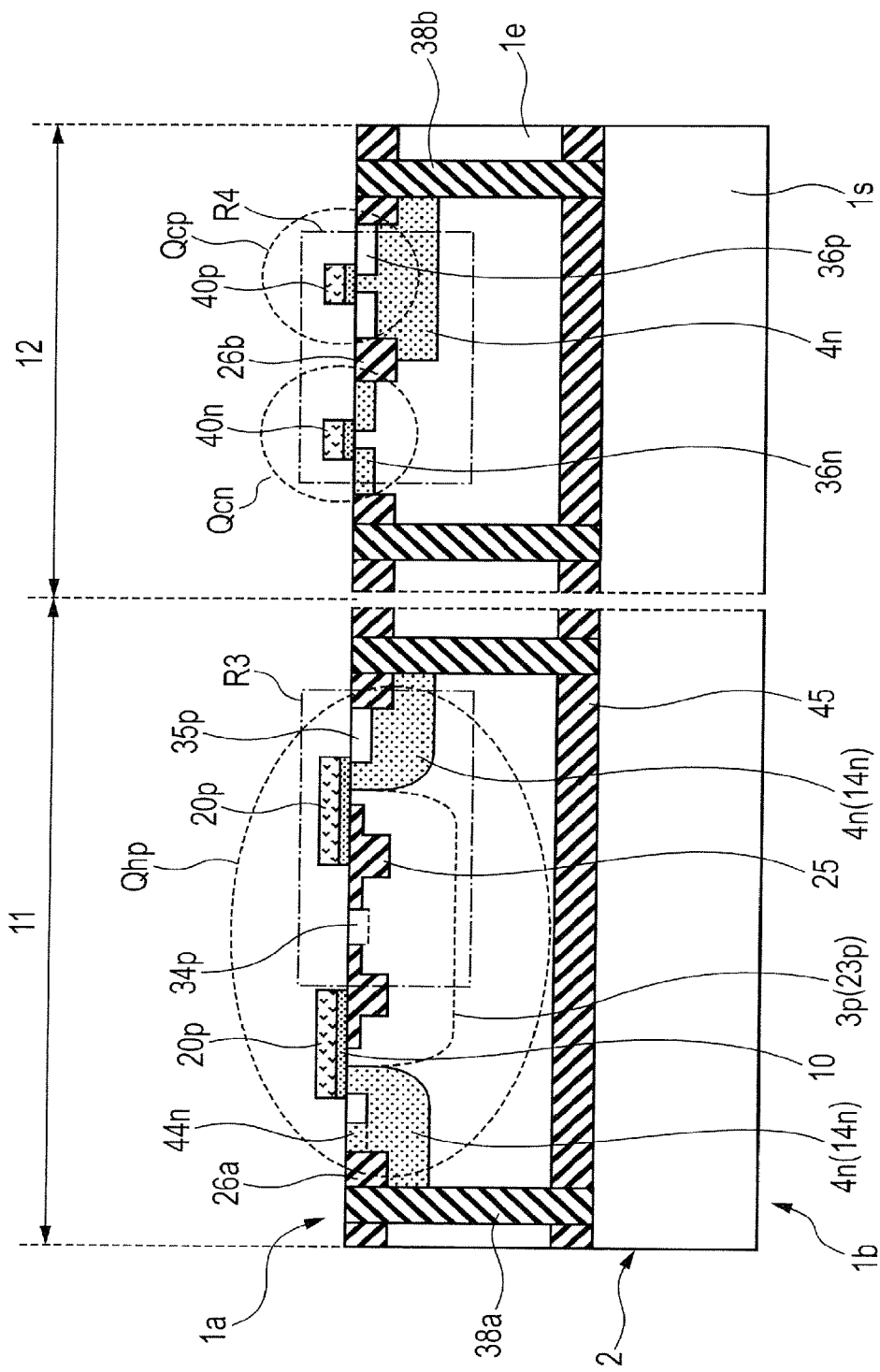

METHOD OF MANUFACTURING SEMICONDUCTOR INTEGRATED CIRCUIT DEVICE

CROSS-REFERENCE TO RELATED APPLICATIONS

The disclosure of Japanese Patent Application No. 2014-135896 filed on Jul. 1, 2014 including the specification, drawings, and abstract is incorporated herein by reference in its entirety.

BACKGROUND

The present invention relates to a method of manufacturing a semiconductor integrated circuit device (or semiconductor device), for example, a method applicable to a semiconductor integrated circuit device having a high breakdown voltage transistor.

Japanese Unexamined Patent Application Publication No. 2011-187530 (Patent Document 1) or U.S. Patent Publication No. 2011-215423 (Patent Document 2) corresponding thereto relates to a CMOS (complementary metal-oxide-semiconductor) semiconductor integrated circuit. Disclosed herein is a technology of forming a trench in the surface of a semiconductor substrate and thereby providing an insulated gate FET (field effect transistor) having a high drain current. This document discloses, for example, a MOSFET having a trench extending beneath a gate from a source contact region to a drain contact region.

Japanese Unexamined Patent Application Publication No. 2012-18973 (Patent Document 3) or U.S. Patent Publication No. 2012-7151 (Patent Document 4) corresponding thereto relates to a CMOS semiconductor integrated circuit having integrated high breakdown voltage transistors. Disclosed herein is a high breakdown voltage MIS (metal-insulator-semiconductor) FET having a trench or the like running parallel to or perpendicular to a channel direction in a channel region or the like.

Japanese Unexamined Patent Application Publication No. 2011-66067 (Patent Document 5) or U.S. Patent No. 2012-8692352 (Patent Document 6) corresponding thereto relates to a CMOS semiconductor integrated circuit having high breakdown voltage lateral transistors Integrated therein. Disclosed herein is a CMOS semiconductor integrated circuit in which high breakdown voltage lateral MOSFETs are isolated from each other by a DTI (deep trench isolation) or the like.

PATENT DOCUMENTS

[Patent Document 1] Japanese Unexamined Patent Application Publication No. 2011-187530
[Patent Document 2] U.S. Patent Publication No. 2011-215423
[Patent Document 3] Japanese Unexamined Patent Application Publication No. 2012-18973
[Patent Document 4] U.S. Patent Publication No. 2012-7151
[Patent Document 5] Japanese Unexamined Patent Application Publication No. 2011-66067
[Patent Document 6] U.S. Pat. No. 8,692,352

SUMMARY

In the manufacture of a high breakdown voltage MOSFET (for example, LDMOSFET) or the like, using a LOCOS type field insulating film or the like for element isolation or another isolation prolongs a treatment step and thereby raises a manufacture cost. The present inventors have on the other hand revealed that when an STI type field insulating film or the like is used, high-energy electrons are generated in the vicinity of the bottom corner portion of a drain isolation insulating film due to impact ionization and the resulting high breakdown voltage MOSFET or the like has deteriorated reliability. Such a tendency is particularly marked in a high breakdown voltage P type LDMOSFET.

A means of overcoming such a problem will next be described. Another problem and novel features will be apparent from the description herein and accompanying drawings.

Of the embodiments disclosed herein, typical ones will next be outlined briefly.

First embodiment of the present application is outlined below. There is provided a method of manufacturing a semiconductor integrated circuit device including the following steps: (1) first, forming a hard mask film on a first main surface of a semiconductor wafer and making a first opening in the hard mask film in a first region on the first main surface; (2) then, forming a sidewall insulating film on the side surface of the hard mask film of the first opening; (3) then, with the hard mask film and the sidewall insulating film as masks, forming a first shallow trench in a semiconductor region surface of the first main surface in the first opening; (4) then, oxidizing at least an exposed portion of the inner surface of the first shallow trench and the semiconductor region surface of the first main surface in the first opening; (5) then, filling the first shallow trench and the first opening with an insulating film; (6) then, removing the insulating film outside the first shallow trench so as to leave the insulating film outside the first shallow trench in the first opening and thereby forming a drain offset STI insulating film both inside and outside the first shallow trench; and (7) then, forming a first gate electrode that extends from an upper portion of the gate insulating film in a first active region adjacent to the drain offset STI insulating film to an upper portion of the drain offset insulating film.

Advantages available by typical embodiments, among those disclosed herein, will next be described simply.

According to First Embodiment of the present application, a high breakdown voltage MOSFET having improved reliability can be provided.

Figure 1:
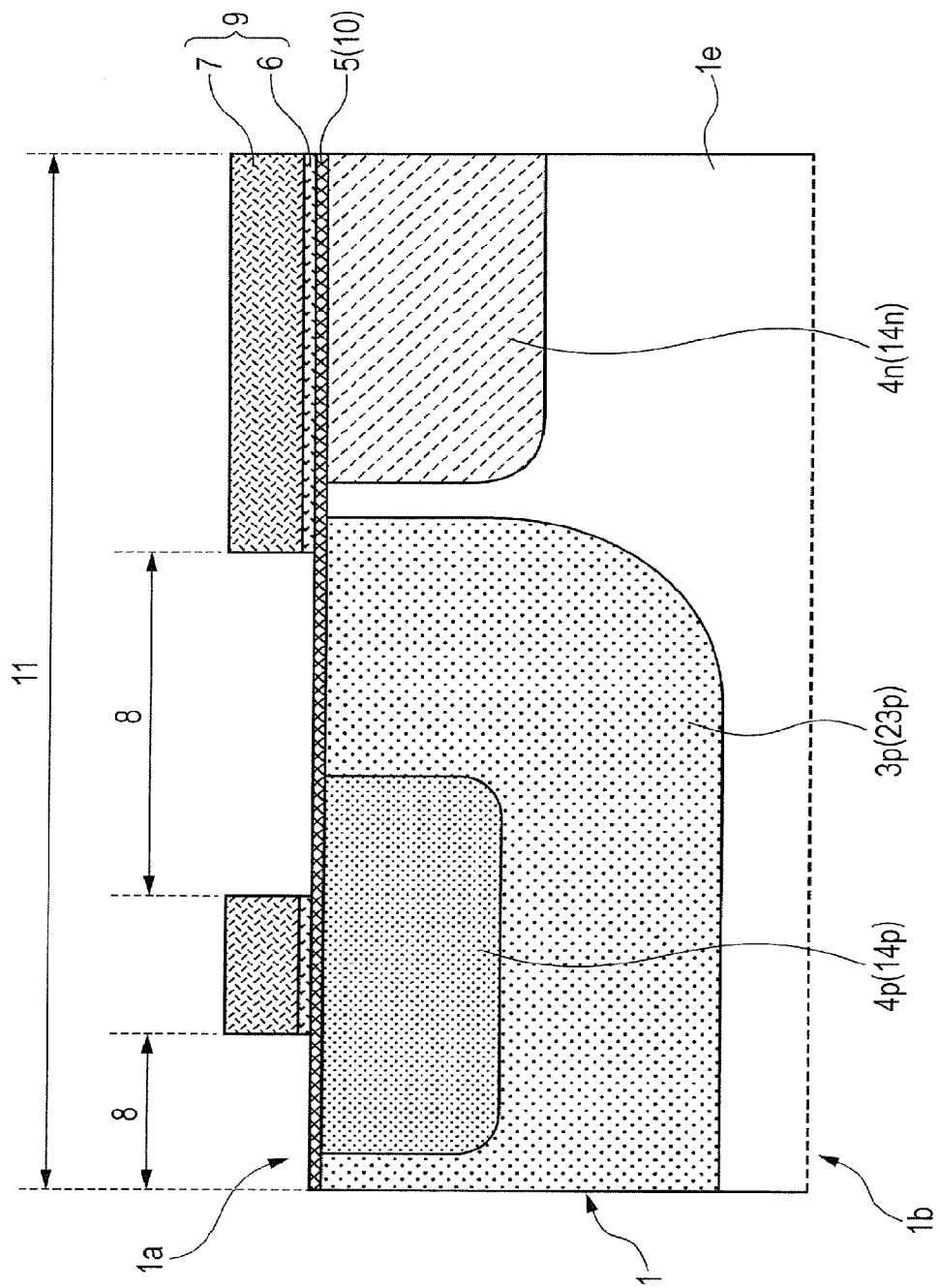
FIG. 1 is a device cross-sectional view of a high breakdown voltage device region during a wafer process (a hard mask primary processing step) for describing a method of manufacturing a semiconductor integrated circuit device according to First Embodiment of the present application.
Figure 3:
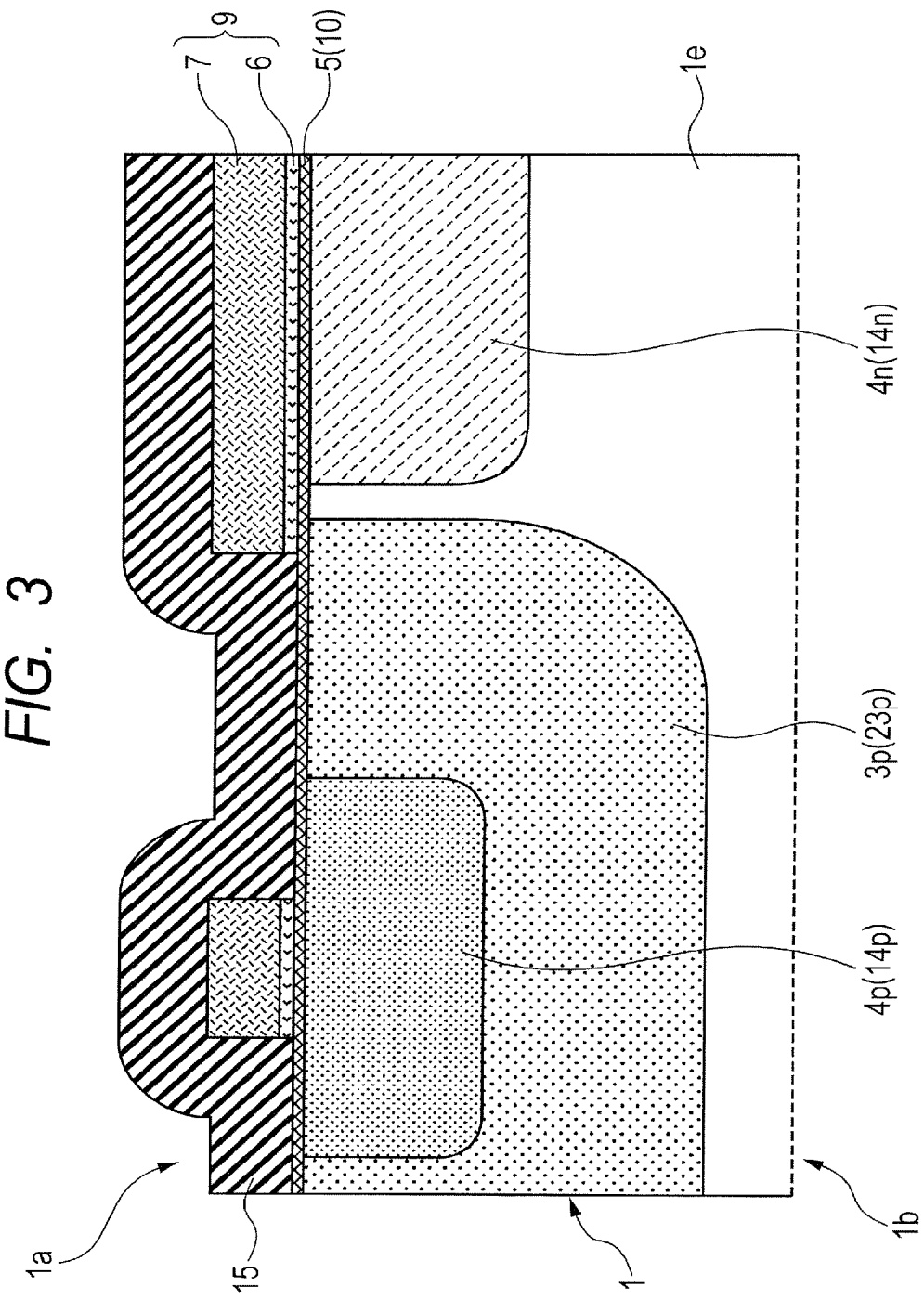
FIG. 3 is a device cross-sectional view of the high breakdown voltage device region during the wafer process (a step of forming a sidewall silicon oxide film-based insulating film for processing) for describing the method of manufacturing a semiconductor integrated circuit device according to First Embodiment of the present application.
Figure 4:
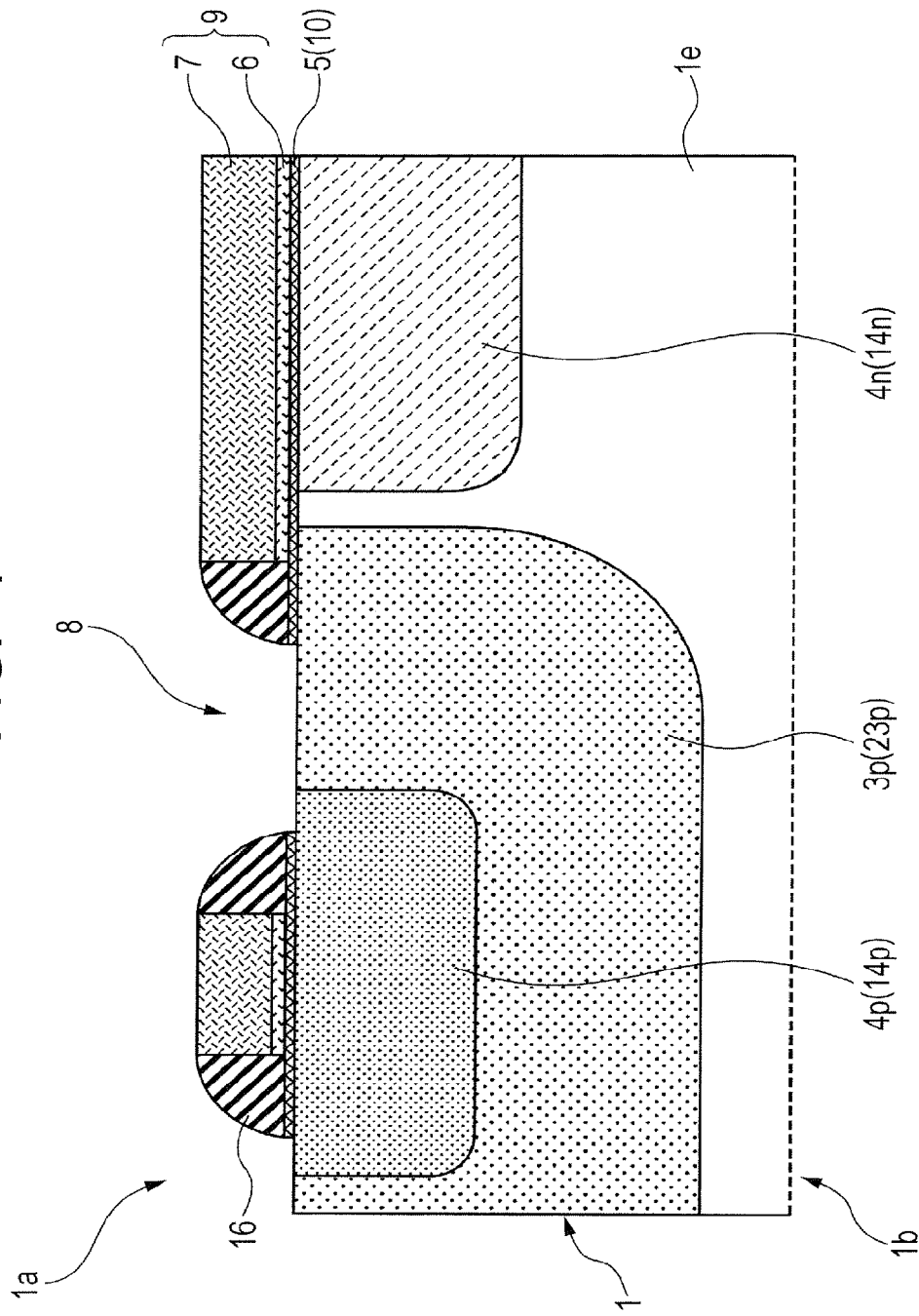
FIG. 4 is a device cross-sectional view of the high breakdown voltage device region during the wafer process (a step of forming a sidewall insulating film for processing)
Figure 5:
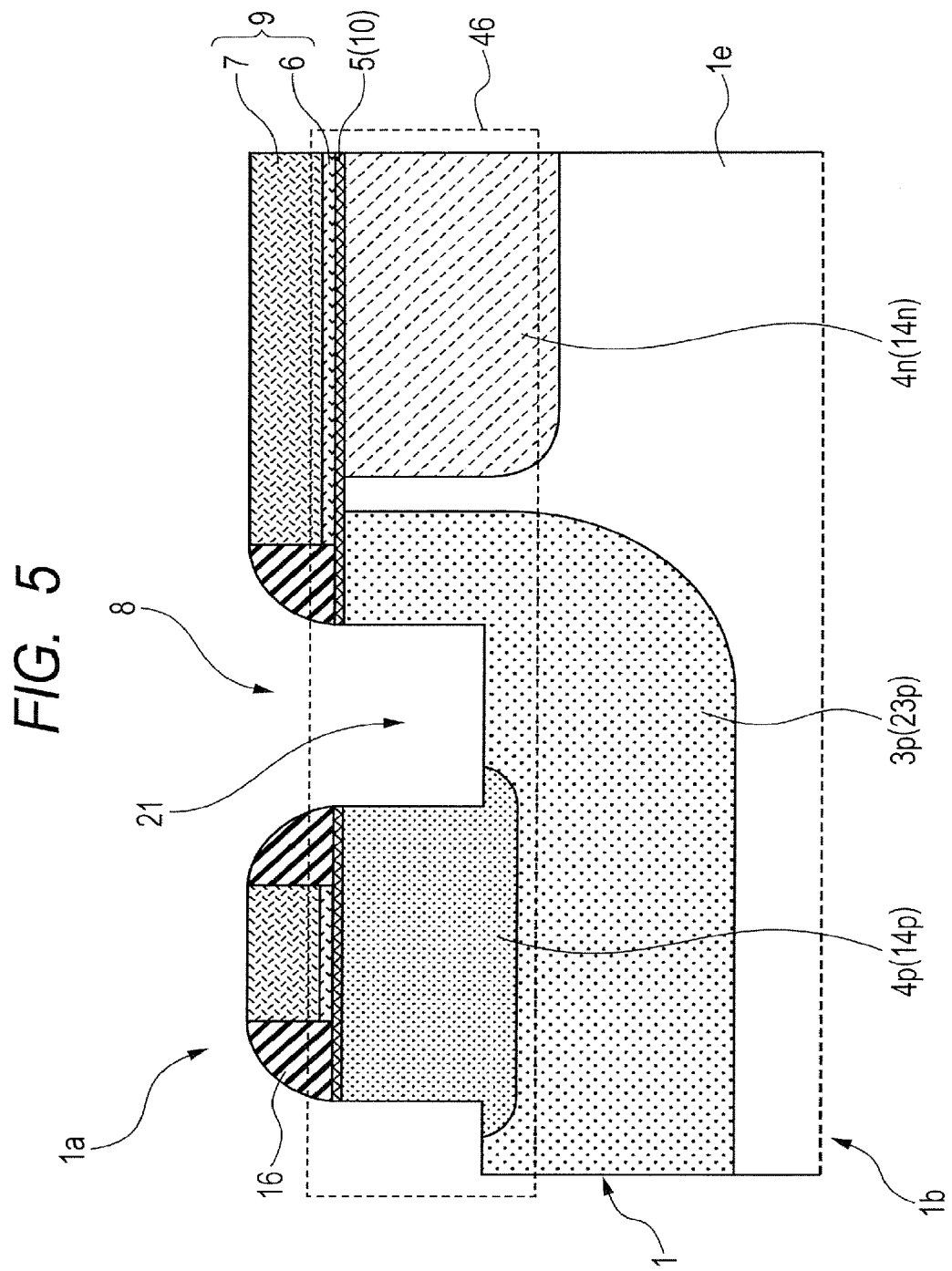
Figure 6:
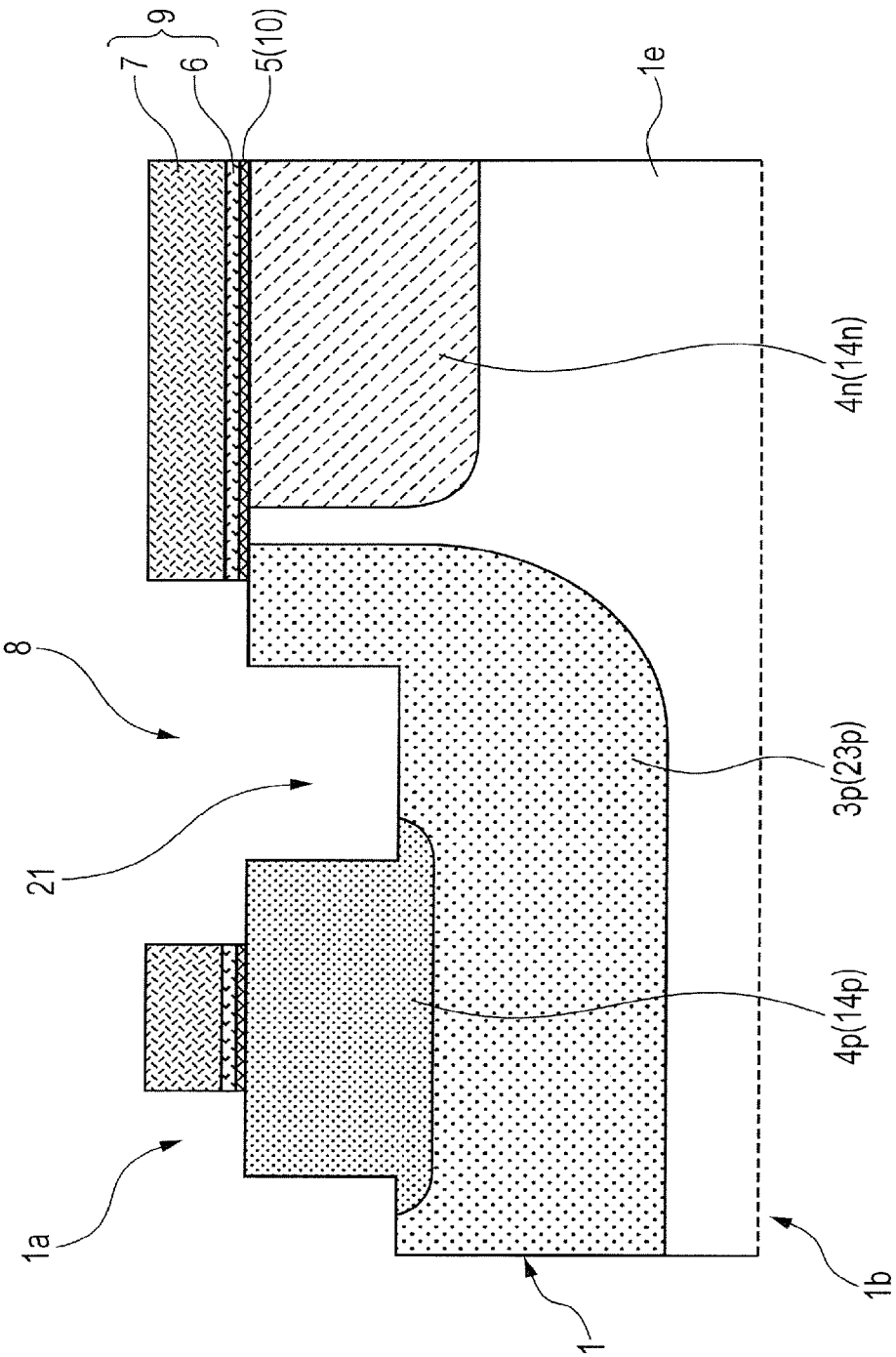
Figure 7:
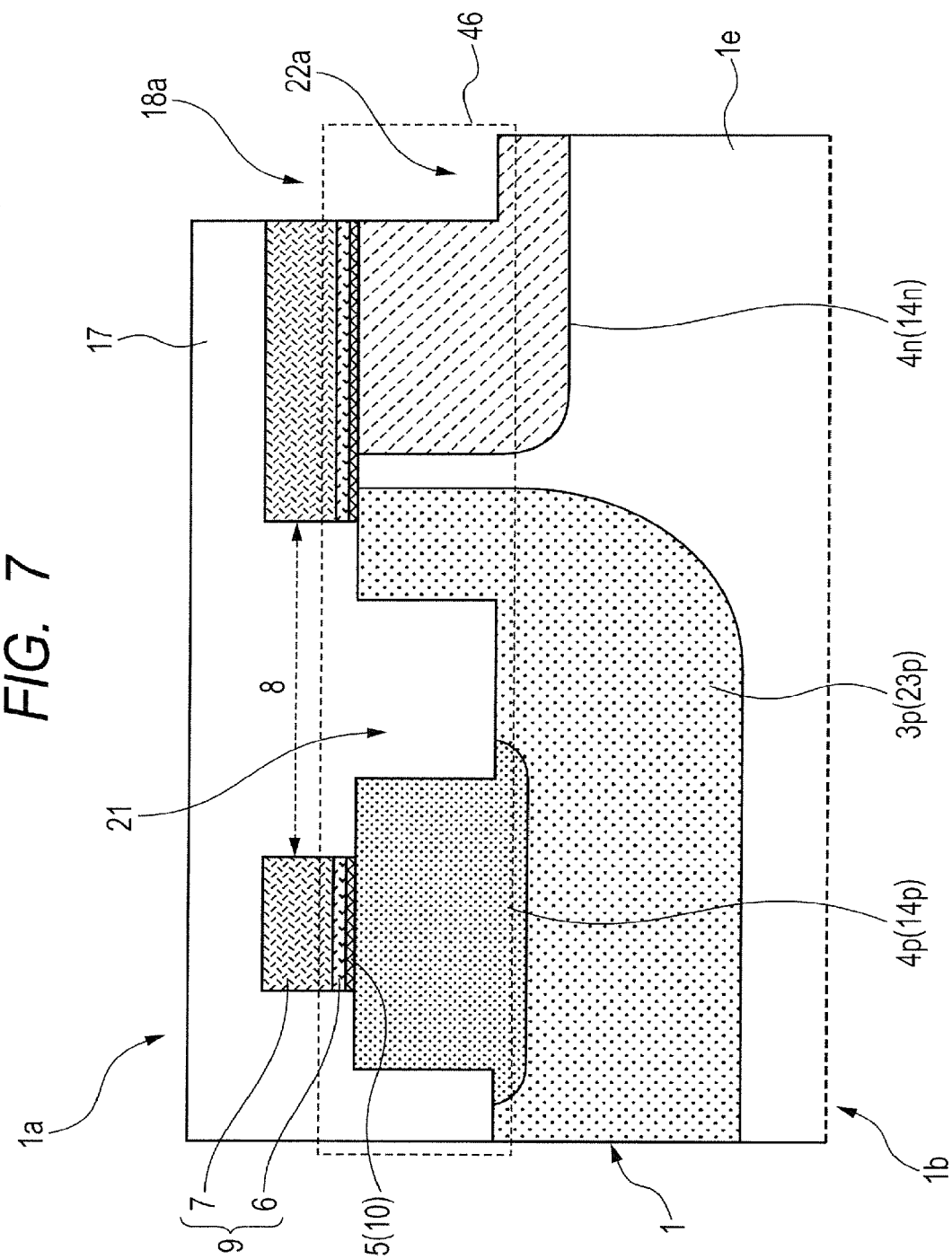
Figure 8:
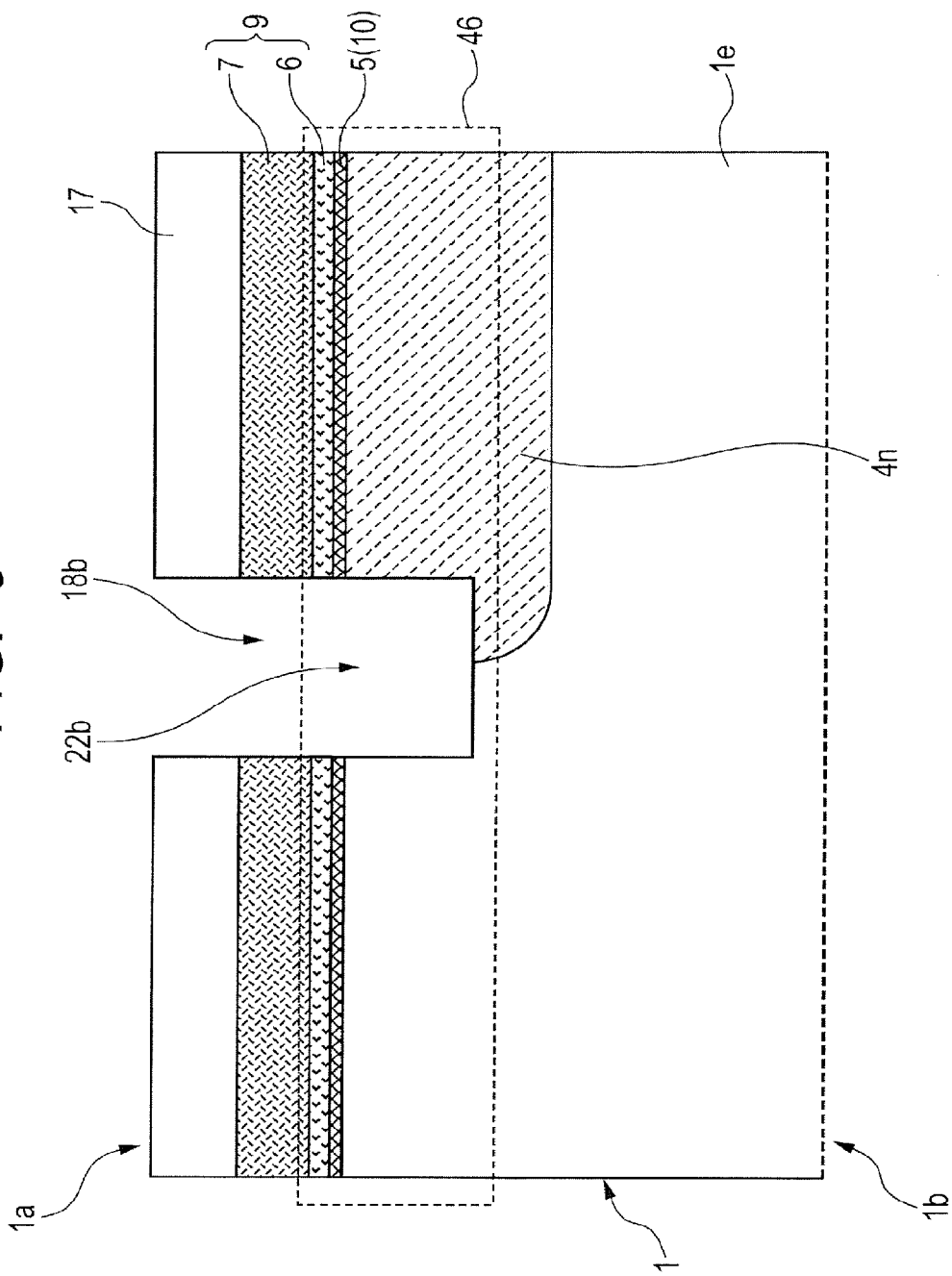
Figure 9:
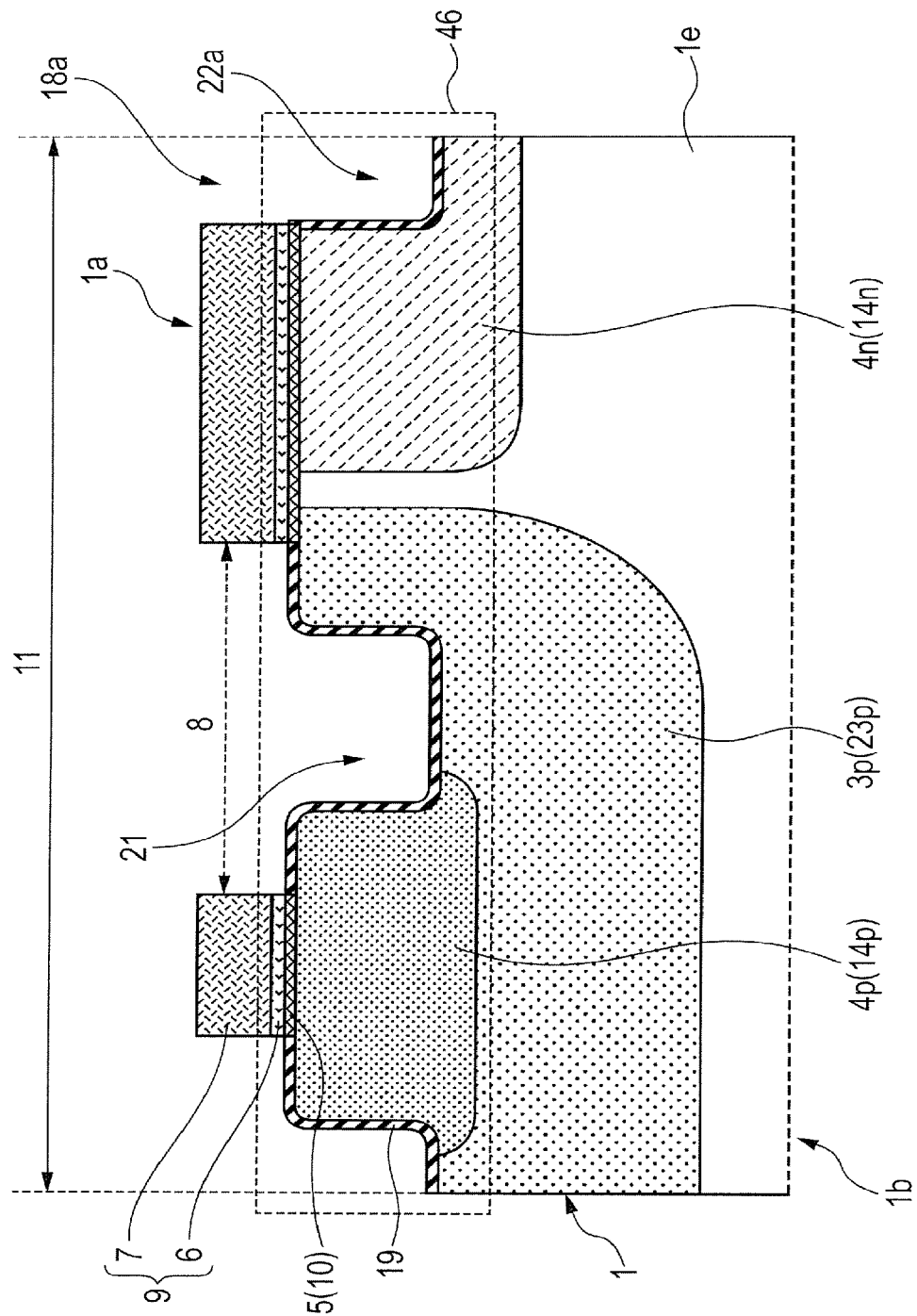
Figure 10:
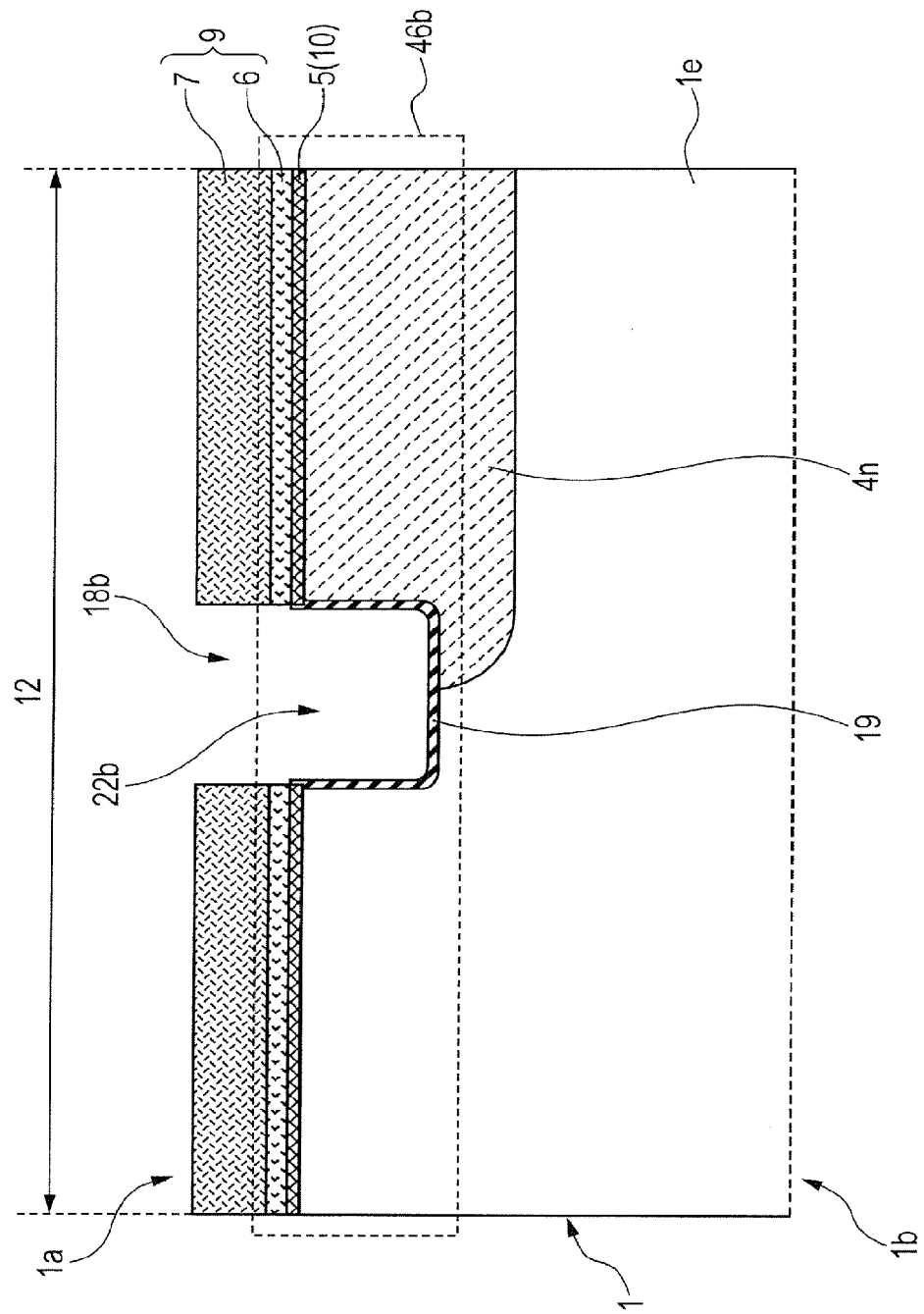
Figure 11:
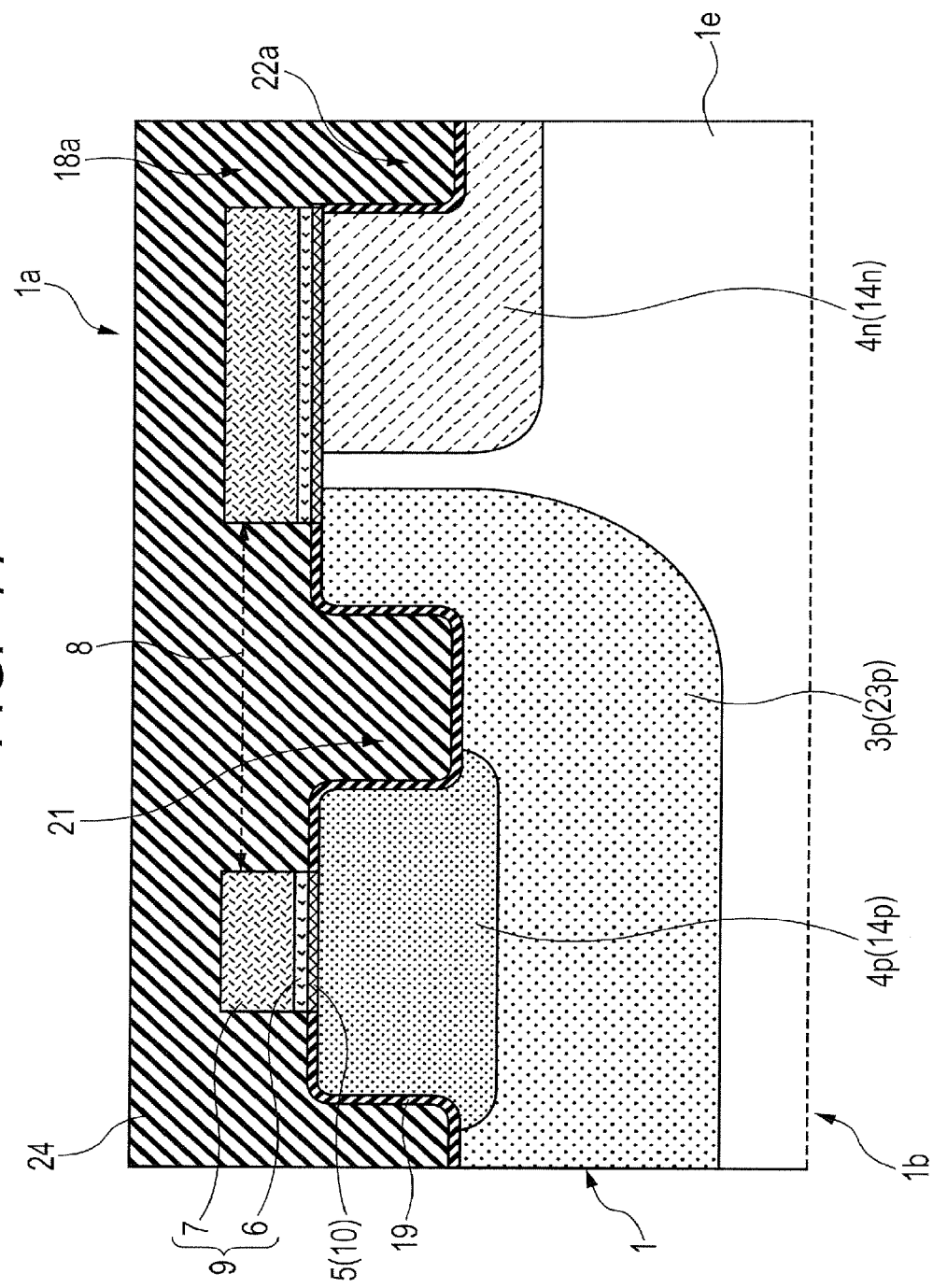
Figure 12:
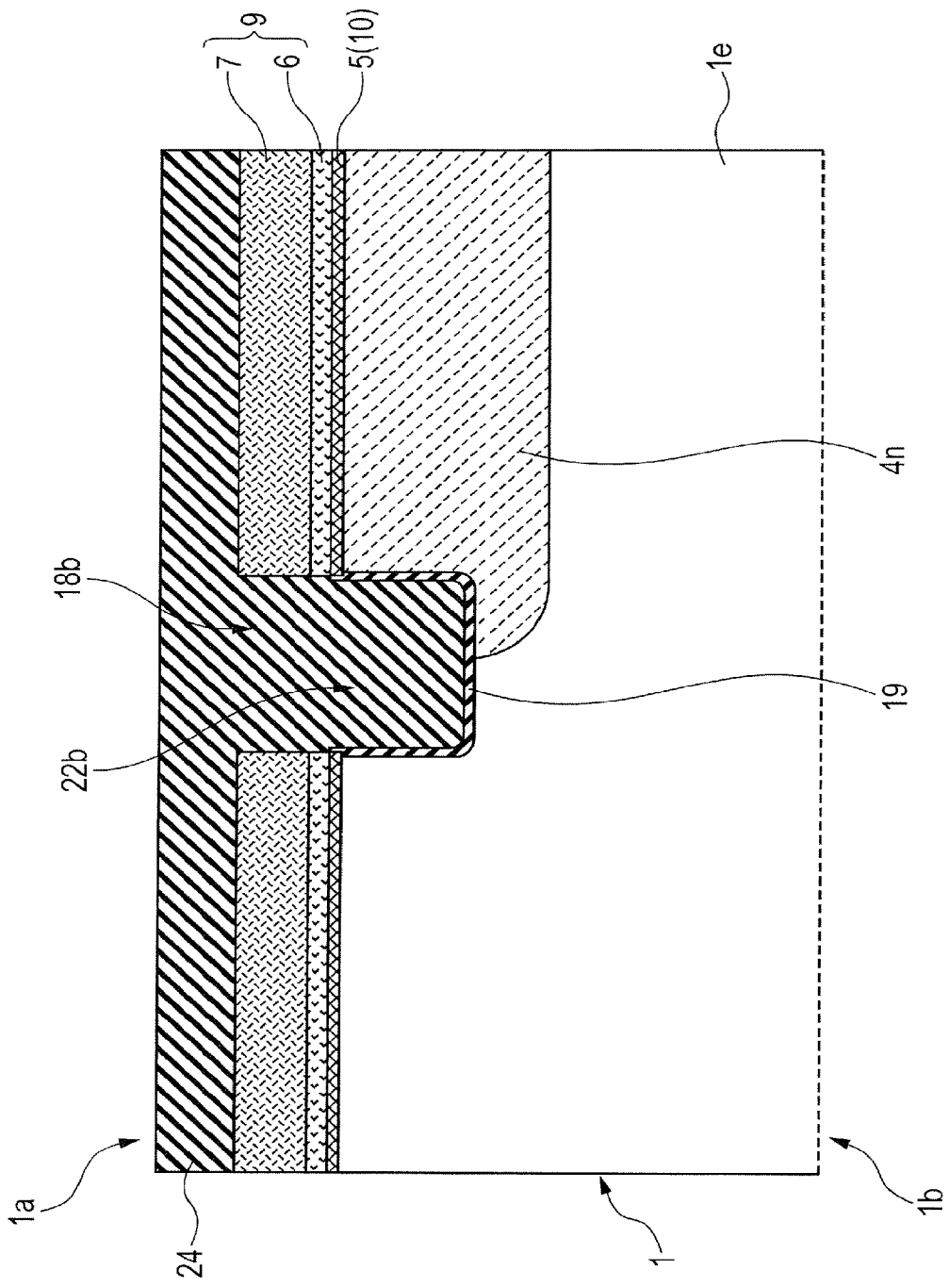
Figure 13:
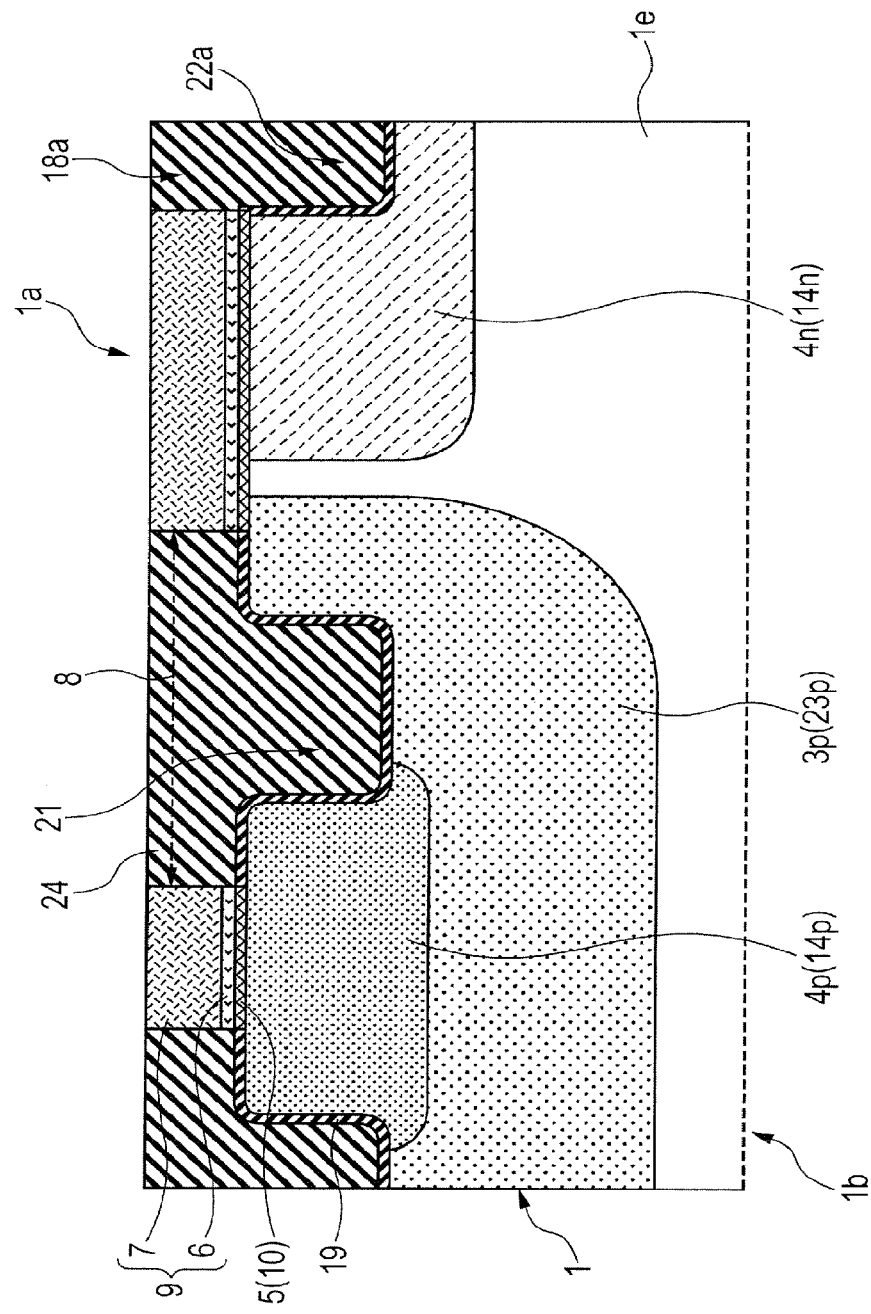
Figure 14:
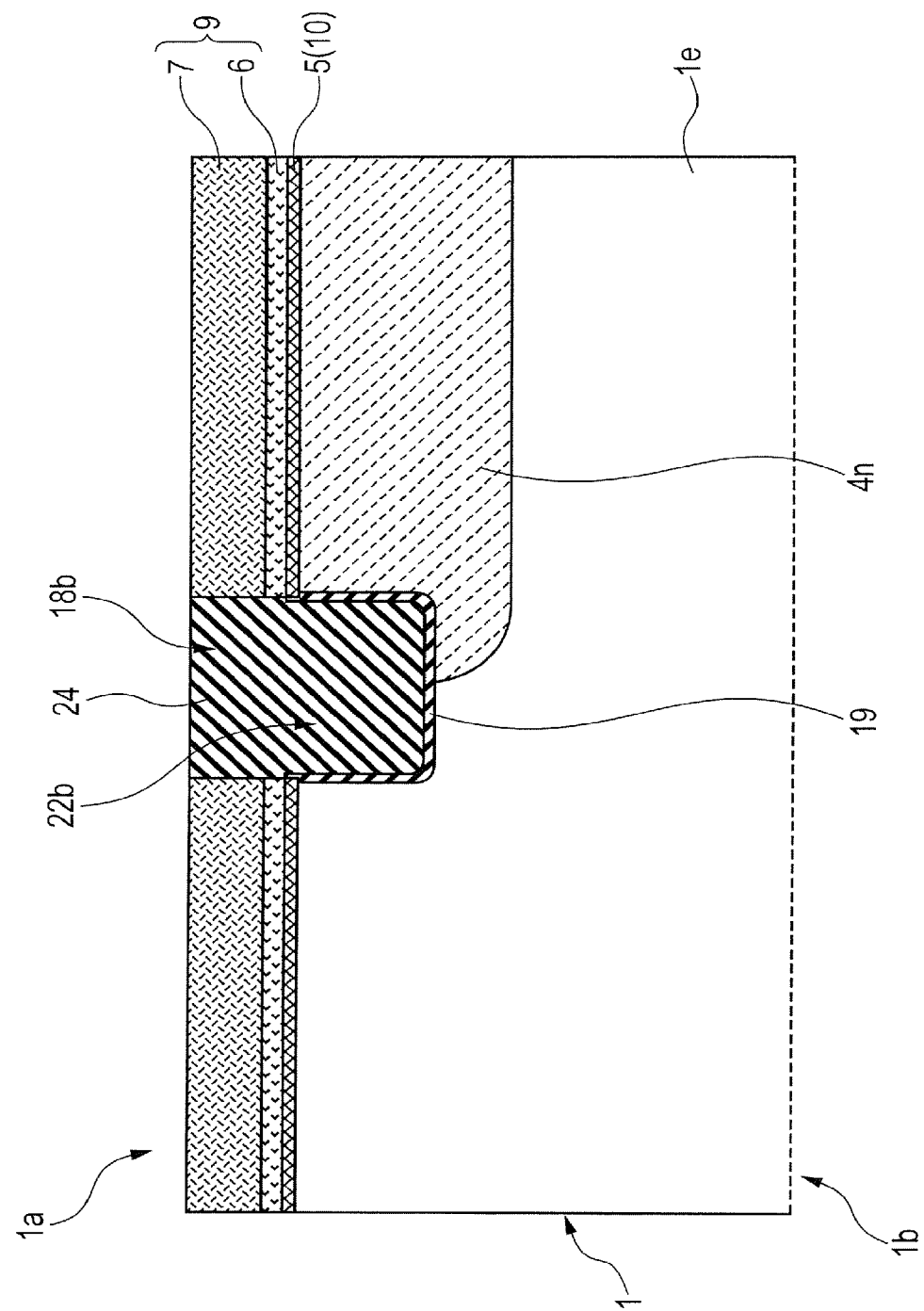
Figure 15:
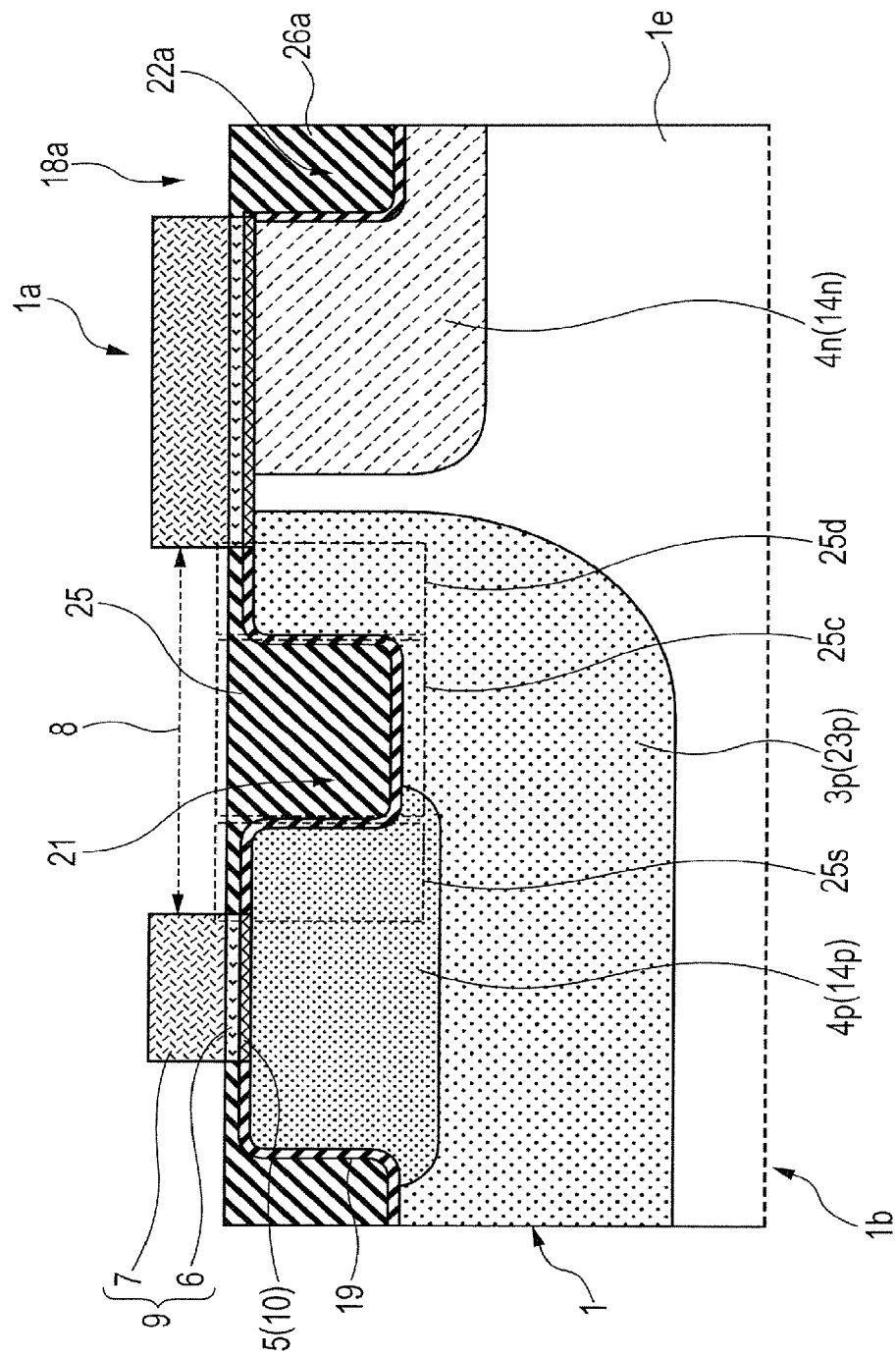
Figure 16:
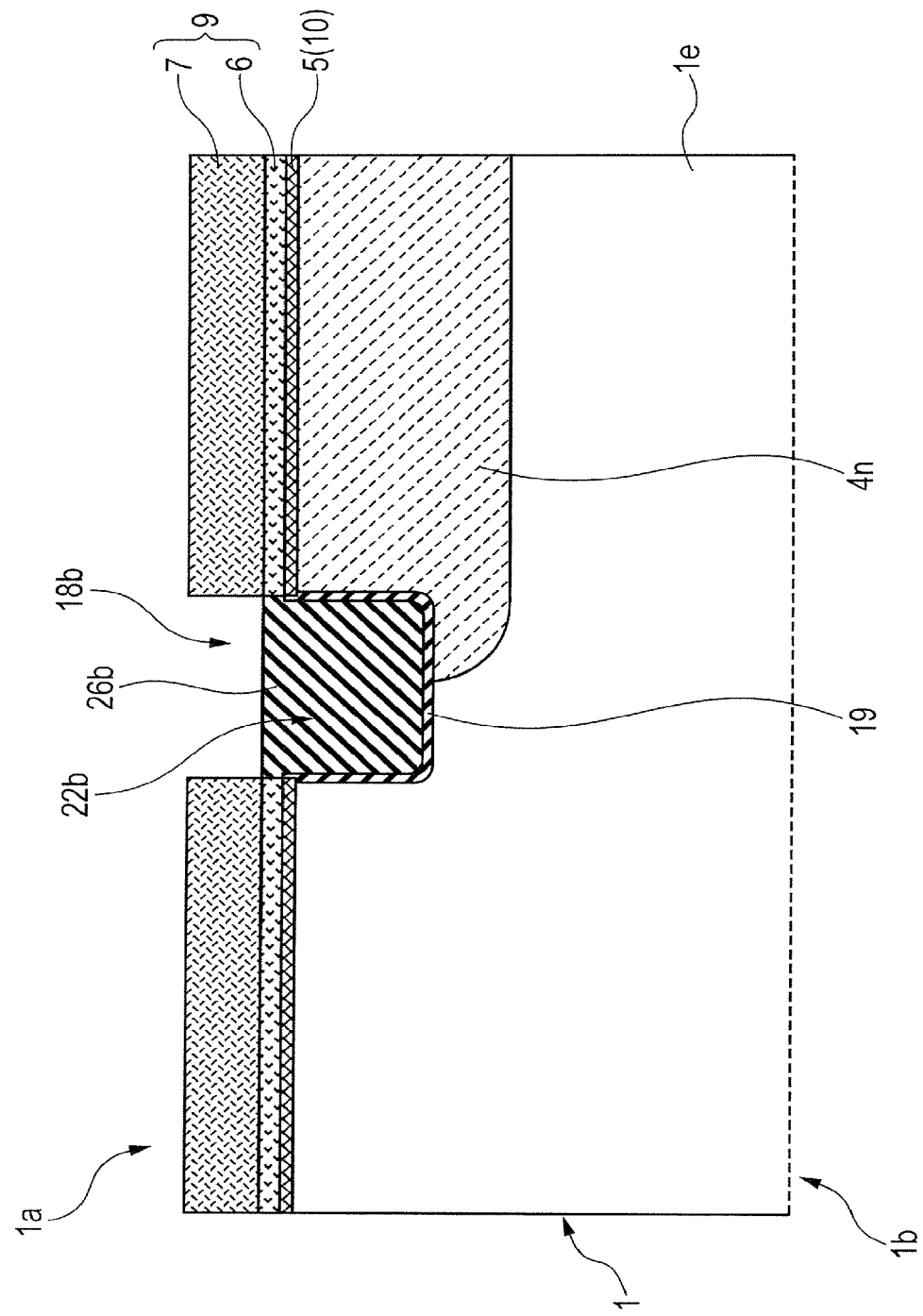
Figure 17:
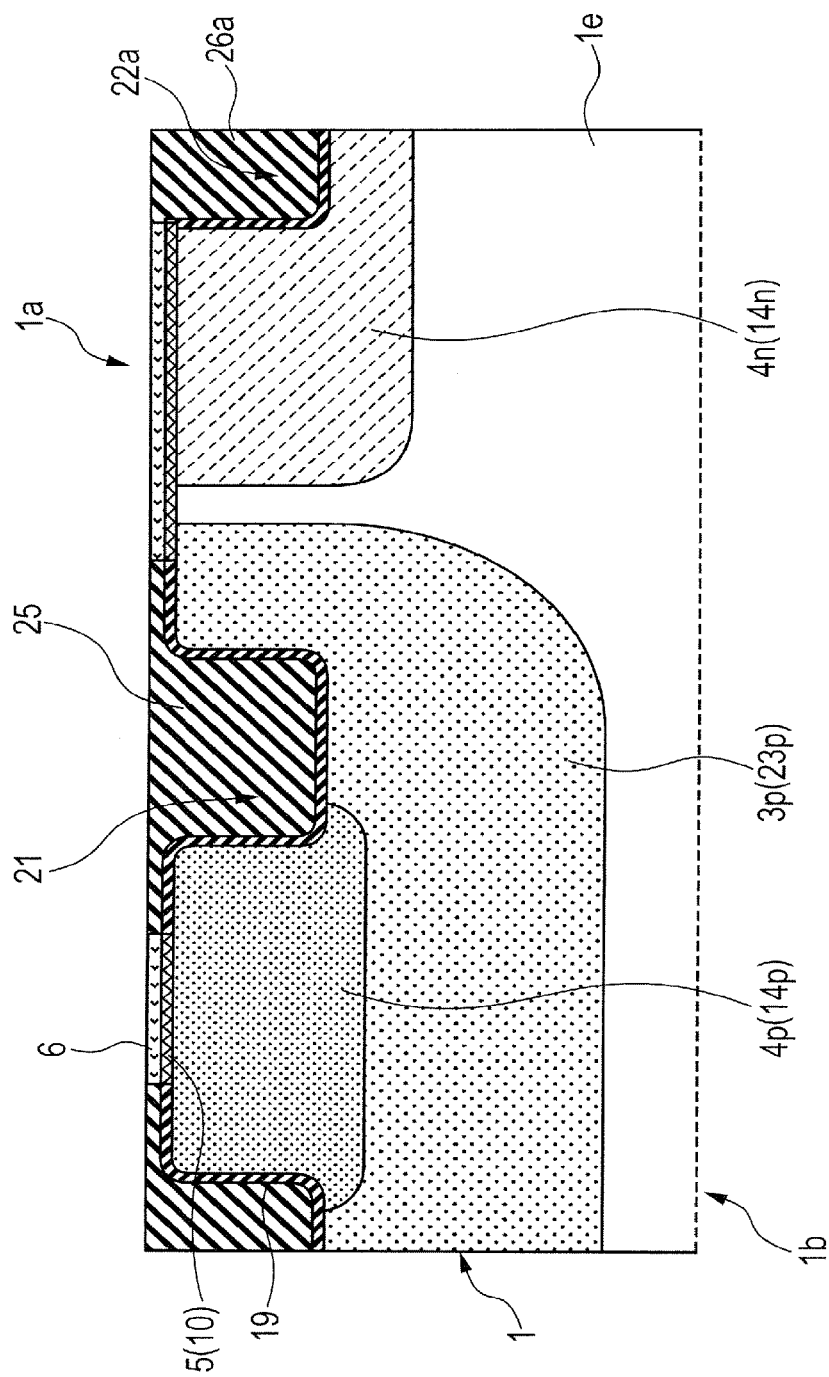
Figure 18:
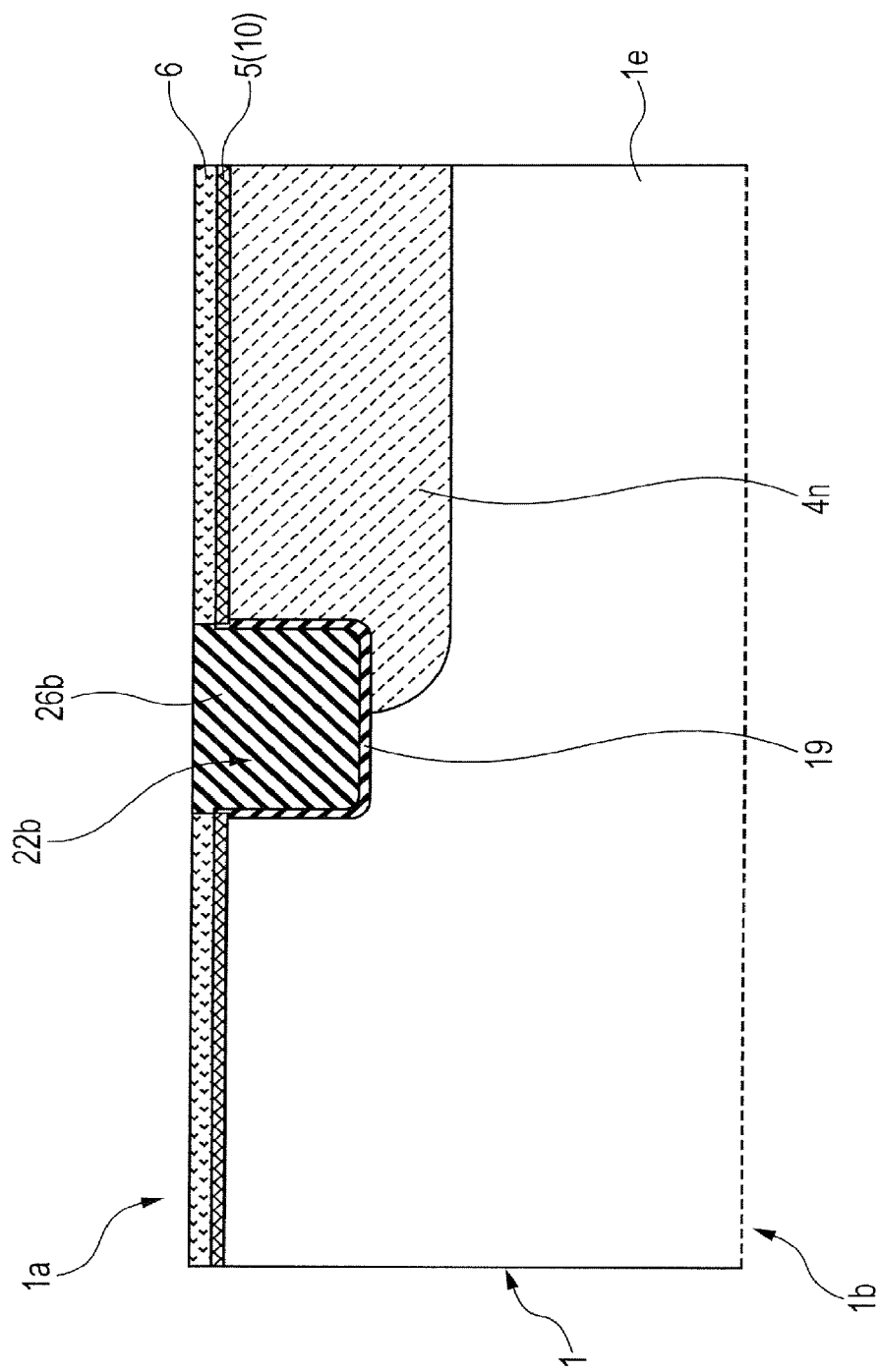
Figure 19:
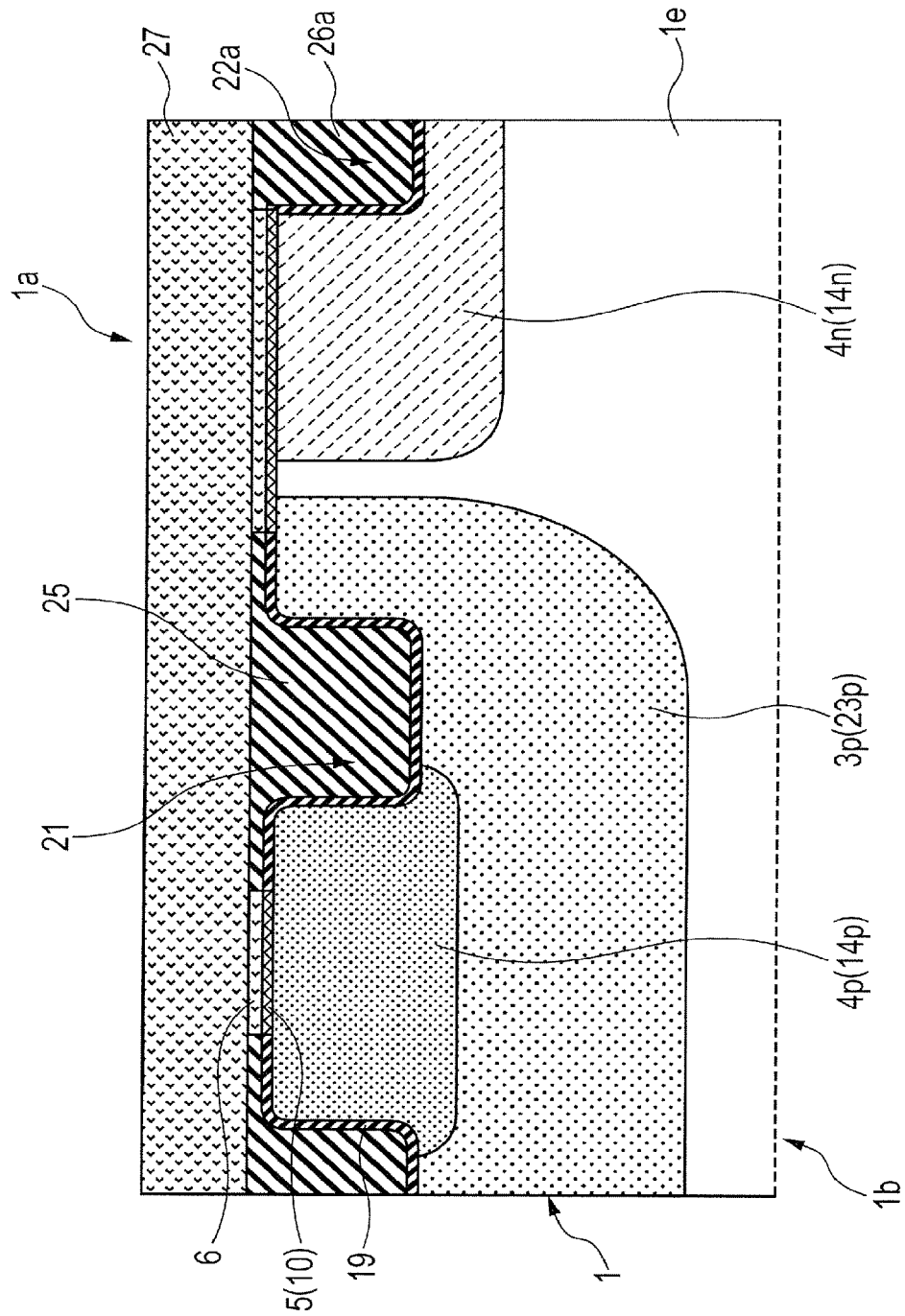
Figure 20:
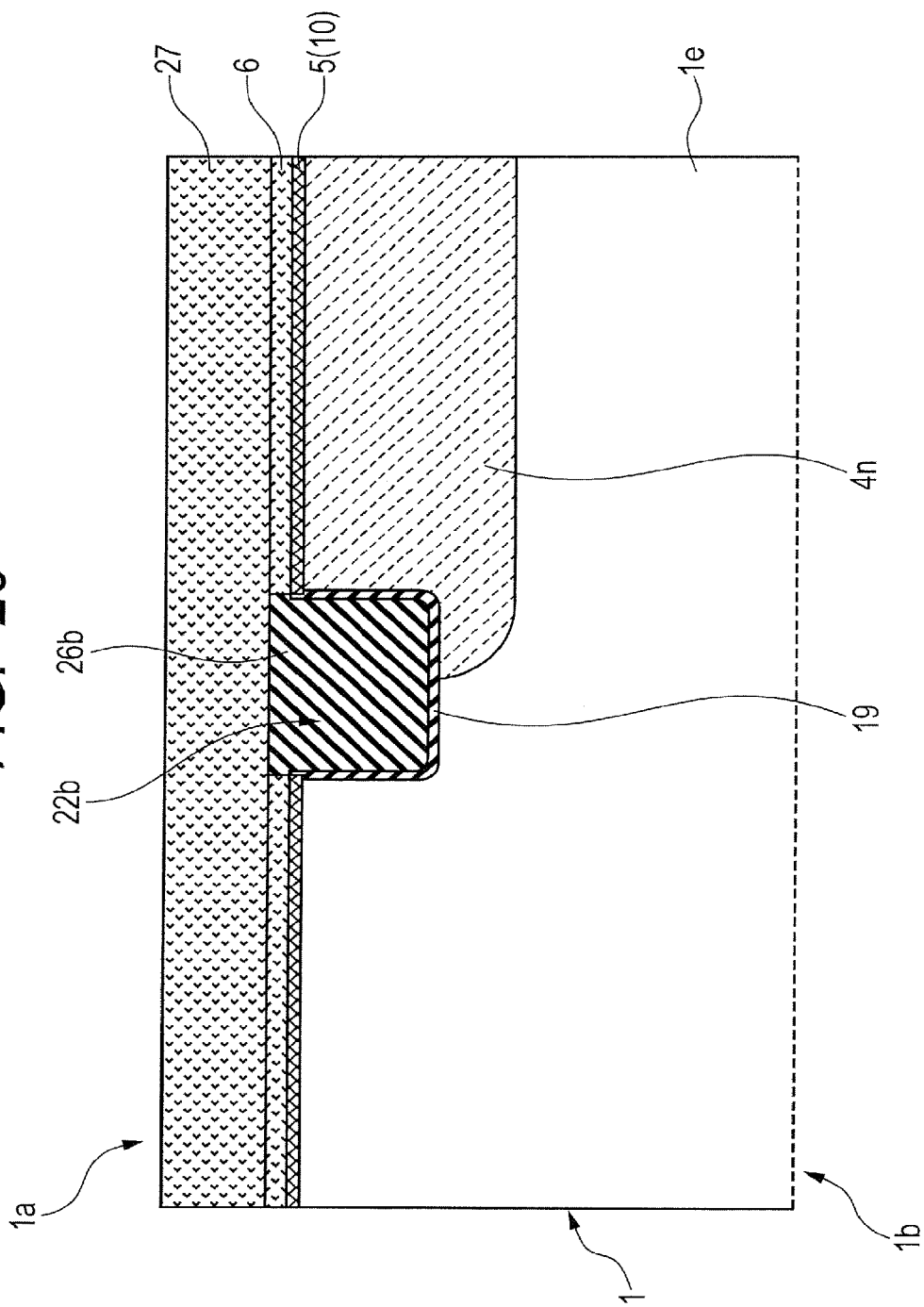
Figure 21:
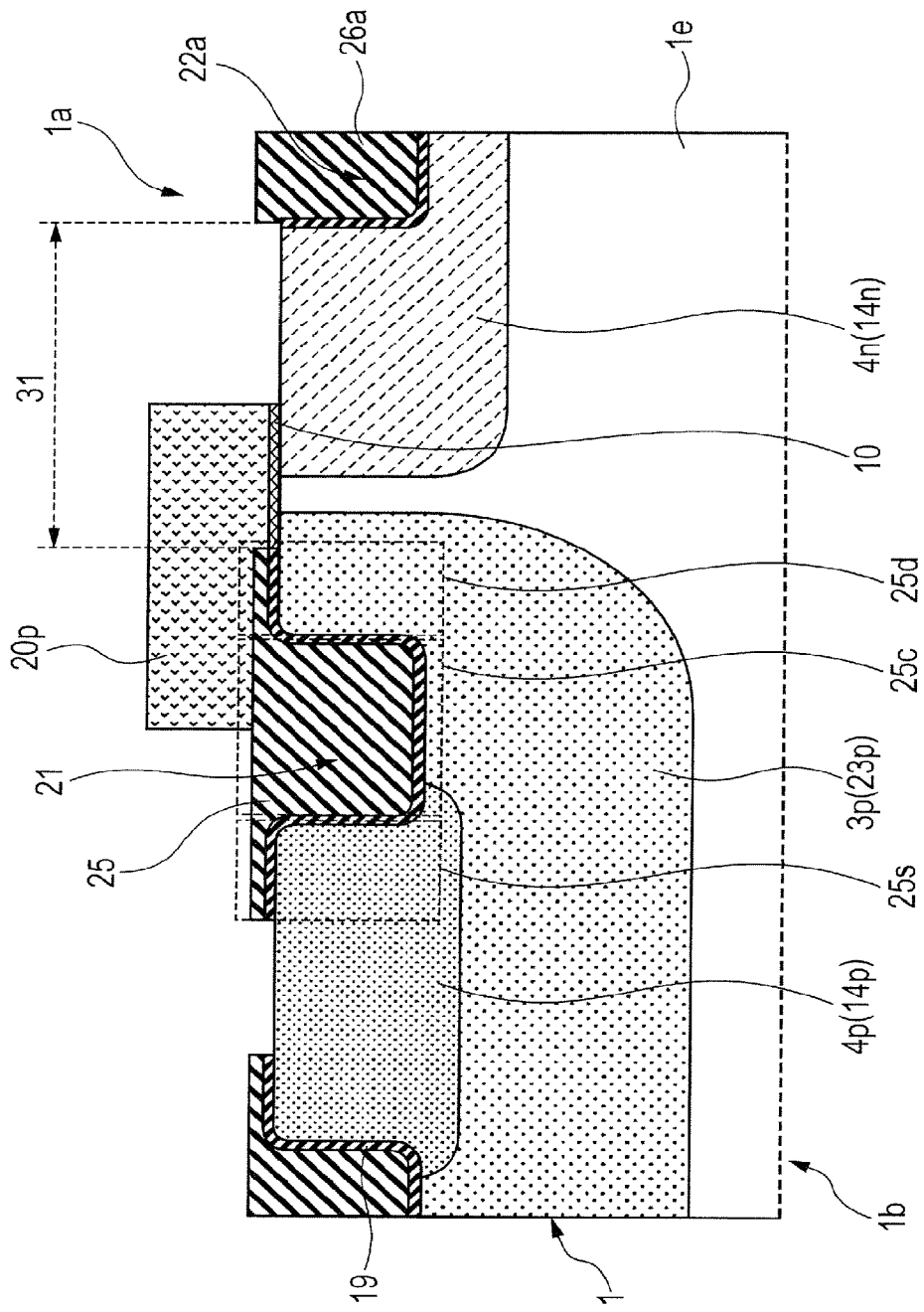
Figure 22:
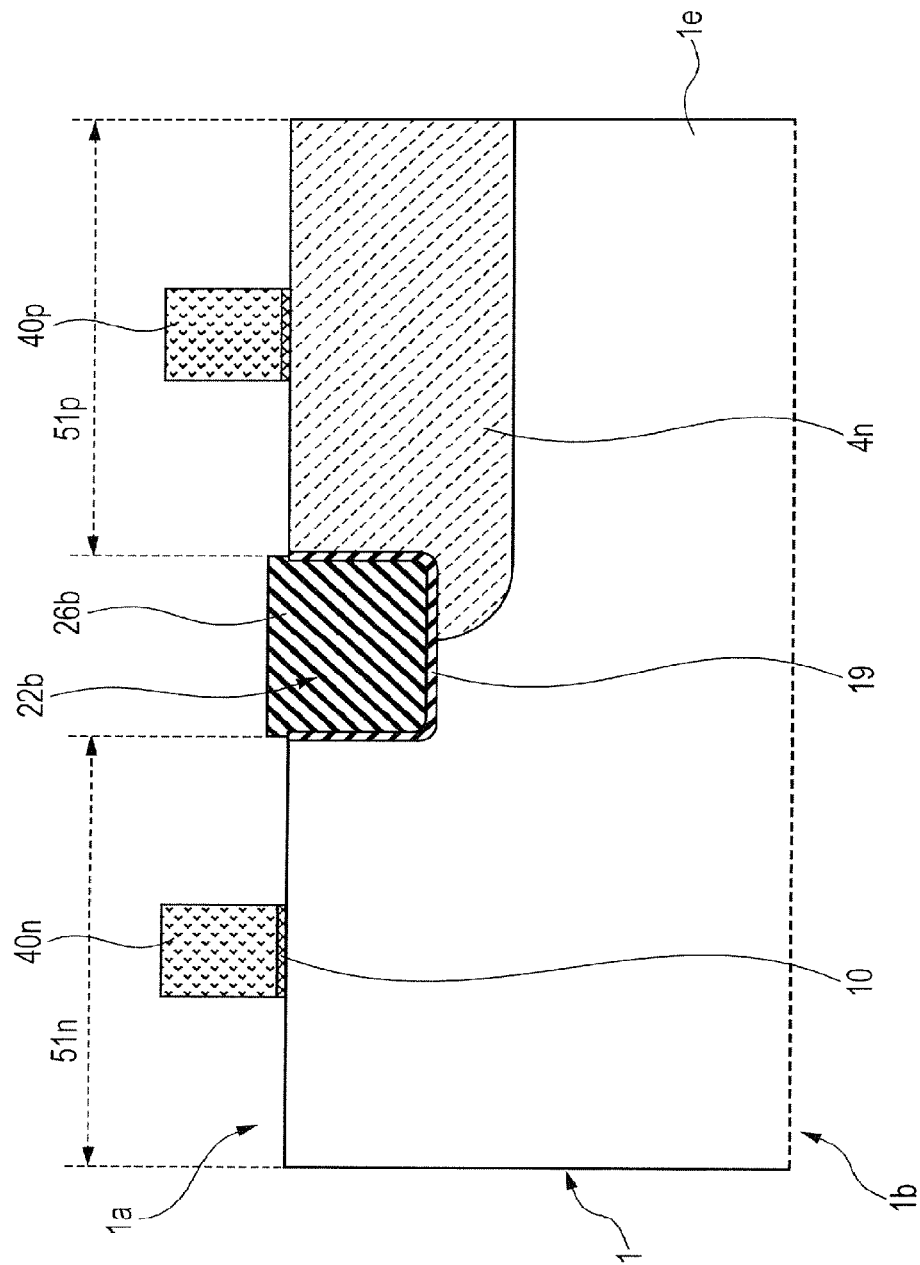
Figure 23:
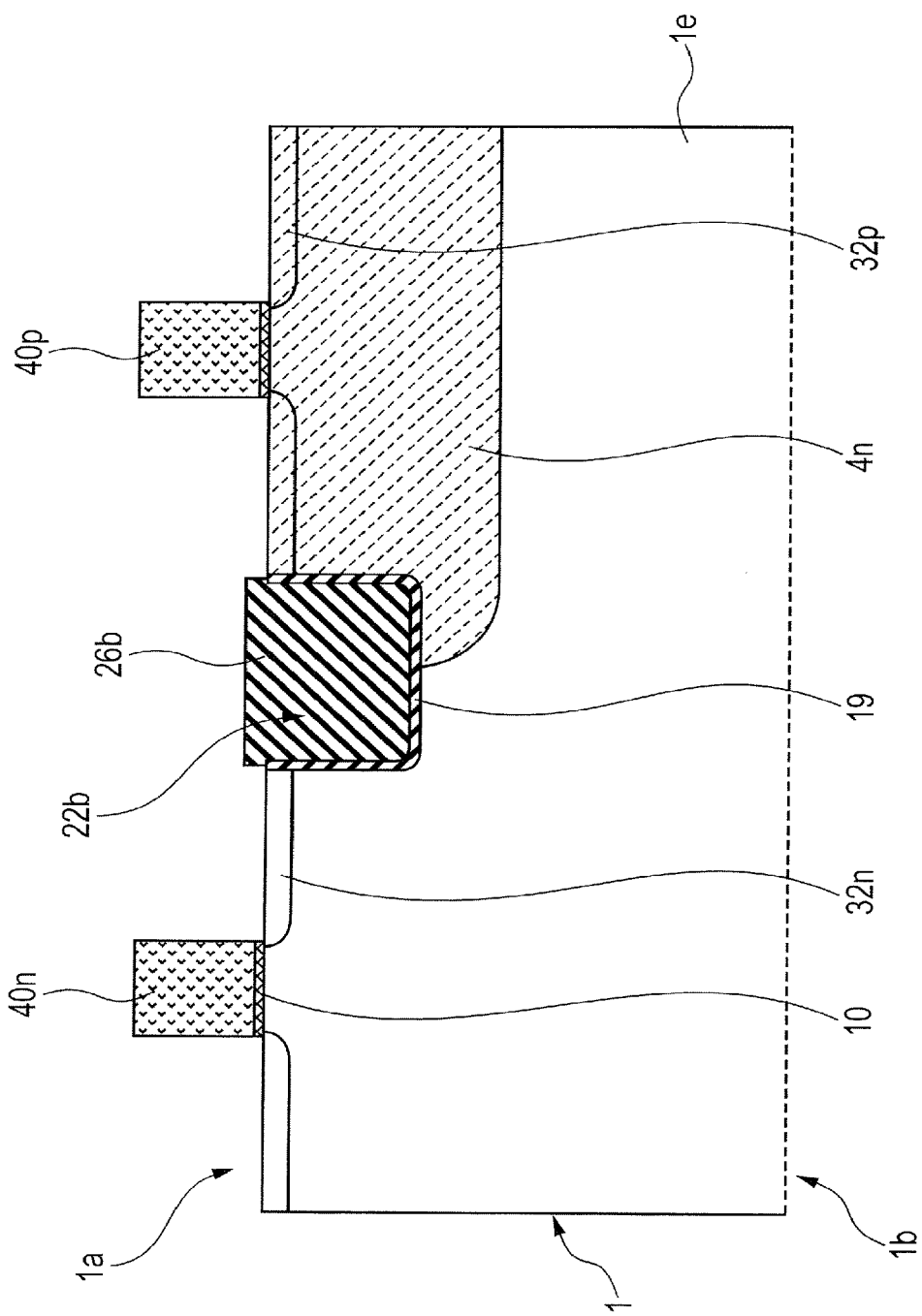
Figure 24:
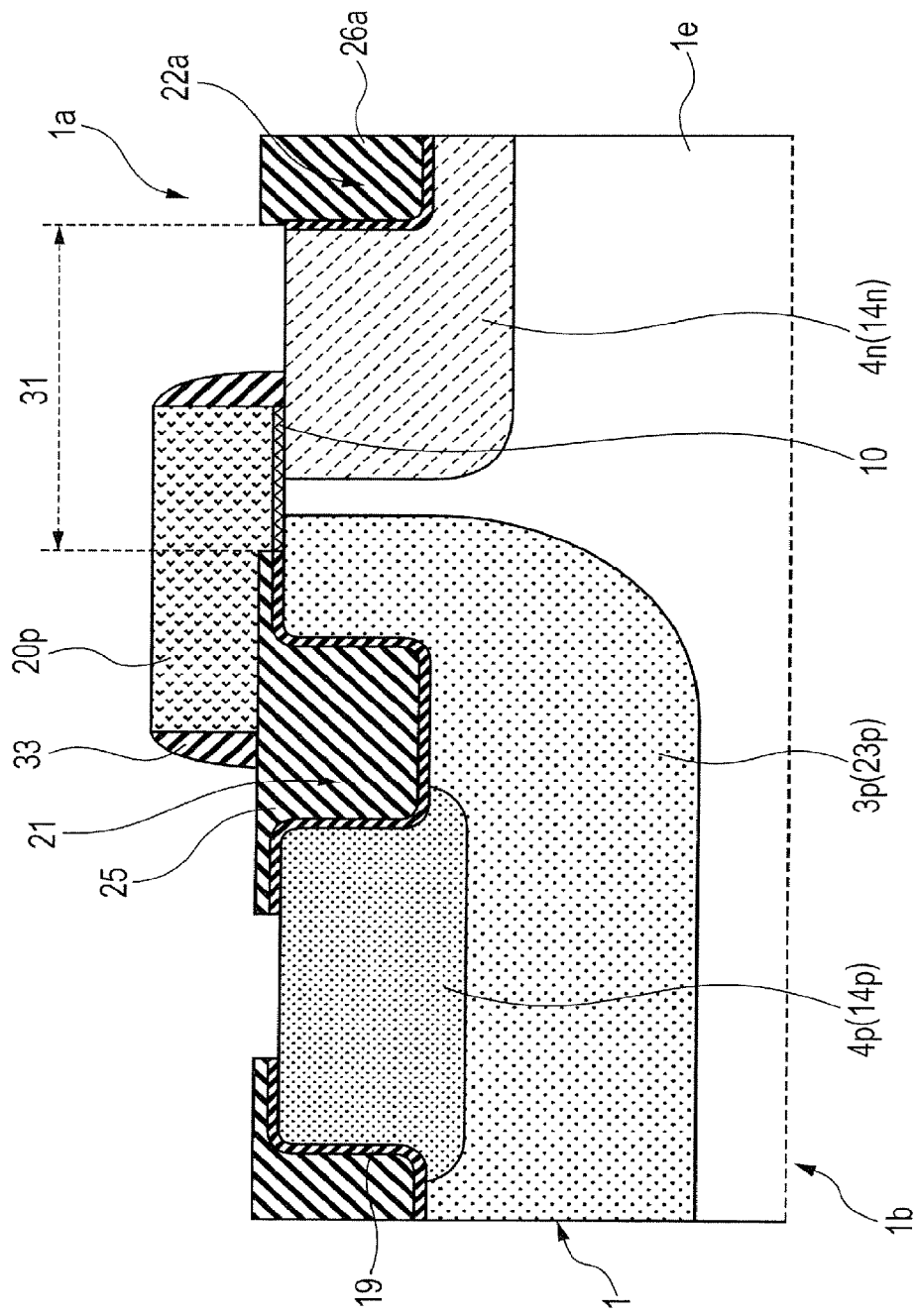
Figure 25:
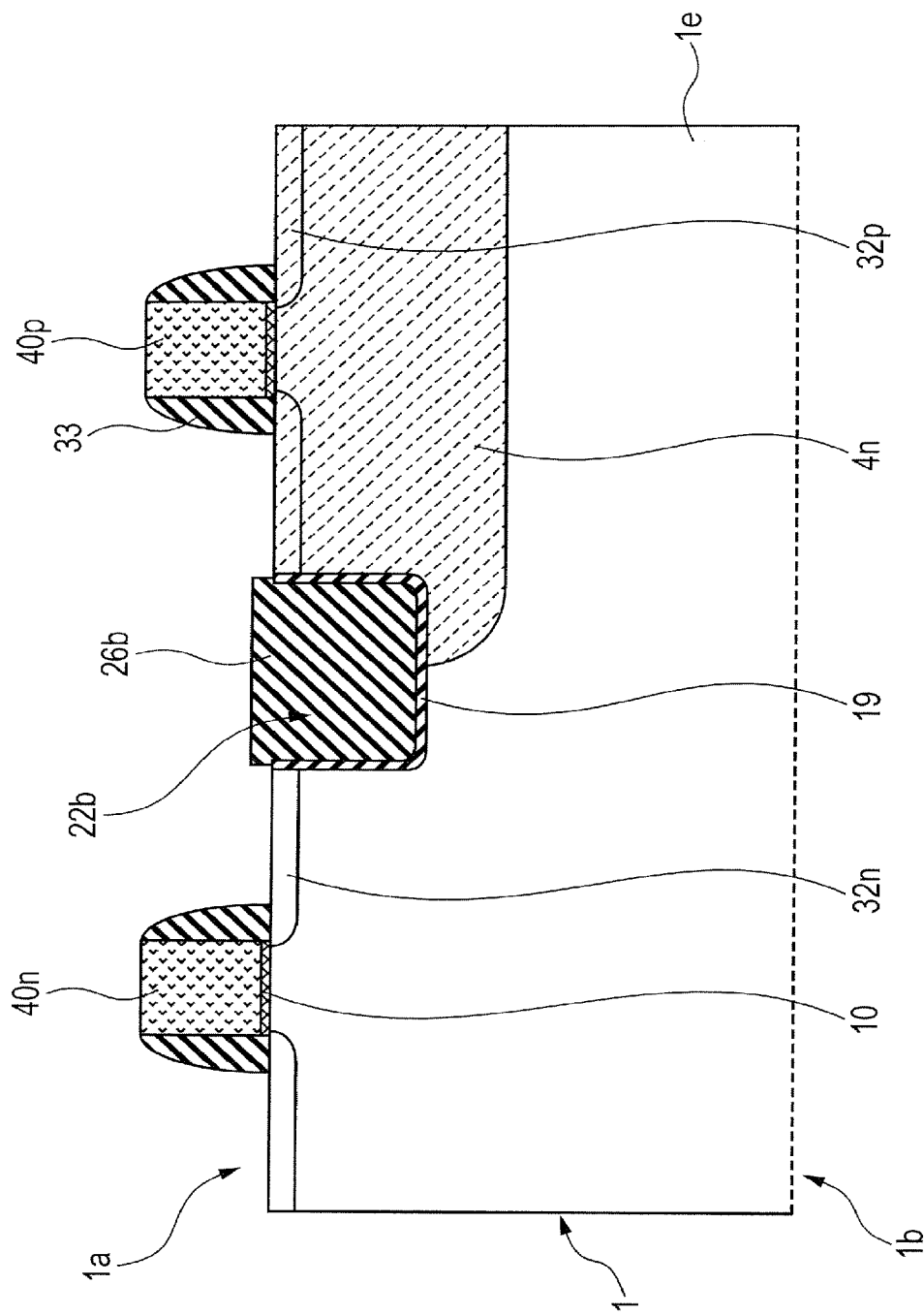
Figure 26:
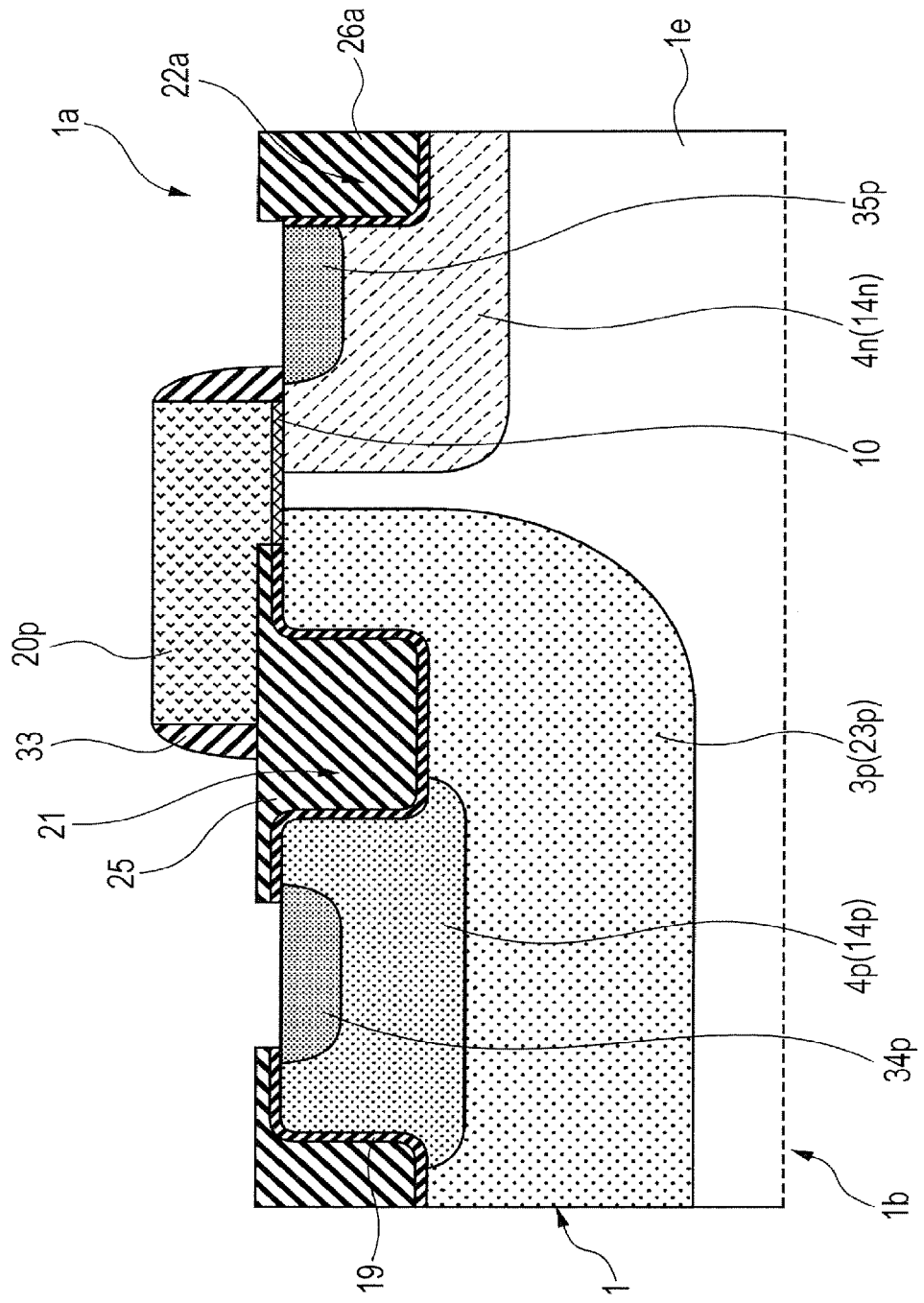
Figure 27:
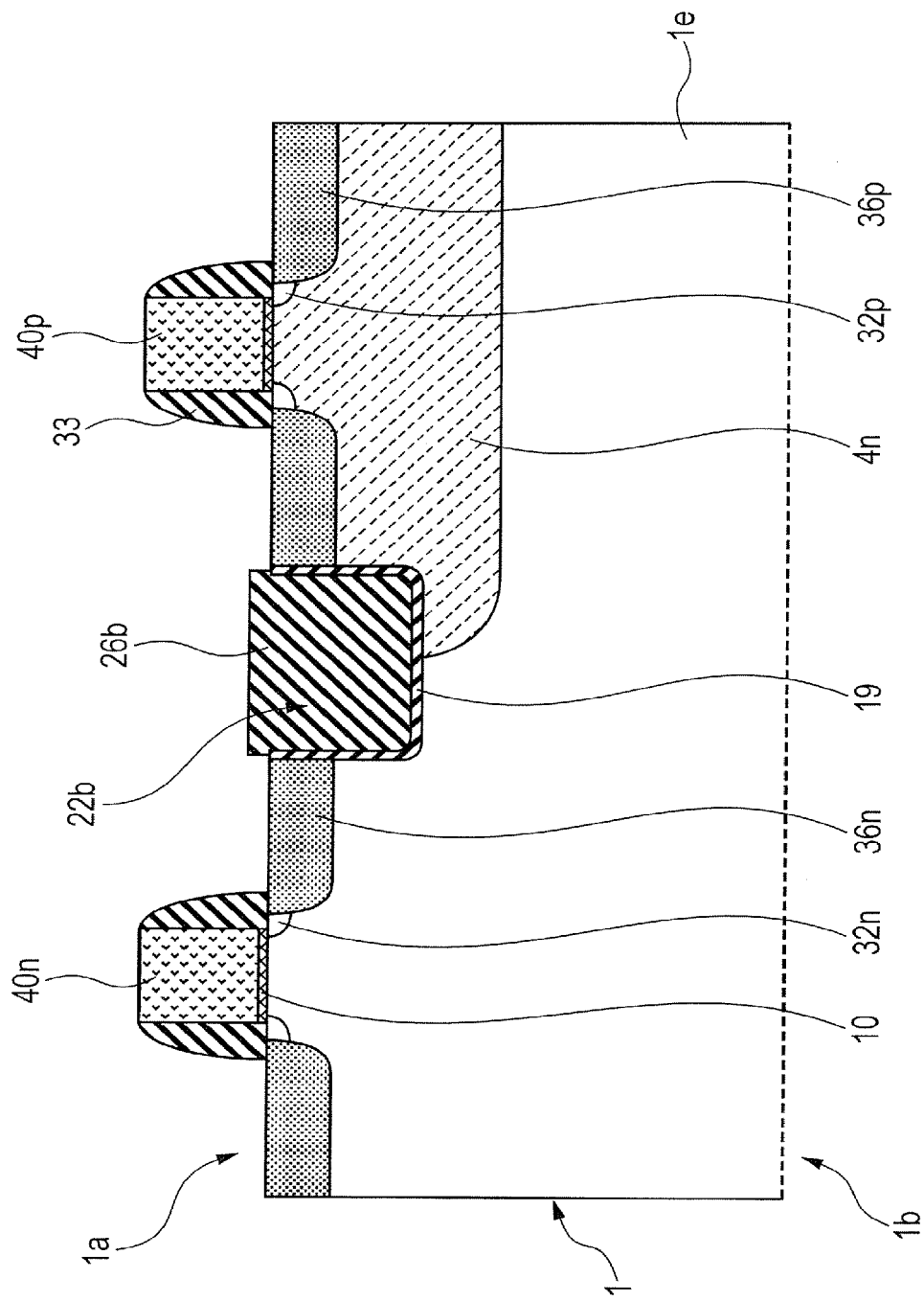
Figure 28:
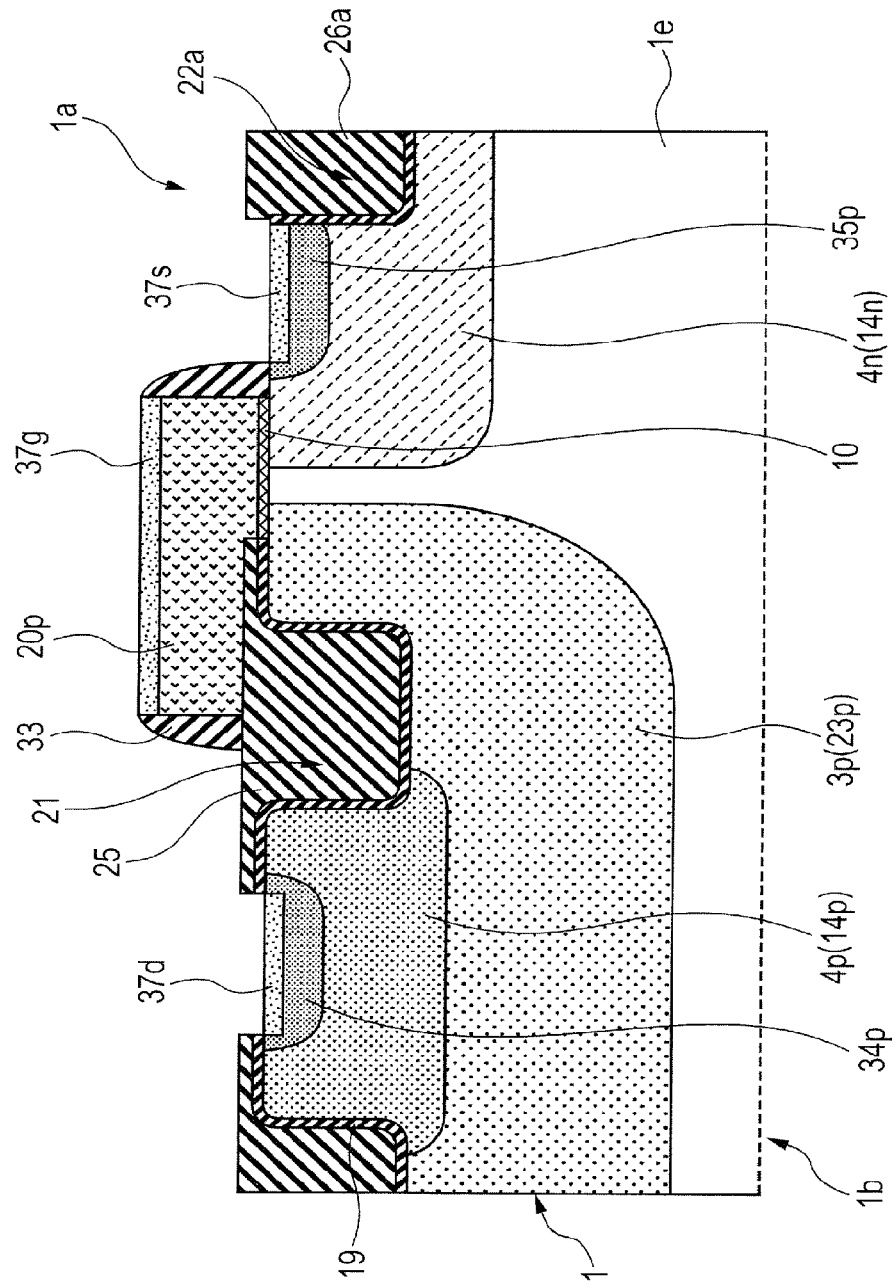
Figure 29:
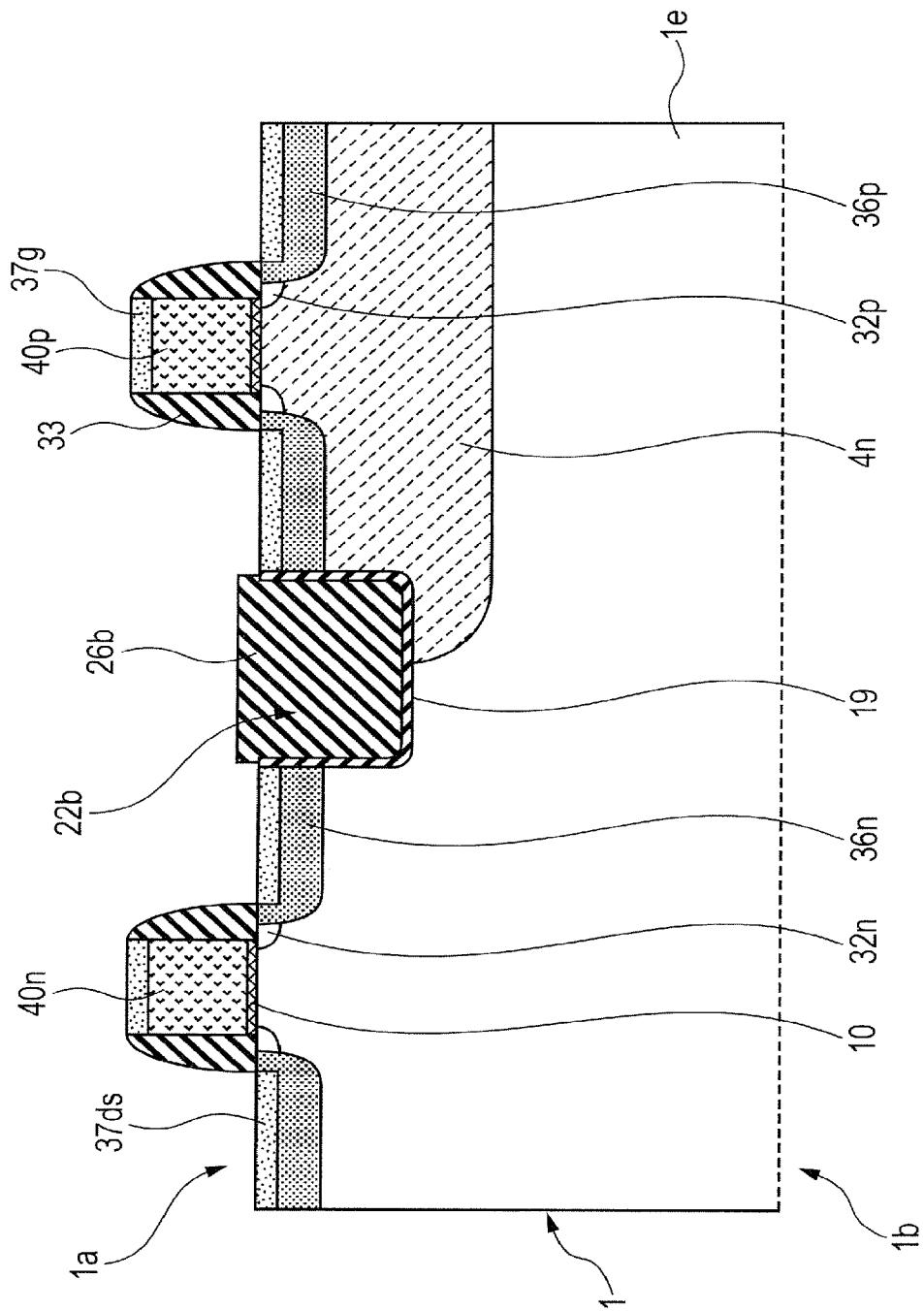
Figure 30:
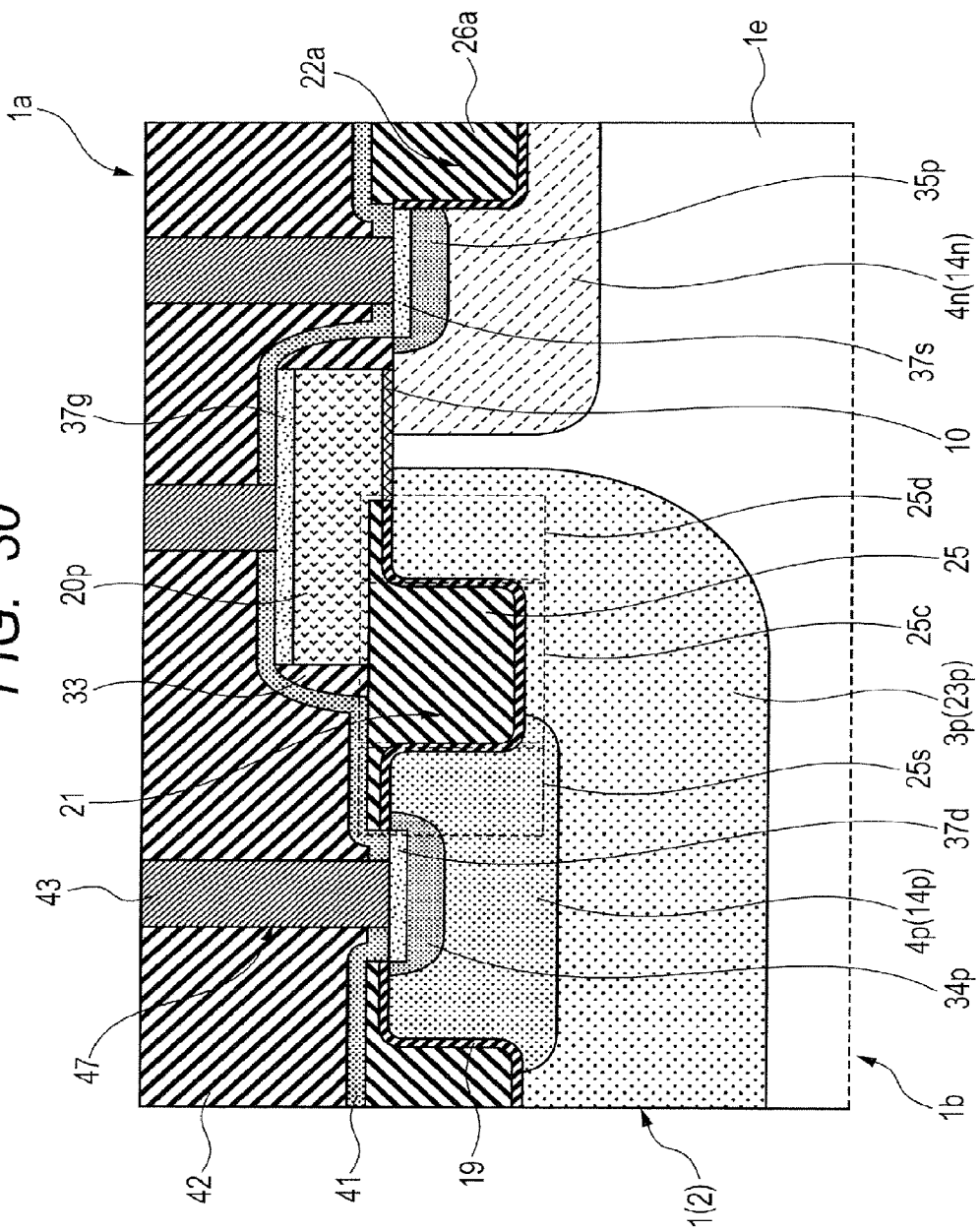
Figure 31:
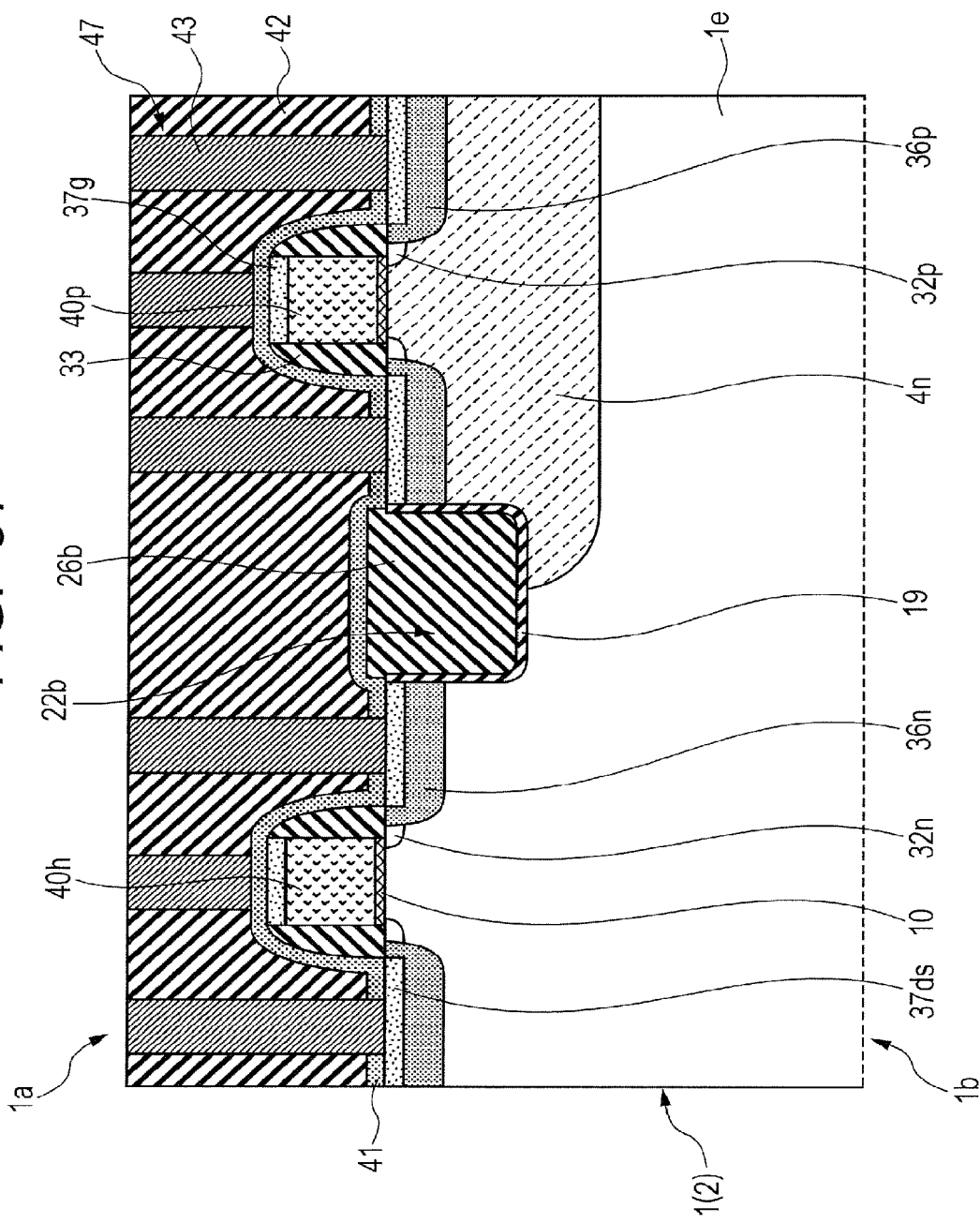
Figure 32:
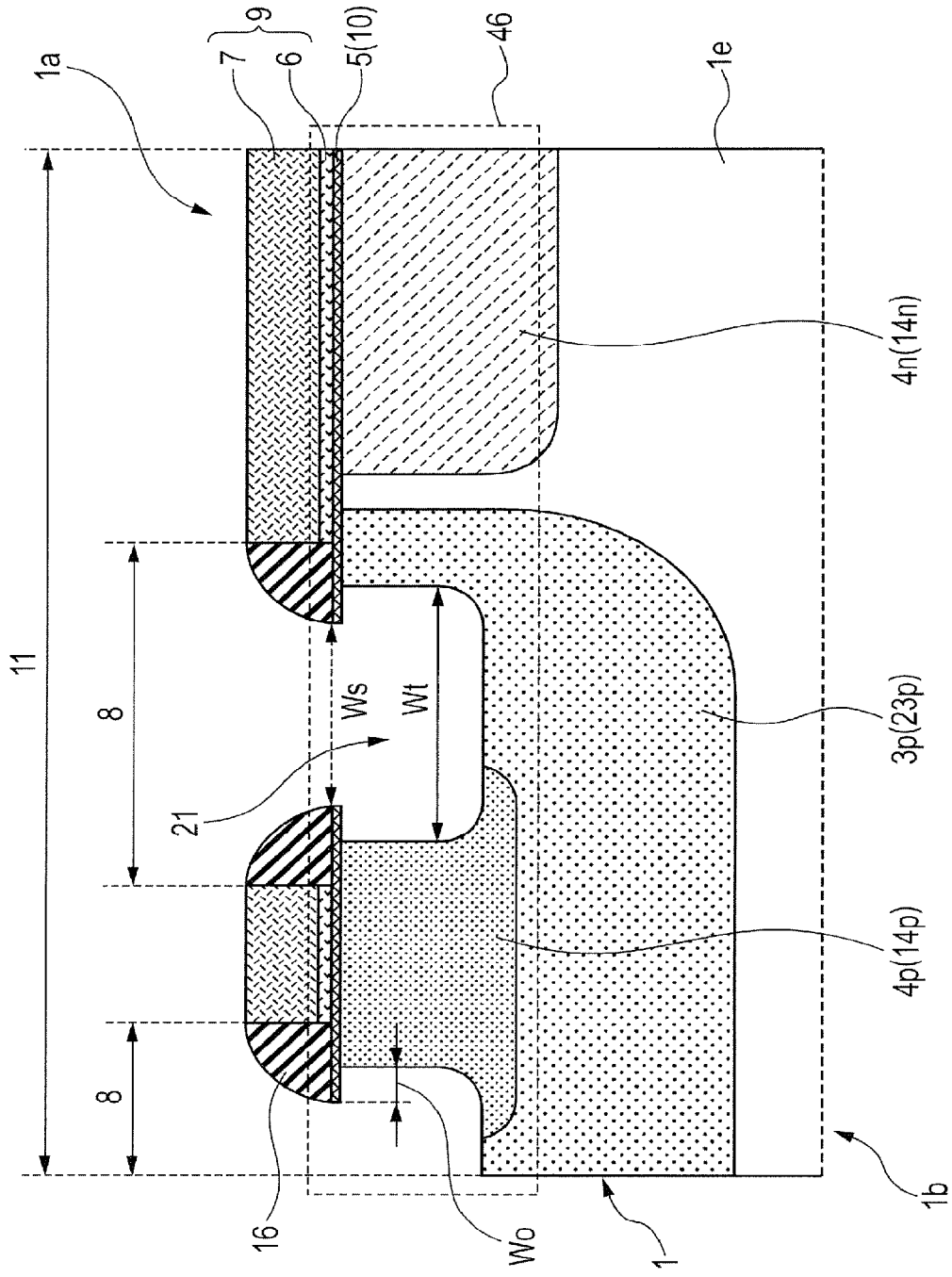
Figure 33:
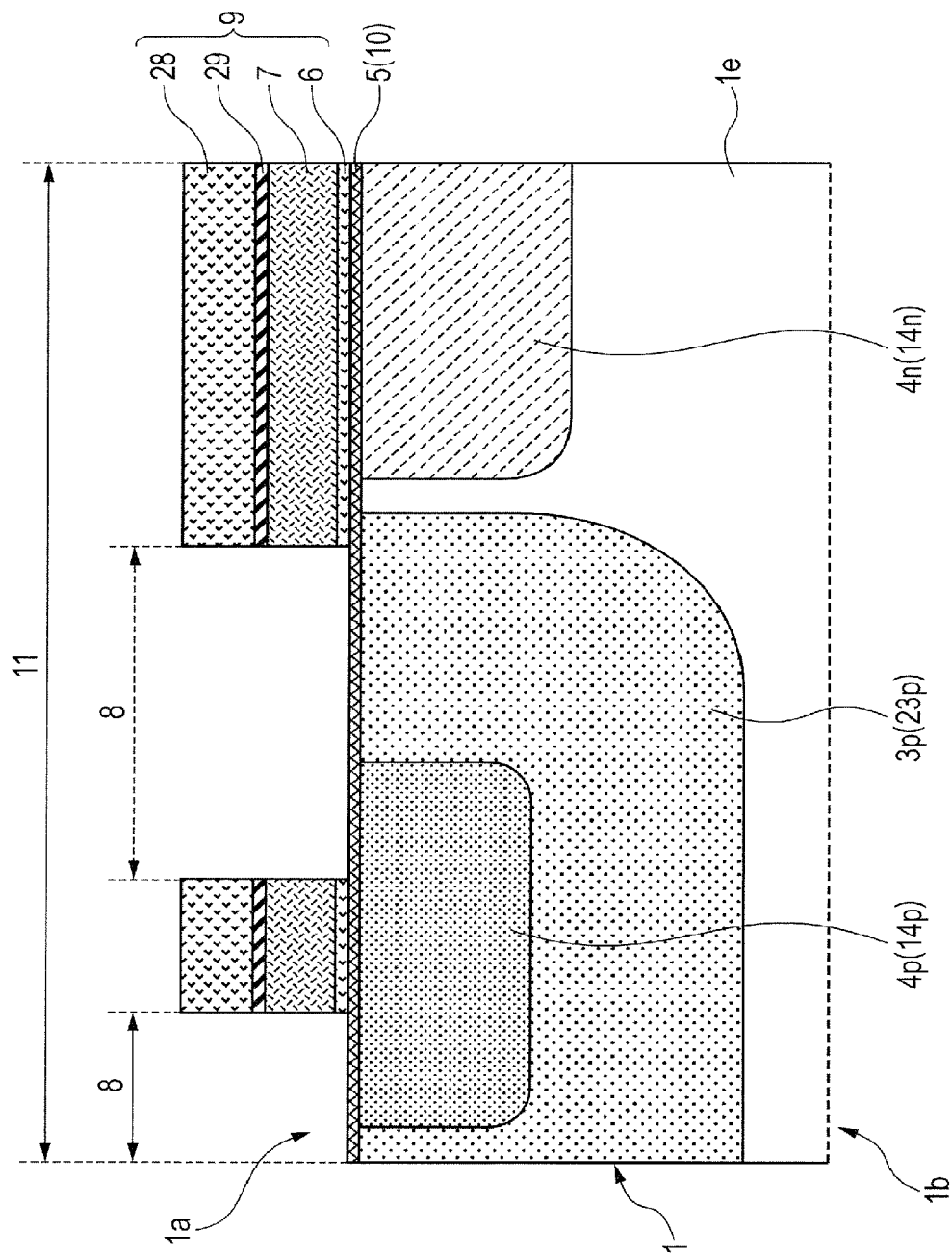
Figure 34:
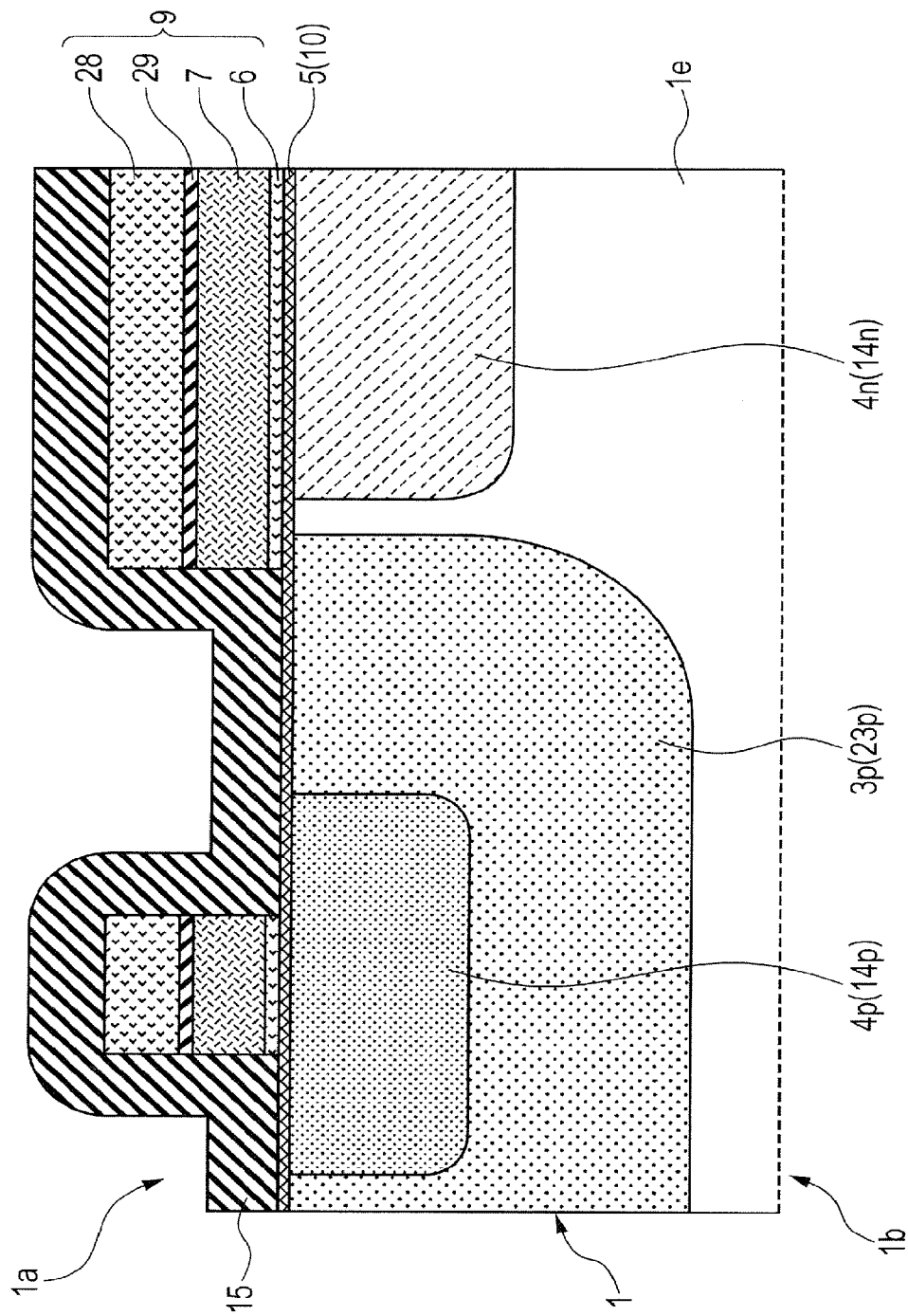
Figure 35:
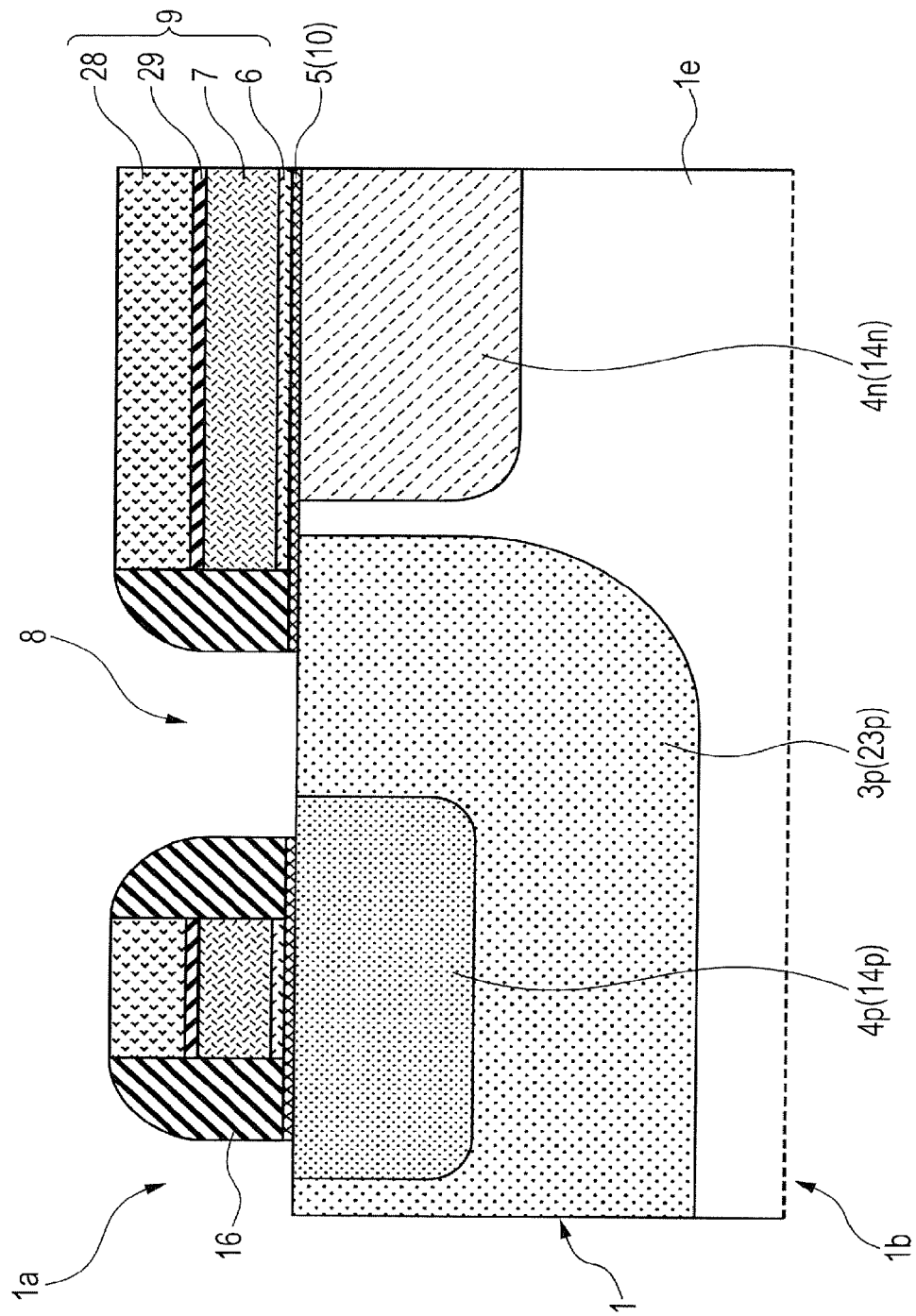
Figure 36:
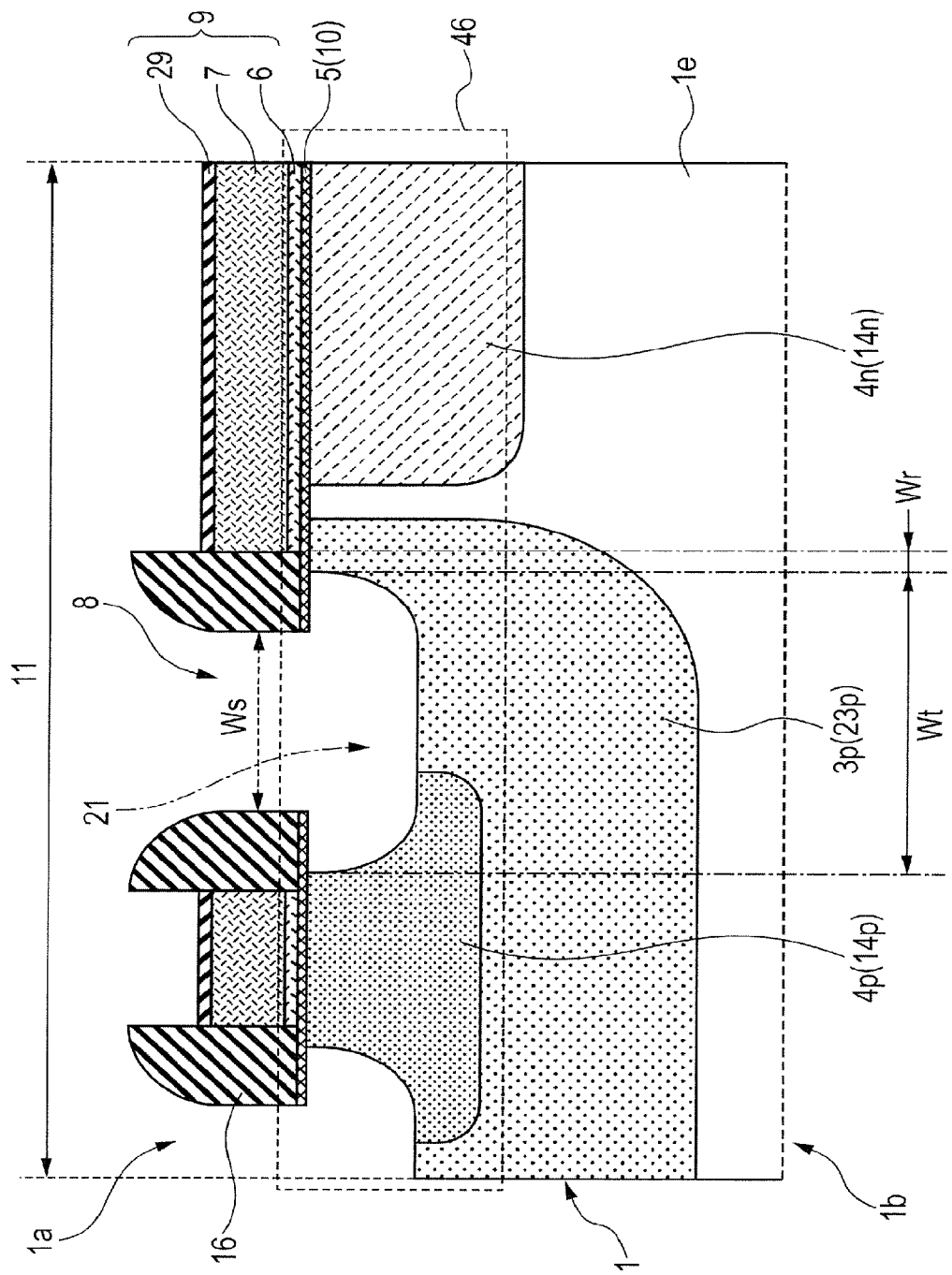
Figure 37:
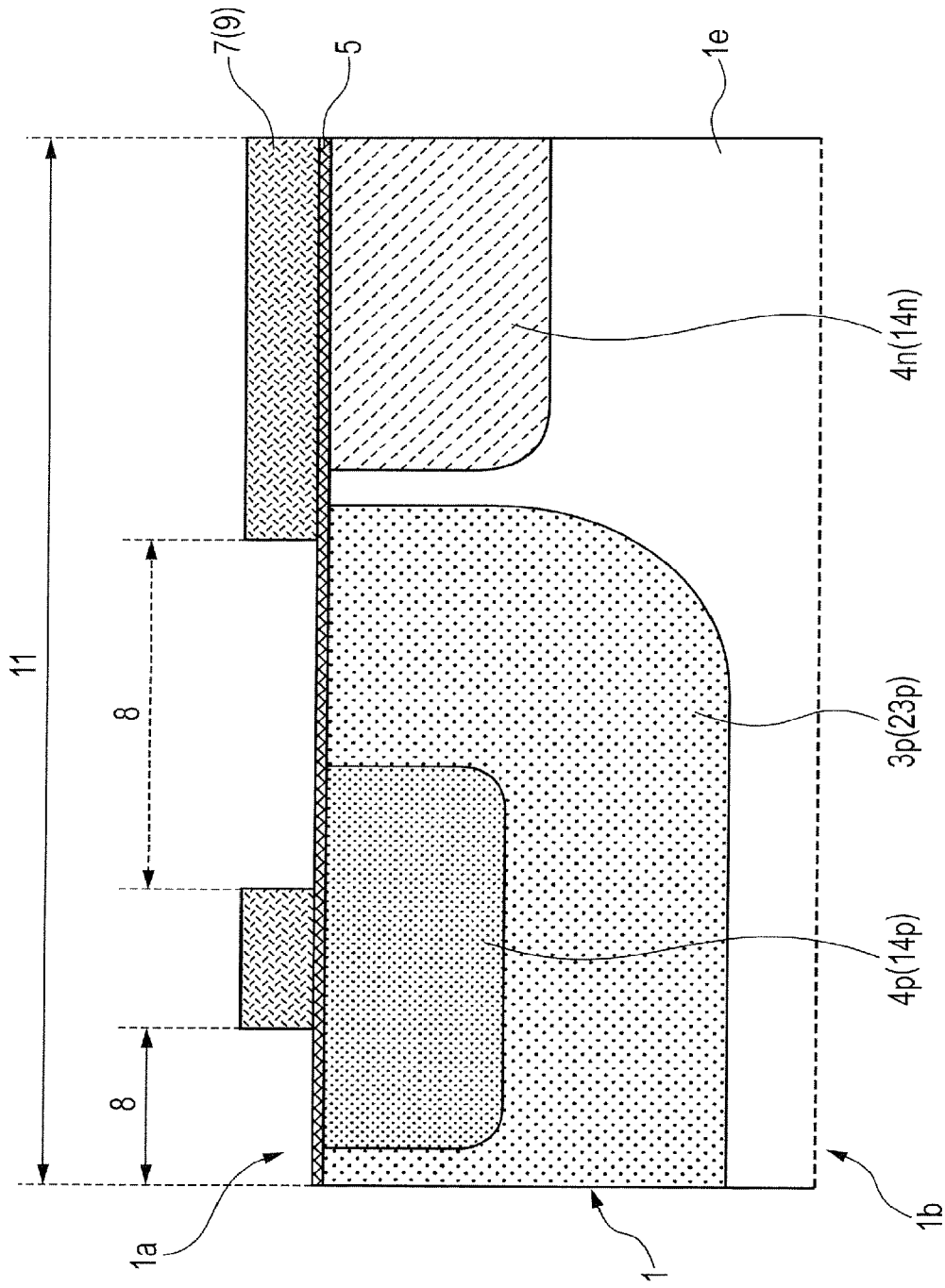
Figure 38:
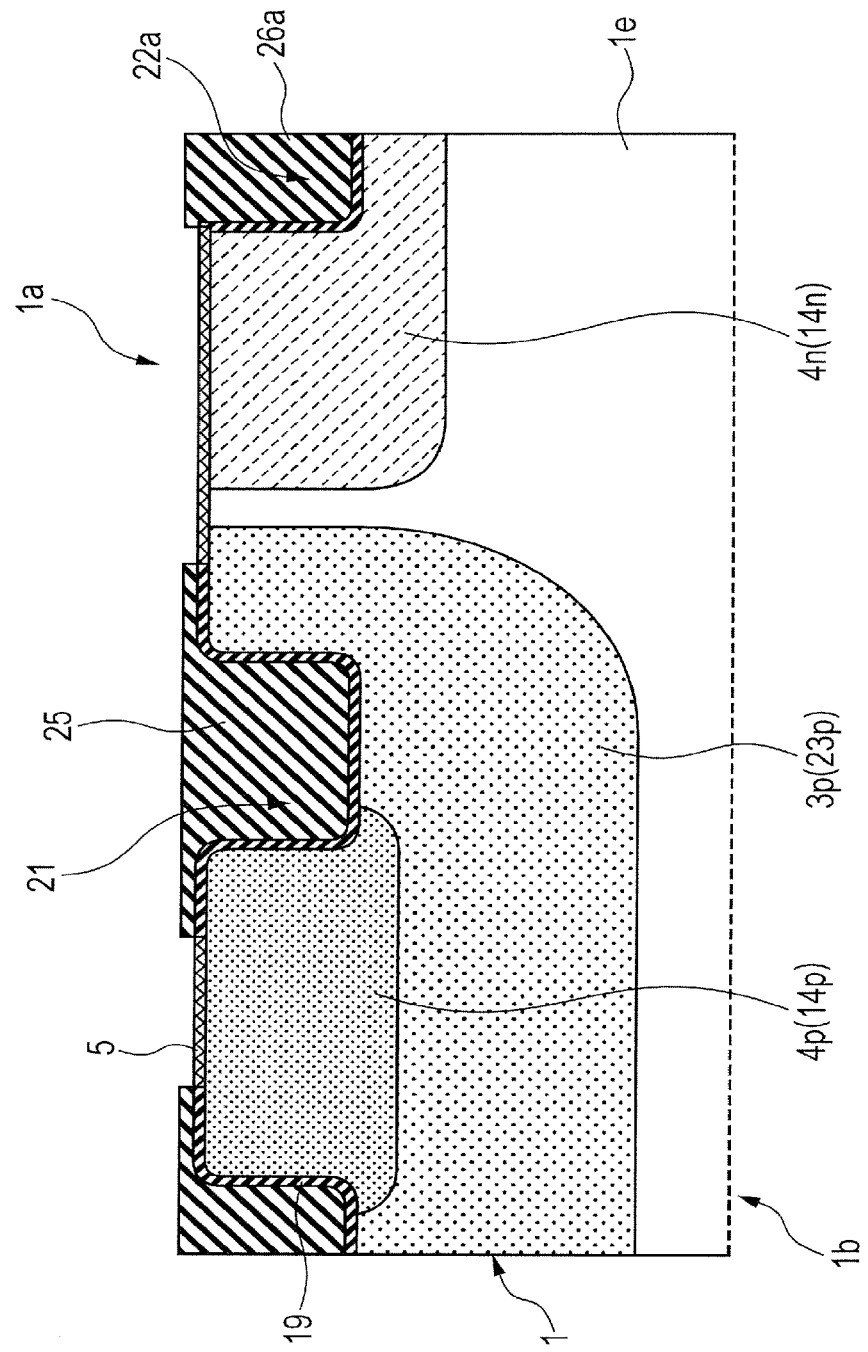
Figure 39:
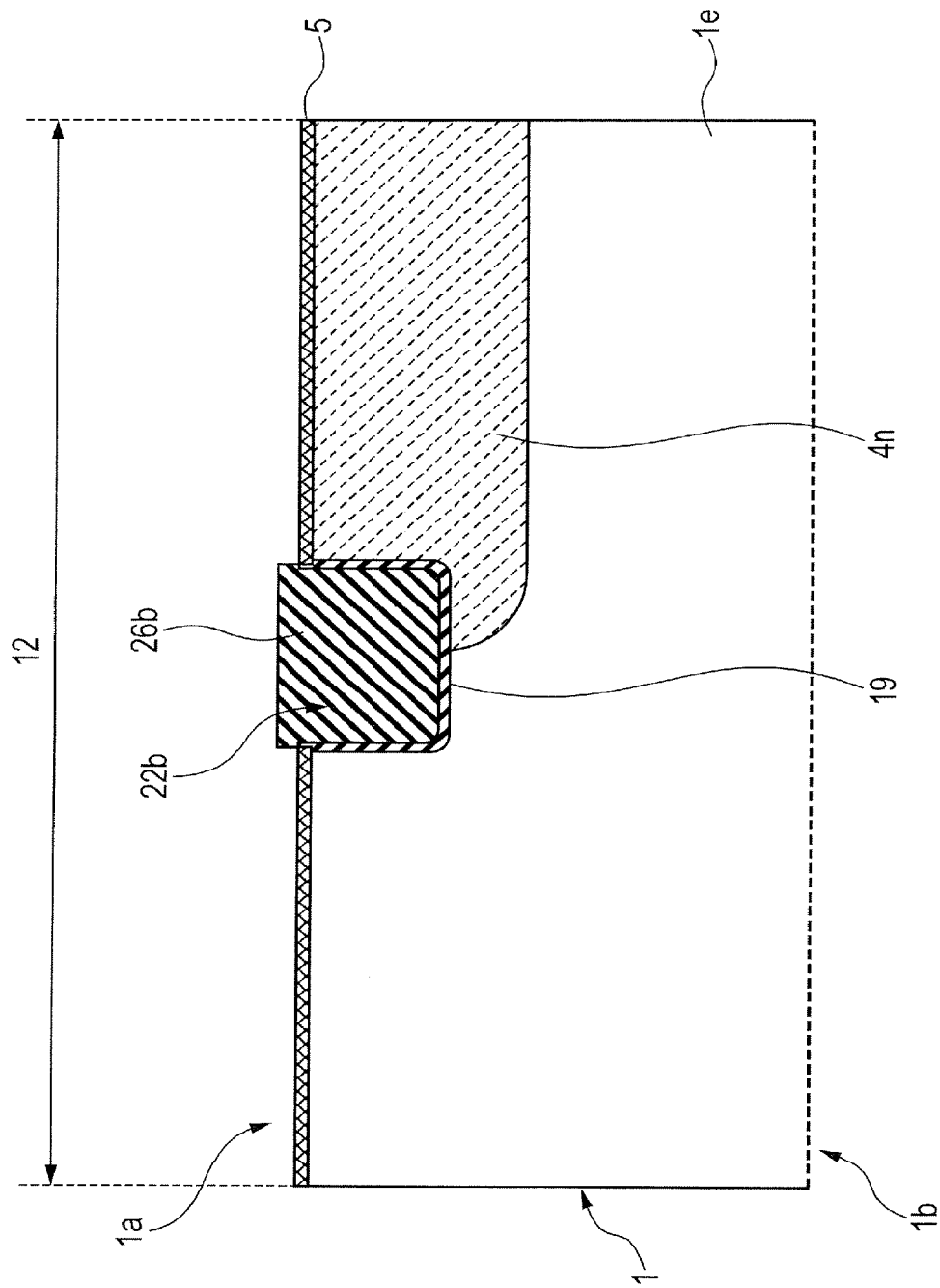
Figure 40:
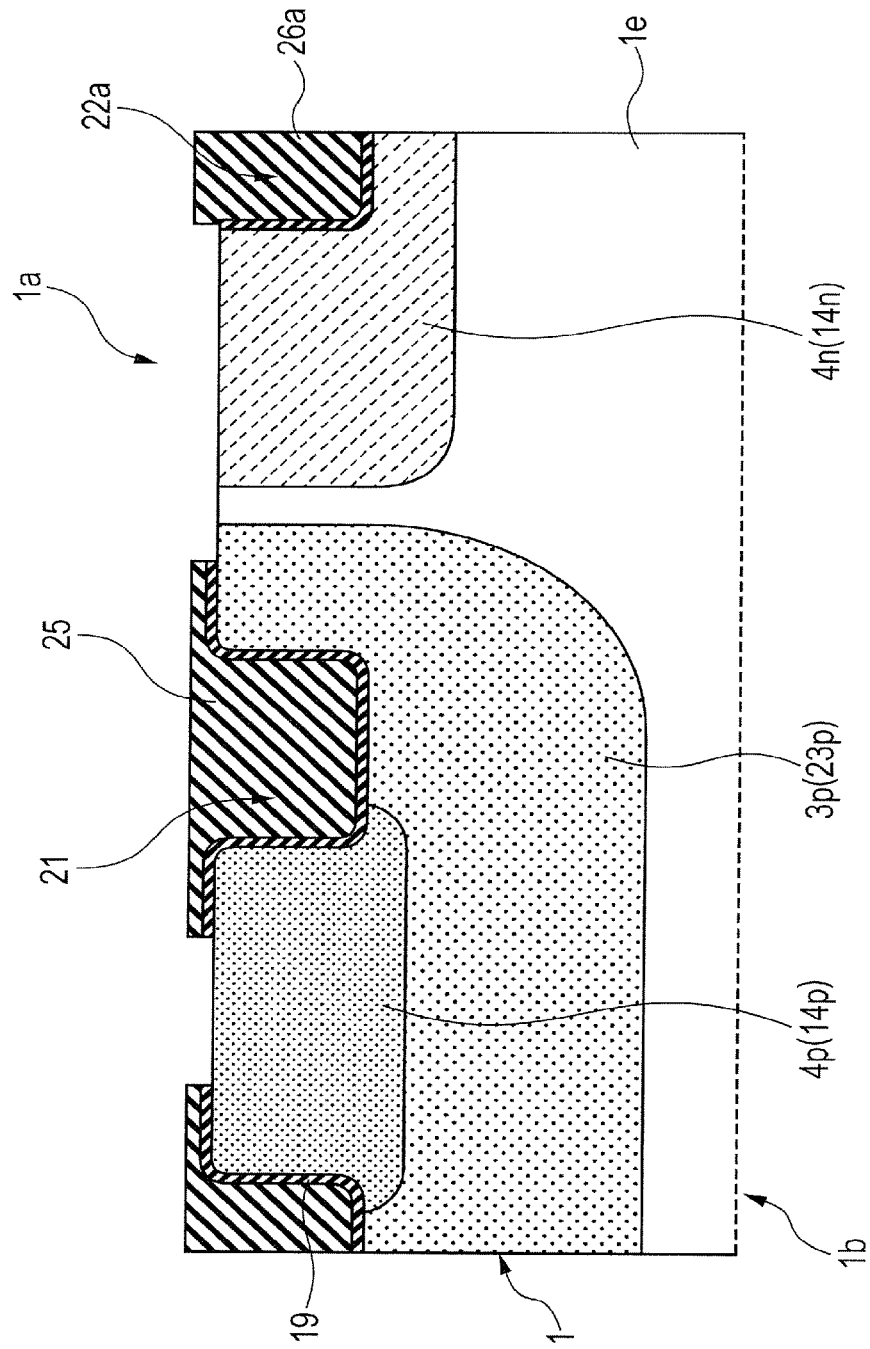
Figure 41:
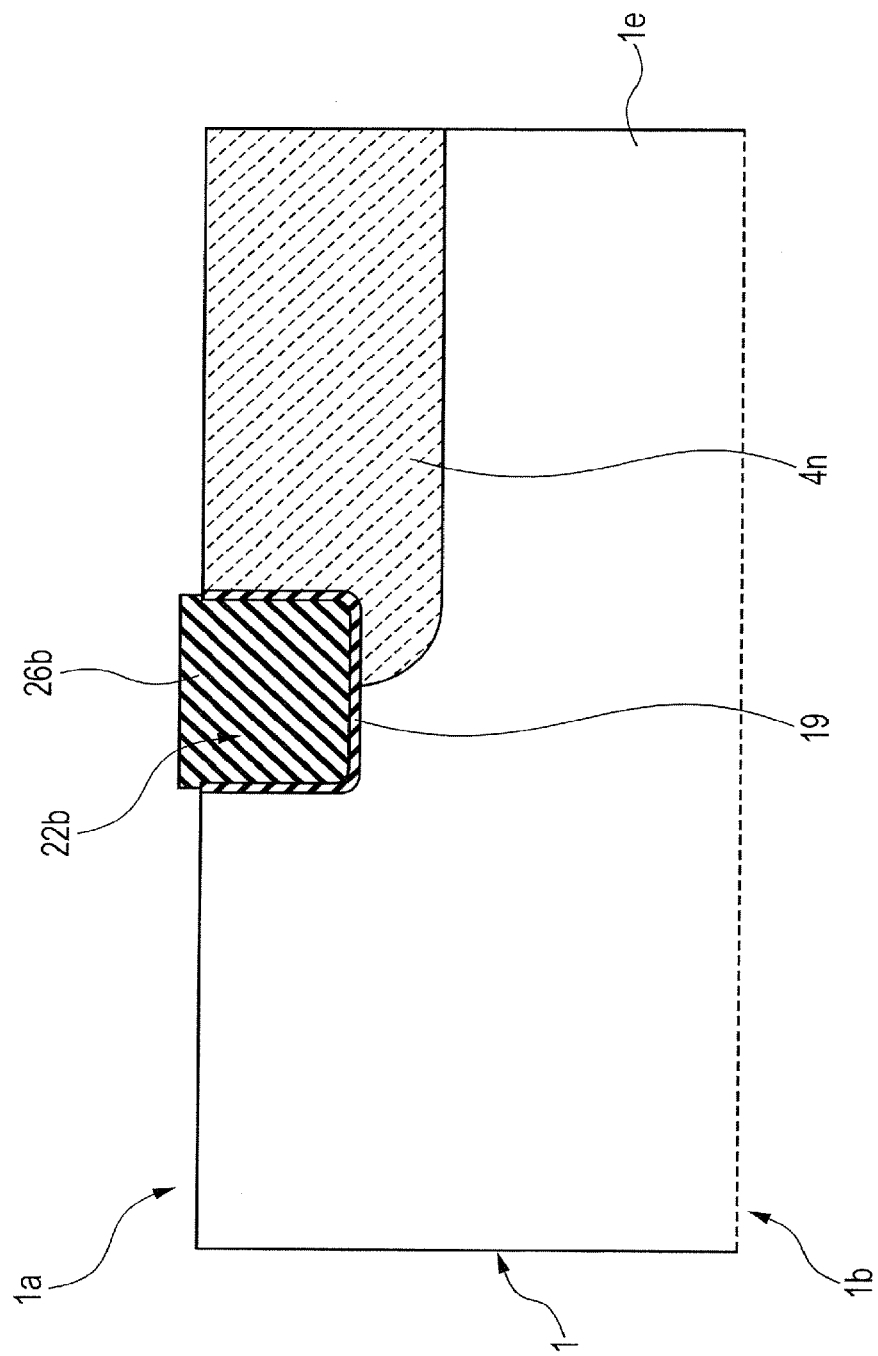
Figure 42:
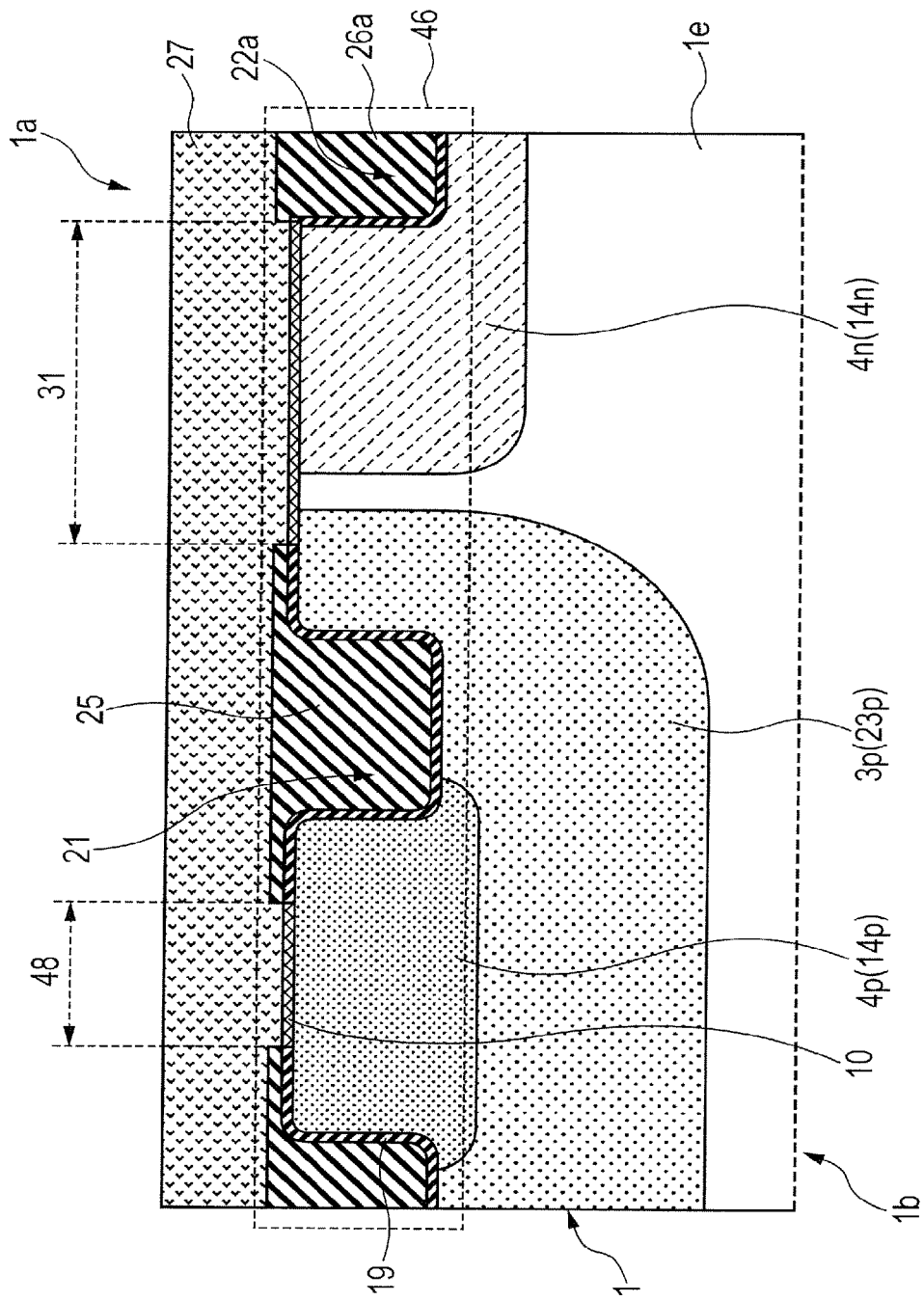
Figure 43:
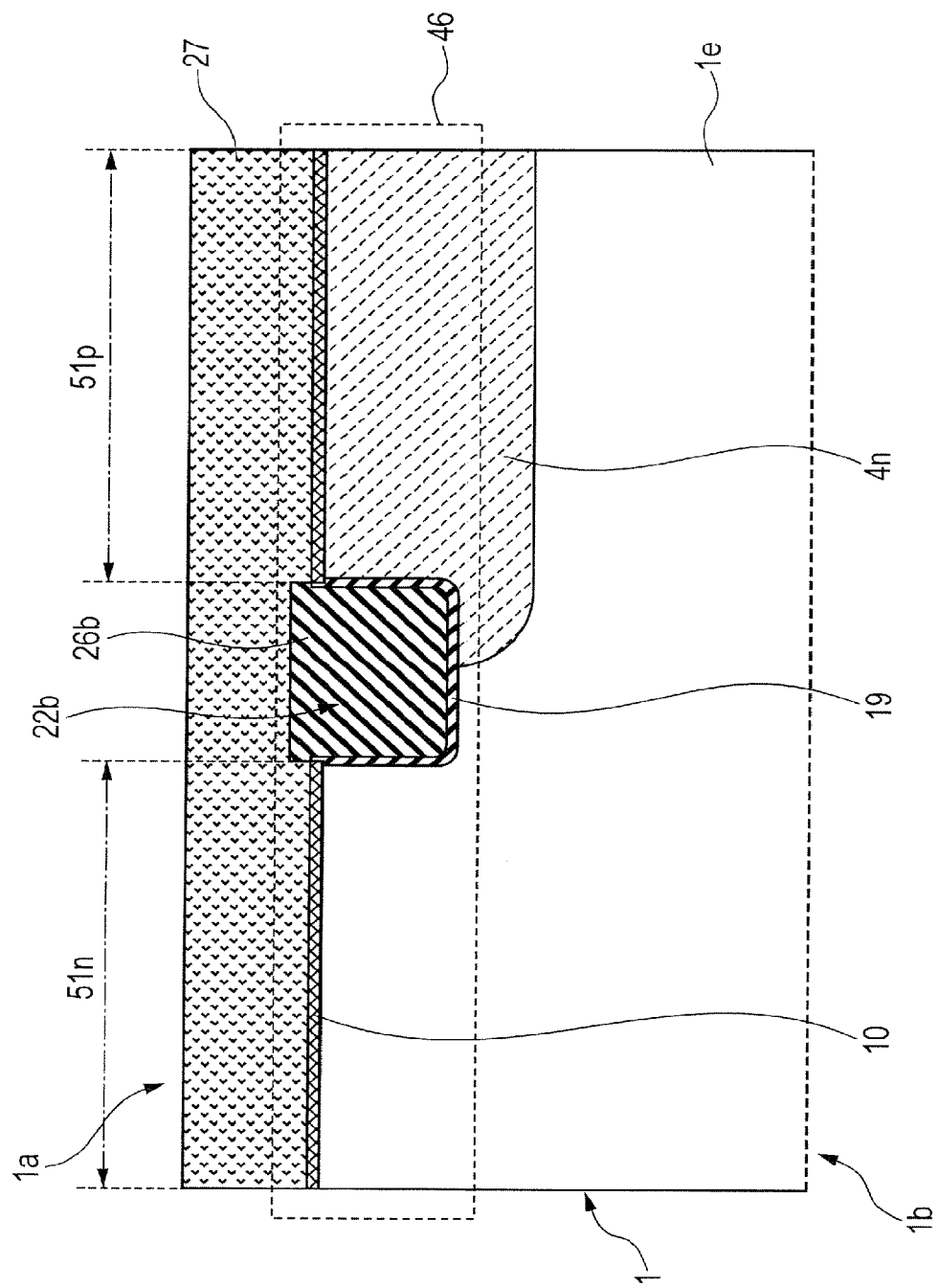
Figure 44:
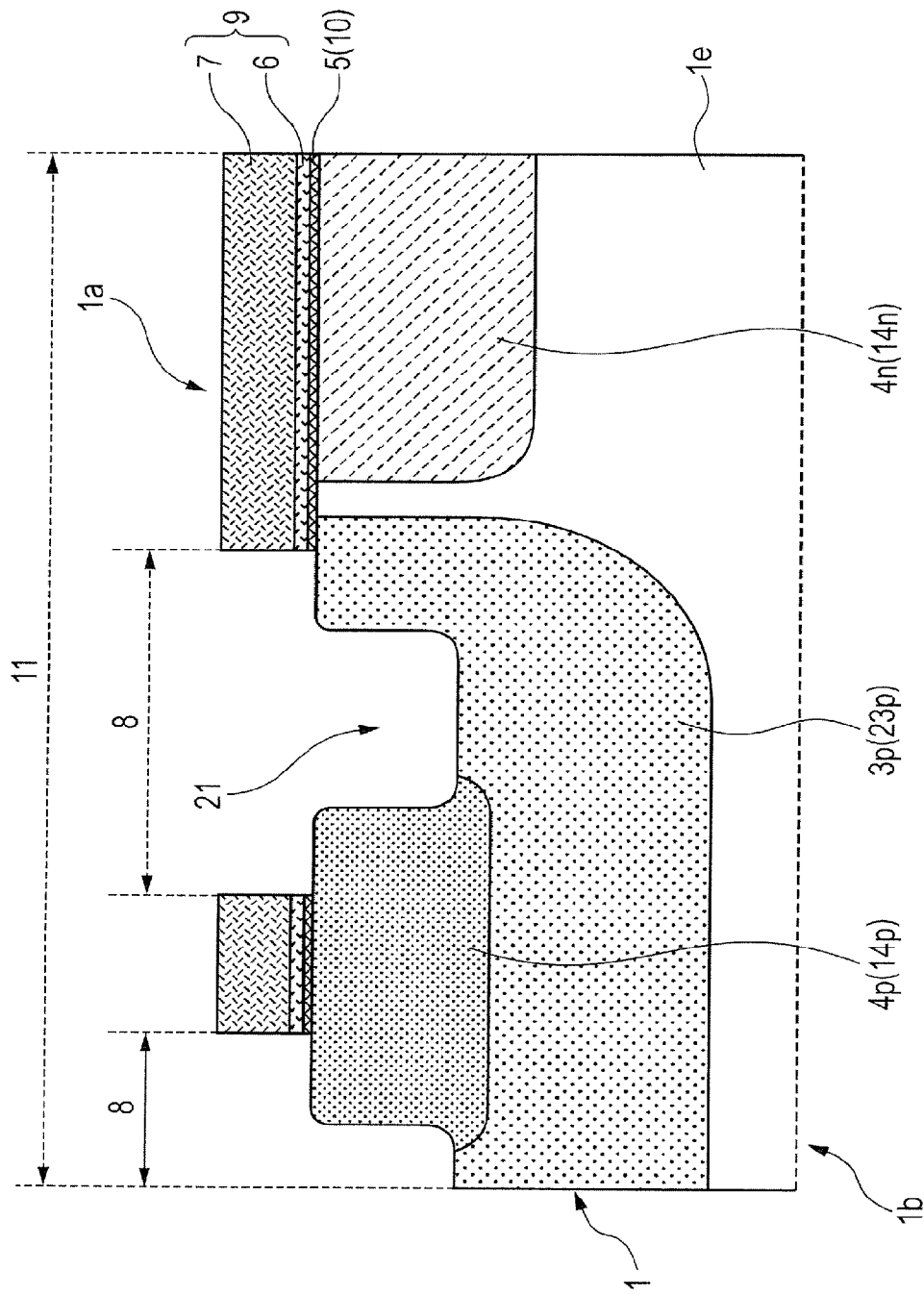
Figure 45:
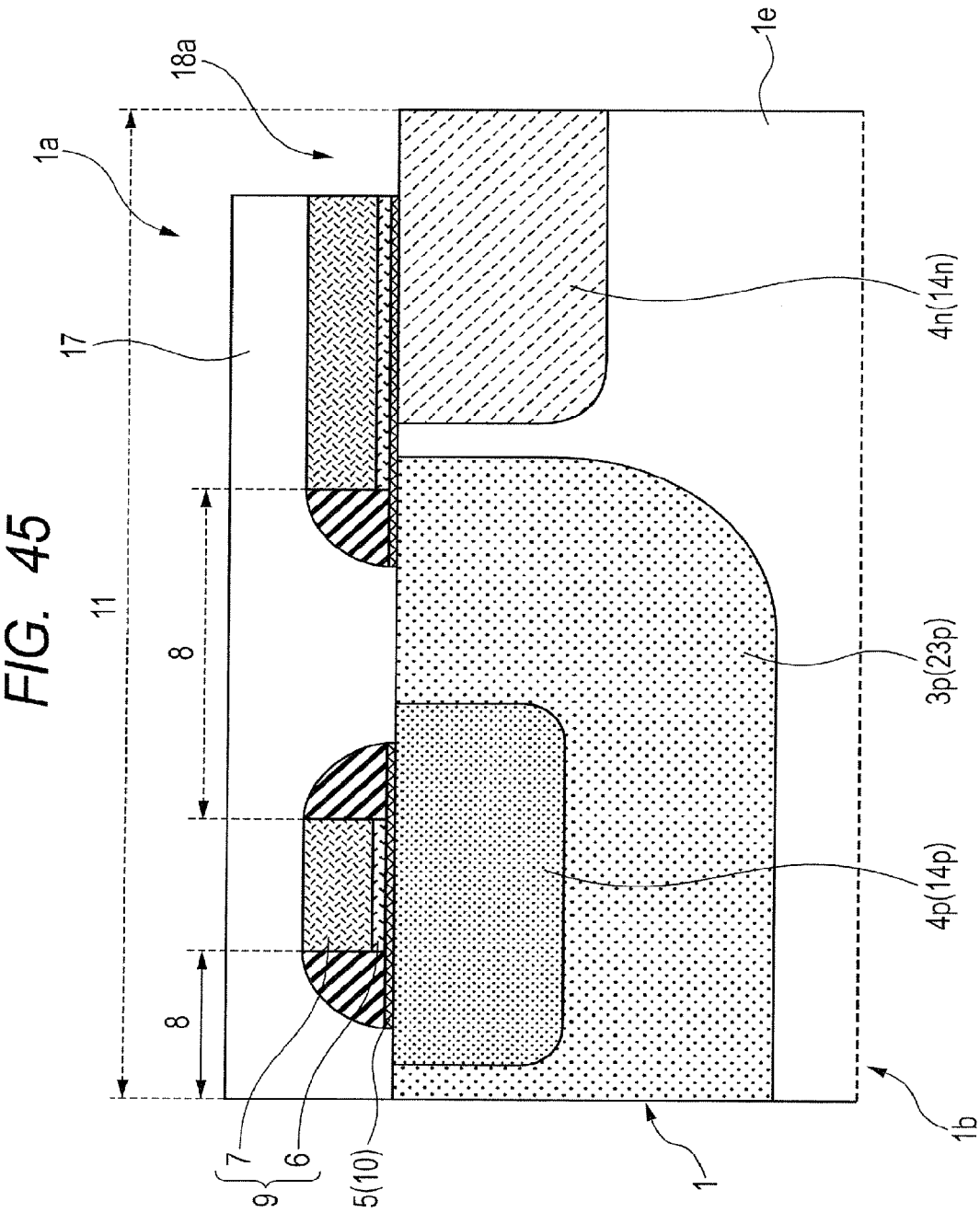
Figure 46:
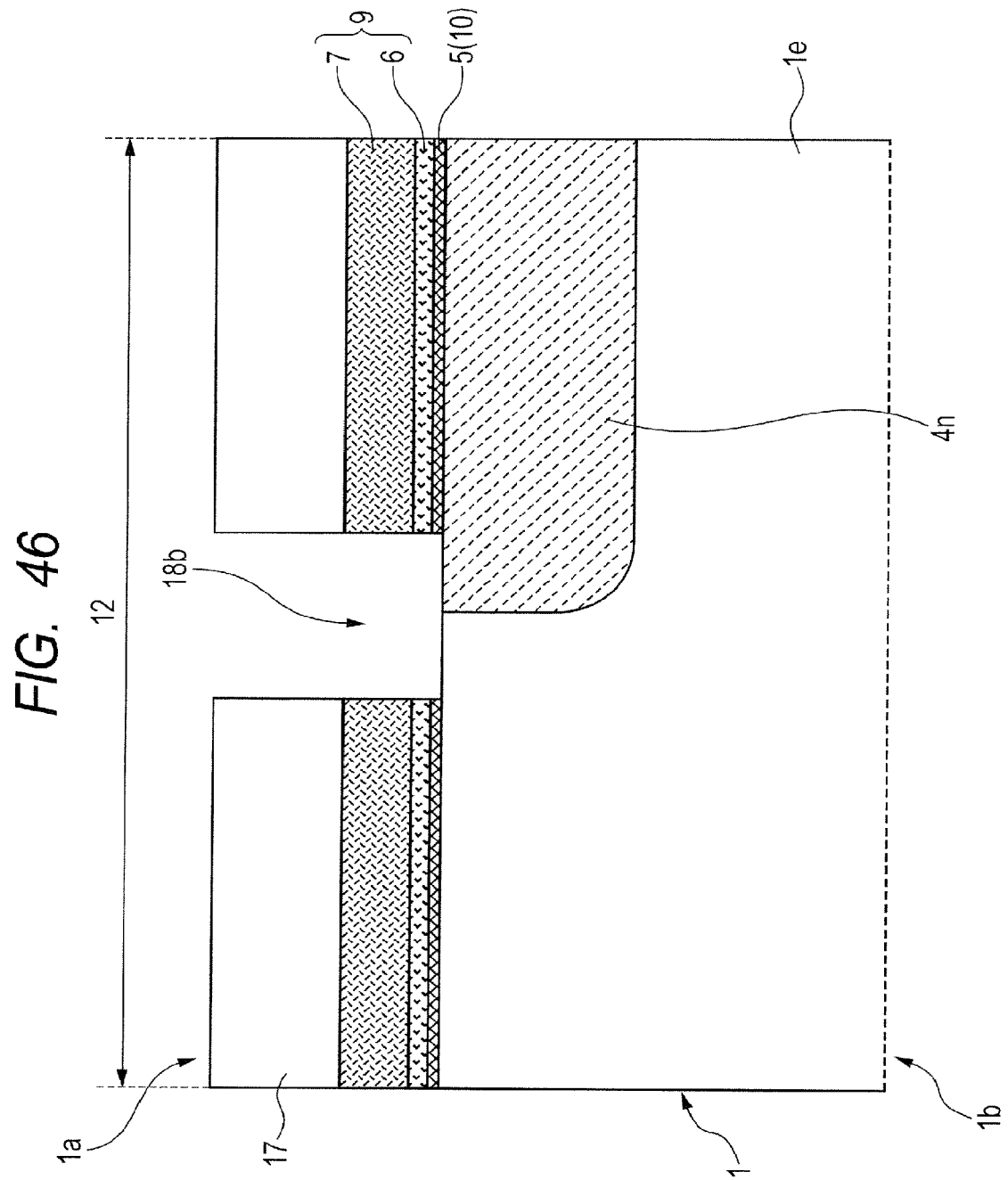
Figure 47:
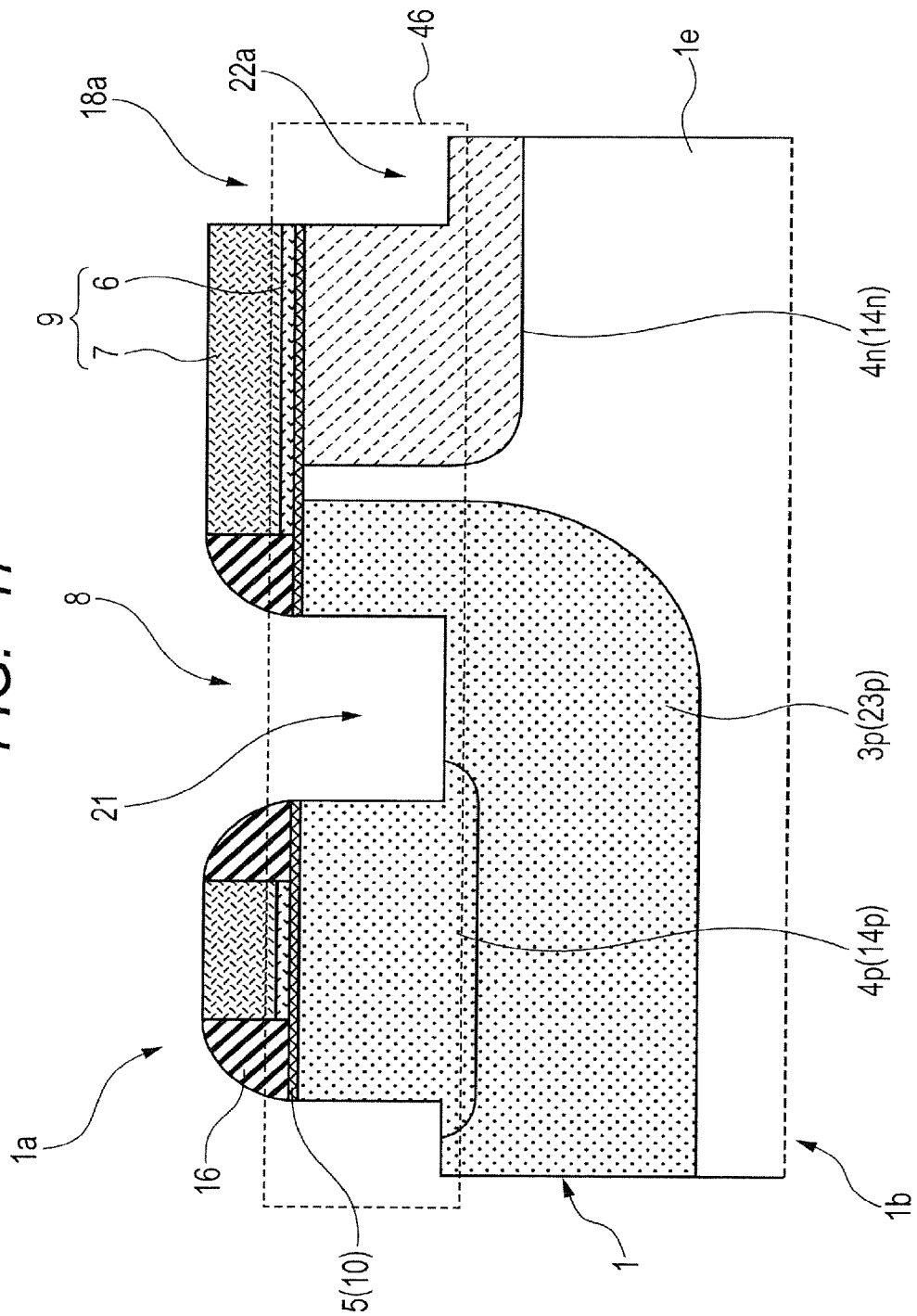
Figure 48:
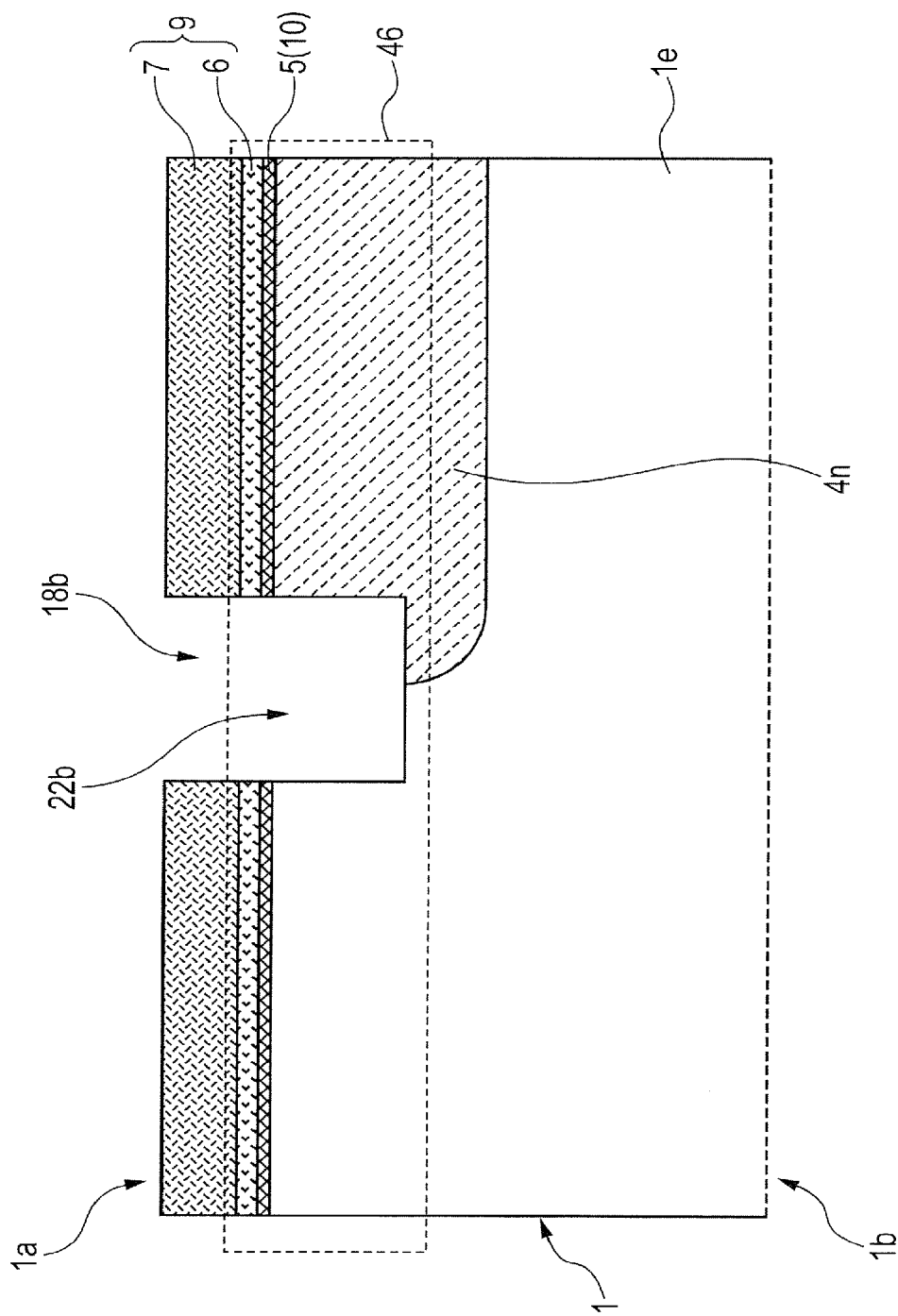
Figure 49:
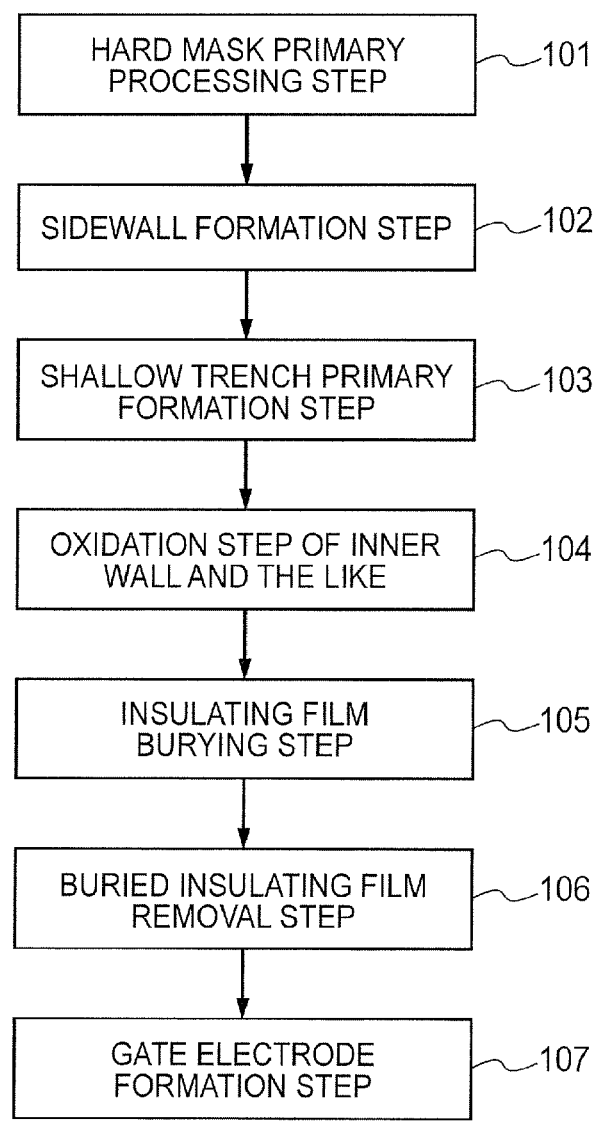
Figure 50:
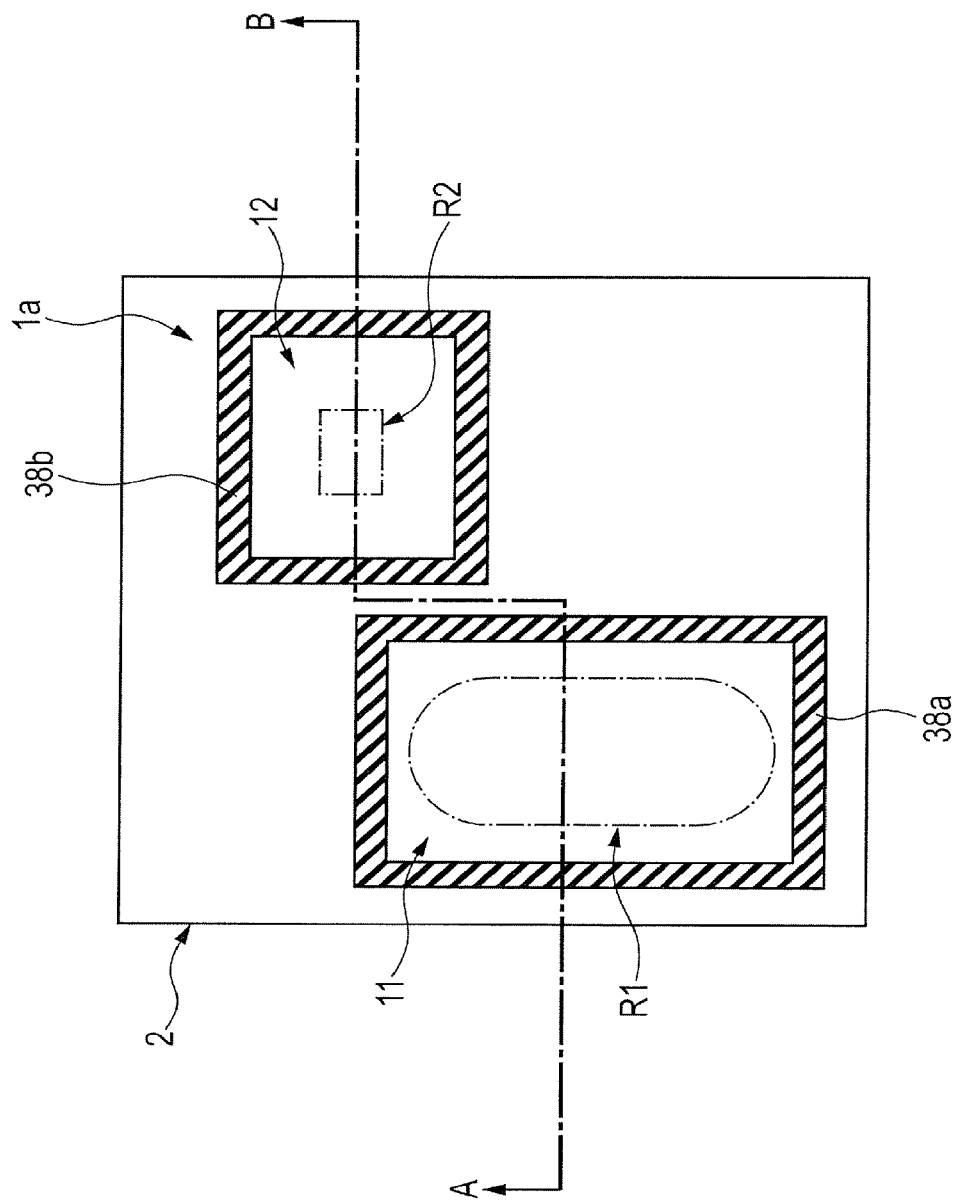
Figure 51:
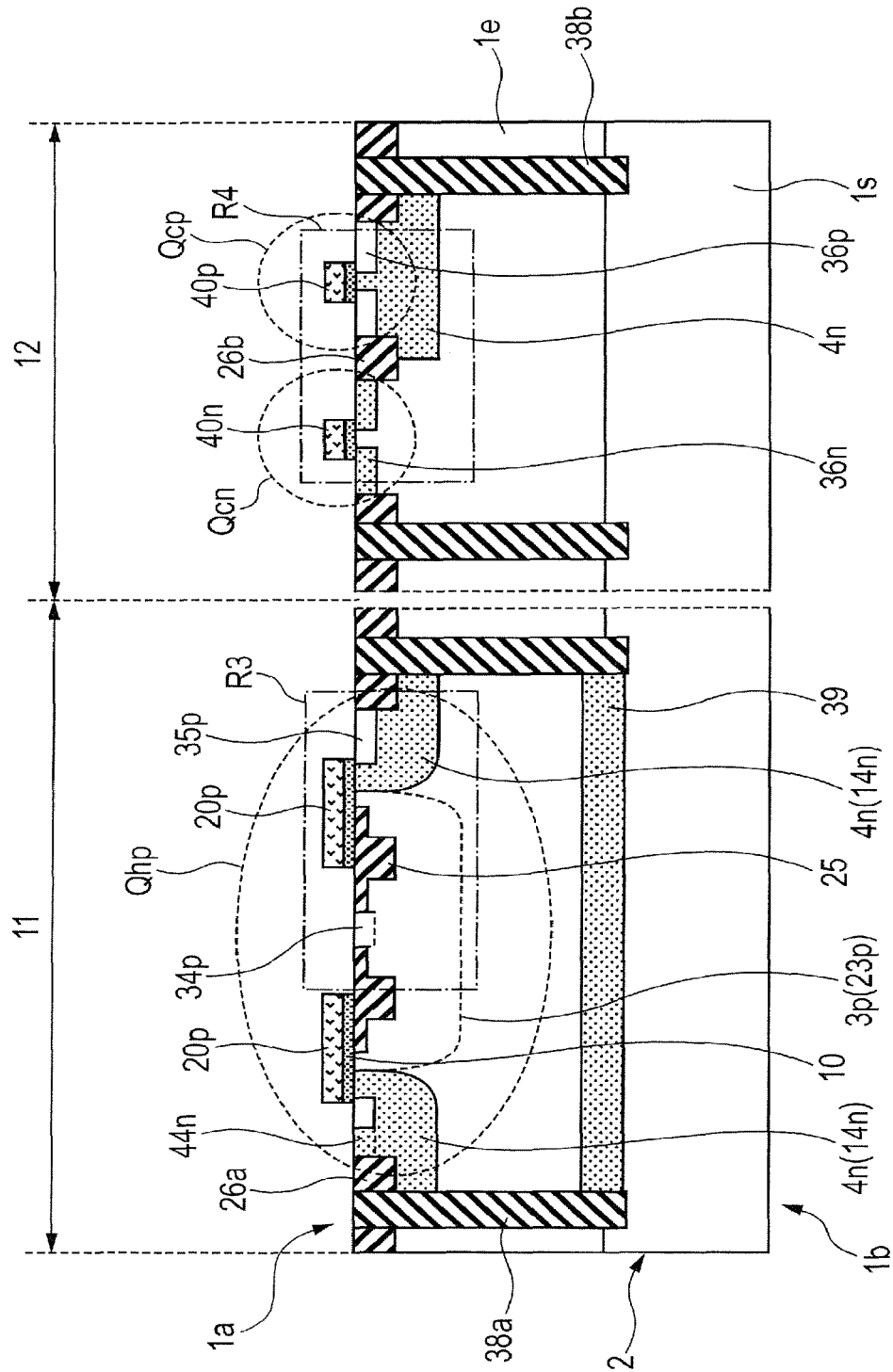
Figure 52:
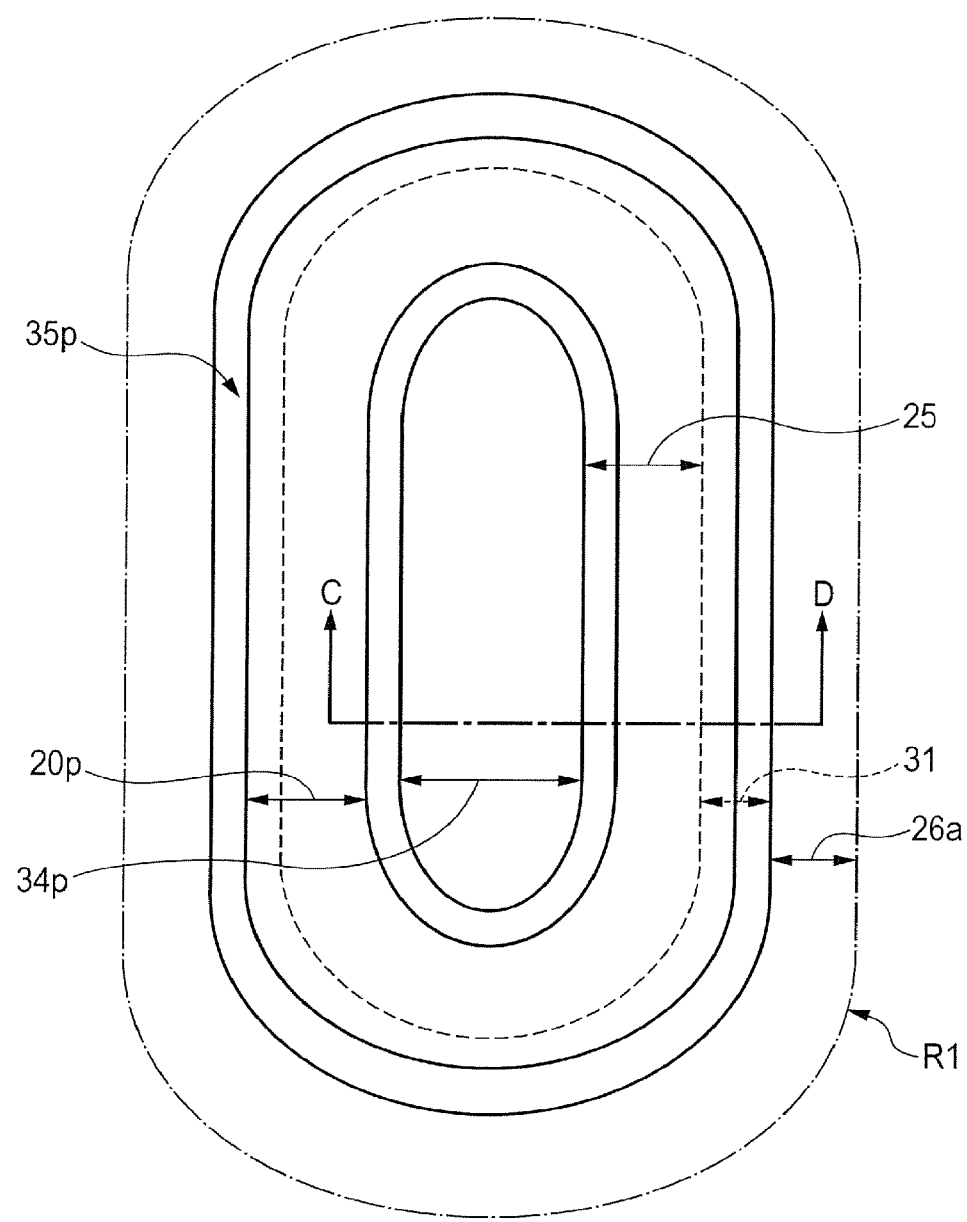
Figure 53:
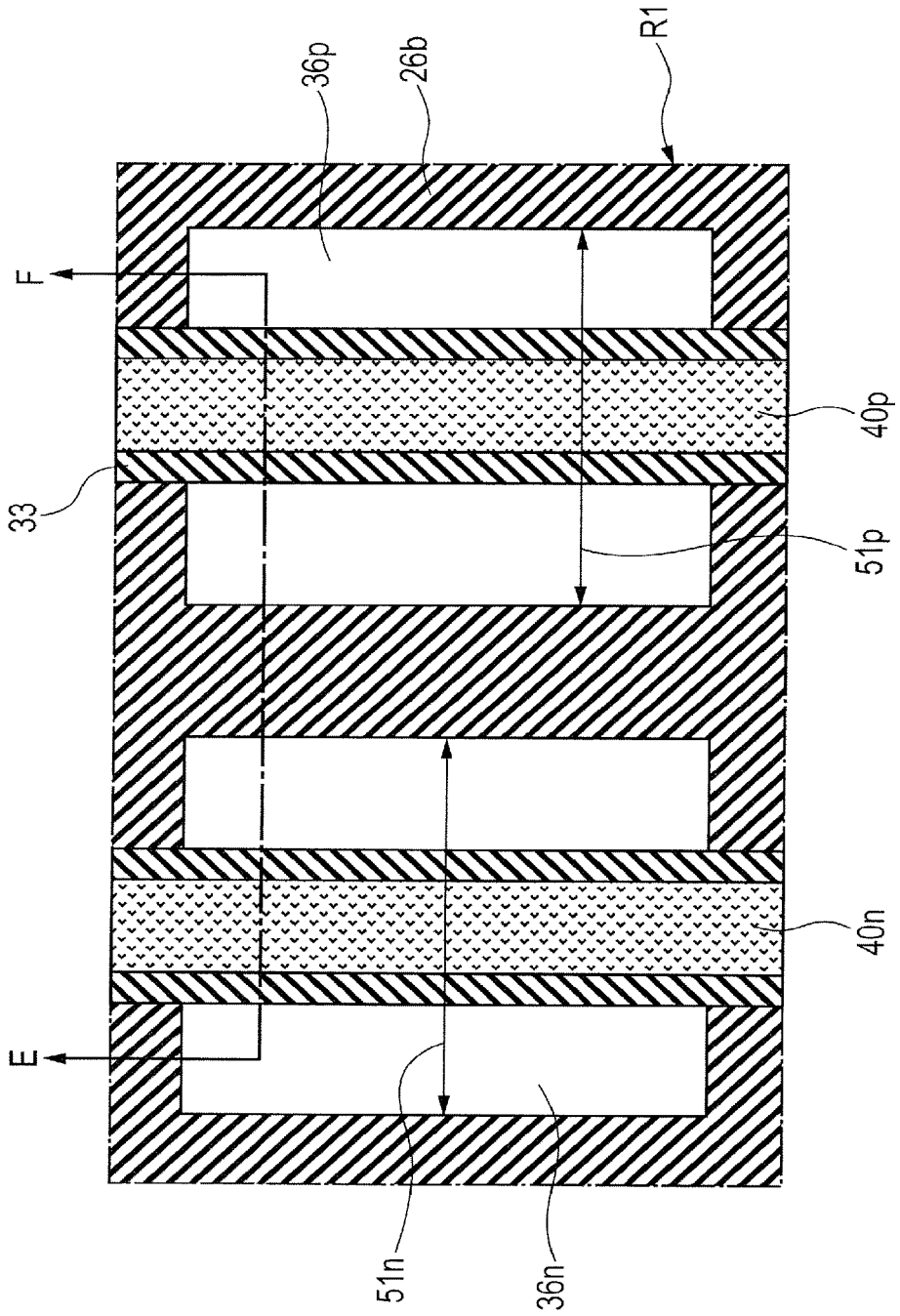

for describing the method of manufacturing a semiconductor integrated circuit device according to First Embodiment of the present application;

FIG. 5 is a device cross-sectional view of the high breakdown voltage device region during the wafer process (an offset drain shallow trench etching step) for describing the method of manufacturing a semiconductor integrated circuit device according to First Embodiment of the present application;

FIG. 6 is a device cross-sectional view of the high breakdown voltage device region during the wafer process (a step of removing the sidewall insulating film for processing) for describing the method of manufacturing a semiconductor integrated circuit device according to First Embodiment of the present application;

FIG. 7 is a device cross-sectional view of the high breakdown voltage device region during the wafer process (a step of etching a shallow trench of an element isolation portion or the like) for describing the method of manufacturing a semiconductor integrated circuit device according to First Embodiment of the present application;

FIG. 8 is a device cross-sectional view of the low breakdown voltage device region during the wafer process (a step of etching a shallow trench of an element isolation portion or the like) for describing the method of manufacturing a semiconductor integrated circuit device according to First Embodiment of the present application;

FIG. 9 is a device cross-sectional view of the high breakdown voltage device region during the wafer process (an inner wall oxide film formation step) for describing the method of manufacturing a semiconductor integrated circuit device according to First Embodiment of the present application;

FIG. 10 is a device cross-sectional view of the low breakdown voltage device region during the wafer process (an inner wall oxide film formation step) for describing the method of manufacturing a semiconductor integrated circuit device according to First Embodiment of the present application;

FIG. 11 is a device cross-sectional view of the high breakdown voltage device region during the wafer process (a buried insulating film formation step) for describing the method of manufacturing a semiconductor integrated circuit device according to First Embodiment of the present application;

FIG. 12 is a device cross-sectional view of the low breakdown voltage device region during the wafer process (a buried insulating film formation step) for describing the method of manufacturing a semiconductor integrated circuit device according to First Embodiment of the present application;

FIG. 13 is a device cross-sectional view of the high breakdown voltage device region during the wafer process (a CMP step) for describing the method of manufacturing a semiconductor integrated circuit device according to First Embodiment of the present application;

FIG. 14 is a device cross-sectional view of the low breakdown voltage device region during the wafer process (a CMP step) for describing the method of manufacturing a semiconductor integrated circuit device according to First Embodiment of the present application;

FIG. 15 is a device cross-sectional view of the high breakdown voltage device region during the wafer process (a buried insulating film etch-back step) for describing the method of manufacturing a semiconductor integrated circuit device according to First Embodiment of the present application;

FIG. 16 is a device cross-sectional view of the low breakdown voltage device region during the wafer process (a buried insulating film etch-back step) for describing the method of manufacturing a semiconductor integrated circuit device according to First Embodiment of the present application;

FIG. 17 is a device cross-sectional view of the high breakdown voltage device region during the wafer process (a hard mask removal step) for describing the method of manufacturing a semiconductor integrated circuit device according to First Embodiment of the present application;

FIG. 18 is a device cross-sectional view of the low breakdown voltage device region during the wafer process (a hard mask removal step) for describing the method of manufacturing a semiconductor integrated circuit device according to First Embodiment of the present application;

FIG. 19 is a device cross-sectional view of the high breakdown voltage device region during the wafer process (a gate polysilicon film formation step) for describing the method of manufacturing a semiconductor integrated circuit device according to First Embodiment of the present application;

FIG. 20 is a device cross-sectional view of the low breakdown voltage device region during the wafer process (a gate polysilicon film formation step) for describing the method of manufacturing a semiconductor integrated circuit device according to First Embodiment of the present application;

FIG. 21 is a device cross-sectional view of the high breakdown voltage device region during the wafer process (a gate electrode processing step) for describing the method of manufacturing a semiconductor integrated circuit device according to First Embodiment of the present application;

FIG. 22 is a device cross-sectional view of the low breakdown voltage device region during the wafer process (a gate electrode processing step) for describing the method of manufacturing a semiconductor integrated circuit device according to First Embodiment of the present application;

FIG. 23 is a device cross-sectional view of the low breakdown voltage device region during the wafer process (a step of introducing an LDD region or the like) for describing the method of manufacturing a semiconductor integrated circuit device according to First Embodiment of the present application;

FIG. 24 is a device cross-sectional view of the high breakdown voltage device region during the wafer process (a gate sidewall formation step) for describing the method of manufacturing a semiconductor integrated circuit device according to First Embodiment of the present application;

FIG. 25 is a device cross-sectional view of the low breakdown voltage device region during the wafer process (a gate sidewall formation step) for describing the method of manufacturing a semiconductor integrated circuit device according to First Embodiment of the present application;

FIG. 26 is a device cross-sectional view of the high breakdown voltage device region during the wafer process (a P type high-concentration source-drain region introduction step) for describing the method of manufacturing a semiconductor integrated circuit device according to First Embodiment of the present application;

FIG. 27 is a device cross-sectional view of the low breakdown voltage device region during the wafer process (an N type and P type high-concentration source-drain regions introduction step) for describing the method of manufacturing a semiconductor integrated circuit device according to First Embodiment of the present application;

FIG. 28 is a device cross-sectional view of the high breakdown voltage device region during the wafer process (a salicide step) for describing the method of manufacturing a semiconductor integrated circuit device according to First Embodiment of the present application;

FIG. 29 is a device cross-sectional view of the low breakdown voltage device region during the wafer process (a salicide step) for describing the method of manufacturing a semiconductor integrated circuit device according to First Embodiment of the present application;

FIG. 30 is a device cross-sectional view of the high breakdown voltage device region during the wafer process (a premetal insulating layer formation step) for describing the method of manufacturing a semiconductor integrated circuit device according to First Embodiment of the present application;

FIG. 31 is a device cross-sectional view of the low breakdown voltage device region during the wafer process (a premetal insulating layer formation step) for describing the method of manufacturing a semiconductor integrated circuit device according to First Embodiment of the present application;

FIG. 32 is a device cross-sectional view of a high breakdown voltage device region during a wafer process (an additional isotropic etching step) following the step of FIG. 5 for describing a modification example (Modification Example 1), in hard mask, of the method of manufacturing a semiconductor integrated circuit device according to First Embodiment of the present application;

FIG. 33 is a device cross-sectional view of a high breakdown voltage device region during a wafer process (a hard mask primary processing step) corresponding to the step of FIG. 1 for describing a modification example (Modification Example 2), in hard mask, of the method of manufacturing a semiconductor integrated circuit device according to First Embodiment of the present application;

FIG. 34 is a device cross-sectional view of the high breakdown voltage device region during the wafer process (a step of forming a sidewall silicon oxide-based insulating film for processing) corresponding to the step of FIG. 3 for describing the modification example (Modification Example 2), in hard mask, of the method of manufacturing a semiconductor integrated circuit device according to First Embodiment of the present application;

FIG. 35 is a device cross-sectional view of the high breakdown voltage device region during the wafer process (a step of forming a sidewall insulating film for processing) corresponding to the step of FIG. 4 for describing the modification example (Modification Example 2), in hard mask, of the method of manufacturing a semiconductor integrated circuit device according to First Embodiment of the present application;

FIG. 36 is a device cross-sectional view of the high breakdown voltage device region during the wafer process (an offset drain shallow trench isotropic etching step) corresponding to the step of FIG. 5 for describing the modification example (Modification Example 2), in hard mask, of the method of manufacturing a semiconductor integrated circuit device according to First Embodiment of the present application;

FIG. 37 is a device cross-sectional view of a high breakdown voltage device region during a wafer process (a hard mask primary processing step) corresponding to the step of FIG. 1 for describing the modification example (Modification Example 3), in hard mask, of the method of manufacturing a semiconductor integrated circuit device according to First Embodiment of the present application;

FIG. 38 is a device cross-sectional view of a high breakdown voltage device region during the wafer process (a hard mask removal step) corresponding to the step of FIG. 17 for describing the modification example (Modification Example 3), in hard mask, of the method of manufacturing a semiconductor integrated circuit device according to First Embodiment of the present application;

FIG. 39 is a device cross-sectional view of a low breakdown voltage device region during the wafer process (a hard mask removal step) corresponding to the step of FIG. 18 (FIG. 38) for describing the modification example (Modification Example 3), in hard mask, of the method of manufacturing a semiconductor integrated circuit device according to First Embodiment of the present application;

FIG. 40 is a device cross-sectional view of the high breakdown voltage device region during the wafer process (an underlying insulating film removal step) for describing the modification example (Modification Example 3), in hard mask, of the method of manufacturing a semiconductor integrated circuit device according to First Embodiment of the present application;

FIG. 41 is a device cross-sectional view of the low breakdown voltage device region during the wafer process (an underlying insulating film removal step) corresponding to the step of FIG. 40 for describing the modification example (Modification Example 3), in hard mask, of the method of manufacturing a semiconductor integrated circuit device according to First Embodiment of the present application;

FIG. 42 is a device cross-sectional view of the high breakdown voltage device region during the wafer process (a gate polysilicon film formation step) corresponding to the step of FIG. 19 for describing the modification example (Modification Example 3), in hard mask, of the method of manufacturing a semiconductor integrated circuit device according to First Embodiment of the present application;

FIG. 43 is a device cross-sectional view of the low breakdown voltage device region during the wafer process (a gate polysilicon film formation step) corresponding to the step of FIG. 20 (FIG. 42) for describing the modification example (Modification Example 3), in hard mask, of the method of manufacturing a semiconductor integrated circuit device according to First Embodiment of the present application;

FIG. 44 is a device cross-sectional view of a high breakdown voltage device region during a wafer process (a step of removing the sidewall insulating film for processing) corresponding to the step of FIG. 6 for describing a modification example (Modification Example 4), in corner rounding of a trench to be filled with an offset drain isolation insulating film, of the method of manufacturing a semiconductor integrated circuit device according to First Embodiment of the present application;

FIG. 45 is a device cross-sectional view of a high breakdown voltage device region during a wafer process (a hard mask secondary processing step) corresponding to the step of FIG. 7 (first half part) for describing the modification example (Modification Example 5), in a formation process of a trench to be filled with an offset drain isolation insulating film, of the method of manufacturing a semiconductor integrated circuit device according to First Embodiment of the present application;

FIG. 46 is a device cross-sectional view of a low breakdown voltage device region during the wafer process (a hard mask secondary processing step) corresponding to the step of FIG. 45 for describing the modification example (Modification Example 5), in a formation process of a trench to be filled with an offset drain isolation insulating film, of the method of manufacturing a semiconductor integrated circuit device according to First Embodiment of the present application;

FIG. 47 is a device cross-sectional view of the high breakdown voltage device region during the wafer process (a shallow trench simultaneous etching step) corresponding to the step of FIG. 7 (latter half part) for describing the modification example (Modification Example 5), in a formation process of a trench to be filled with an offset drain isolation insulating film, of the method of manufacturing a semiconductor integrated circuit device according to First Embodiment of the present application;

FIG. 48 is a device cross-sectional view of the low breakdown voltage device region during the wafer process (a shallow trench simultaneous etching step) corresponding to the step of FIG. 47 for describing the modification example (Modification Example 5), in a formation process of a trench to be filled with an offset drain isolation insulating film, of the method of manufacturing a semiconductor integrated circuit device according to First Embodiment of the present application;

FIG. 49 is a process block flow chart for describing the outline of the method of manufacturing a semiconductor integrated circuit device according to First Embodiment of the present application;

FIG. 50 is a whole chip top view showing one example of a chip layout in First Embodiment (including modification examples) of the present application;

FIG. 51 is a schematic cross-sectional view (DTI isolation structure) of a device corresponding to the A-B cross-section of FIG. 50 showing one example of an element isolation structure and the like in First Embodiment (including modification examples) of the present application;

FIG. 52 is an enlarged chip top view of an upper-surface cutout portion R1 of the high breakdown voltage region shown in FIG. 50;

FIG. 53 is an enlarged chip top view of an upper-surface cutout portion R2 of the low breakdown voltage region shown in FIG. 50; and FIG. 54 is a schematic cross-sectional view (DTI & SOI isolation structures) of a device corresponding to the A-B cross-section of FIG. 50 showing another example of the element isolation structure and the like in First Embodiment (including modification examples) of the present application.

DETAILED DESCRIPTION

[Outline of Embodiment]

First, typical embodiments disclosed herein will be outlined.

1. A method of manufacturing a semiconductor integrated circuit device including the following steps: (a) forming a hard mask film on a first main surface of a semiconductor wafer and making a first opening in the hard mask film in a first region on the first main surface; (b) forming sidewall insulating films on the side surfaces of the hard mask film of the first opening, respectively; (c) forming a first shallow trench in a semiconductor region surface of the first main surface in the first opening, with the hard mask film and the sidewall insulating films as masks; (d) after the step (c), oxidizing at least an exposed portion of an inner surface of the first shallow trench and the semiconductor region surface of the first main surface in the first opening; (e) after the step (d), filling the first shallow trench and the first opening with an insulating film; (f) after the step (e), removing the insulating film outside the first shallow trench so as to leave the insulating film outside the first shallow trench in the first opening and thereby forming a drain offset STI insulating film inside and outside the first shallow trench; and (g) after the step (f), forming a first gate electrode from an upper portion of a gate insulating film in a first active region contiguous to the drain offset STI insulating film to an upper portion of the drain offset insulating film.

2. The method of manufacturing a semiconductor integrated circuit device as described above in 1, further including the following steps: (h) after the step (c) but before the step (d), making a second opening in the hard mask film in a second region on the first main surface and thereby forming a second shallow trench in a semiconductor region surface of the first main surface in the second opening. In the step (d), at least an exposed portion of the inner surface of the second shallow trench is oxidized. In the step (e), the second shallow trench and the second opening are filled with an insulating film. In the step (f), the insulating film outside the second shallow trench is removed to form an interelement STI insulating film in the second shallow trench. In the step (g), a second gate electrode is formed on the gate insulating film in a second active region contiguous to the second shallow trench.

3. In the method of manufacturing a semiconductor integrated circuit device as described above in 1 or 2, the hard mask film has a silicon nitride-based insulating film as a main component film thereof.

4. The method of manufacturing a semiconductor integrated circuit device as described above in 3, further including the following step: (i) after the step (f) but before the step (g), removing the silicon nitride-based insulating film.

5. In the method of manufacturing a semiconductor integrated circuit device as described above in any one of 1 to 4, the hard mask film has a polysilicon film as an upper half main portion thereof.

6. In the method of manufacturing a semiconductor integrated circuit device as described above in any one of 1 to 5, the width of the first shallow trench at the time when the step (d) is started is greater than the width between the sidewall insulating films at the time when the step (c) is completed.

7. The method of manufacturing a semiconductor integrated circuit device as described above in any one of 1 to 6, further including the following step: (j) after the step (c) but before the step (d), removing the sidewall insulating films.

8. A method of manufacturing a semiconductor integrated circuit device including the following steps: (a) forming a hard mask film on a first main surface of a semiconductor wafer and making a first opening in the hard mask film in a first region on the first main surface; (b) forming sidewall insulating films on the side surfaces of the hard mask film of the first opening, respectively; (c) forming a first shallow trench in a semiconductor region surface of the first main surface in the first opening, with the hard mask film and the sidewall insulating films as masks; (d) after the step (c), making a second opening in the hard mask film in a second region on the first main surface and forming a second shallow trench in a semiconductor region surface of the first main surface in the second opening; (e) after the step (d), oxidizing at least an exposed portion of an inner surface of the first shallow trench, an inner surface of the second shallow trench, and the semiconductor region surface of the first main surface in the first opening; (f) after the step (e), filling the first shallow trench, the second shallow trench, the first opening, and the second opening with an insulating film; (g) after the step (f), removing the insulating film outside the first shallow trench and the second shallow trench so as to leave the insulating film outside the first shallow trench in the first opening and thereby forming a drain offset STI insulating film inside and outside the first shallow trench and forming an interelement STI insulating film in the second shallow trench; and (h) after the step (g), forming a first gate electrode from an upper portion of a gate insulating film in a first active region contiguous to the drain offset STI insulating film to an upper portion of the drain offset insulating film and forming a second gate electrode on a gate insulating film in a second active region contiguous to the second shallow trench.

9. In the method of manufacturing a semiconductor integrated circuit device as described above in 8, the hard mask film has a silicon nitride-based insulating film as a main component film thereof.

10. The method of manufacturing a semiconductor integrated circuit device as described above in 9, further including the following step: (i) after the step (g) but before the step (h), removing the silicon nitride-based insulating film.

11. In the method of manufacturing a semiconductor integrated circuit device as described above in any one of 8 to 10, the hard mask film has a polysilicon film as an upper half main portion thereof.

12. In the method of manufacturing a semiconductor integrated circuit device as described above in any one of 8 to 11, the width of the first shallow trench at the time when the step (e) is started is greater than the width between the sidewall insulating films at the time when the step (c) is completed.

13. The method of manufacturing a semiconductor integrated circuit device as described above in any one of 8 to 12, further including the following step: (j) after the step (c) but before the step (e), removing the sidewall insulating films.

14. A method of manufacturing a semiconductor integrated circuit device including the following steps: (a) forming a hard mask film on a first main surface of a semiconductor wafer and making a first opening in the hard mask film in a first region on the first main surface; (b) forming sidewall insulating films on the side surfaces of the hard mask film of the first opening, respectively; (c) after the step (b), forming a second opening in the hard mask film in a second region on the first main surface; (d) forming a first shallow trench in a semiconductor region surface of the first main surface in the first opening and forming a second shallow trench in a semiconductor region surface of the first main surface in the second opening, with the hard mask film and the sidewall insulating films as masks; (e) after the step (d), oxidizing an exposed portion of an inner surface of the first shallow trench, an inner surface of the second shallow trench, and the semiconductor region surface of the first main surface in the first opening; (f) after the step (e), filling the first shallow trench, the second shallow trench, the first opening, and the second opening with an insulating film; (g) after the step (f), removing the insulating film outside the first shallow trench and the second shallow trench so as to leave the insulating film outside the first shallow trench in the first opening and thereby forming a drain offset STI insulating film inside and outside the first shallow trench and an interelement STI insulating film in the second shallow trench; and (h) after the step (g), forming a first gate electrode from an upper portion of a gate insulating film in a first active region contiguous to the drain offset STI insulating film to an upper portion of the drain offset insulating film and forming a second gate electrode on a gate insulating film in a second active region contiguous to the second shallow trench.

15. In the method of manufacturing a semiconductor integrated circuit device as described above in 14, the hard mask film has a silicon nitride-based insulating film as a main component film thereof.

16. The method of manufacturing a semiconductor integrated circuit device as described above in 15, further including the following step: (i) after the step (g) but before the step (h), removing the silicon nitride-based insulating film.

17. In the method of manufacturing a semiconductor integrated circuit device as described above in any one of 14 to 16, the hard mask film has a polysilicon film as an upper half main portion thereof.

18. In the method of manufacturing a semiconductor integrated circuit device as described above in any one of 14 to 17, the width of the first shallow trench at the time when the step (e) is started is greater than the width between the sidewall insulating films at the time when the step (d) is completed.

19. The method of manufacturing a semiconductor integrated circuit device as described above in any one of 14 to 18, further including the following step: (j) after the step (d) but before the step (e), removing the sidewall insulating films.

[Explanation of Description Manner, Basic Terms, and Usage in the Present Application]

1. In the present application, a description of an embodiment may be made after divided in a plurality of sections if necessary for the sake of convenience. These sections are not independent from each other unless otherwise particularly specified, but they may each be a part of a single example or one of them may be a partial detail of the other or a modification example of a part or whole of the other one. In principle, a description of a portion similar to that described before is omitted. Moreover, constituent components in each embodiment are not essential unless otherwise particularly specified, limited to the number theoretically, or apparent from the context.

The term "semiconductor device" or "semiconductor integrated circuit device" as used herein refers mainly to various transistors (active elements) alone, devices obtained by integrating such a transistor as a main component, a resistor, a capacitor, and other components on a semiconductor chip (for example, a single crystal silicon substrate) or the like, and devices obtained by packaging a semiconductor chip and the like. Representative examples of the various transistors include MOSFETs (metal insulator semiconductor field effect transistors) typified by MOSFETs (metal oxide semiconductor field effect transistors). Representative examples of the integrated circuit constitution in this case include CMIS (complementary metal insulator semiconductor) integrated circuits typified by CMOS (complementary metal oxide semiconductor) integrated circuits having an N channel type MISFET and a P channel type MISFET in combination.

A wafer process of today's semiconductor integrated circuit devices, that is, LSI (large scale integration) is usually classified into two parts: an FEOL (front end of line) process and a BEOL (back end of line) process. The FEOL process roughly ranges from a step of carrying in a silicon wafer as a raw material to a premetal step (a step including formation of an interlayer insulating film and the like between the lower end of an M1 wiring layer and a gate electrode structure, formation of a contact hole, embedding of a tungsten plug, and the like). The BEOL process roughly ranges from formation of the M1 wiring layer to formation of a pad opening in a final passivation film on an aluminum-based pad electrode (in a wafer level package process, this process is also included).

In the present application, when a wiring and a via belonging to the same interlayer insulating film will be referred to, attention is paid to the layer of the interlayer insulating film and they are called by the name of the same layer. This means that a via between a first-layer buried wiring and a second-layer buried wiring is referred to as "second-layer via".

2. Similarly, even when such a term "X comprised of A" or the like is used in association with a material, a composition, or the like in the description of the embodiment or the like, it does not exclude a material, composition, or the like containing a component other than A as one of the main constituent components thereof unless otherwise particularly specified or apparent from the context that it excludes such a material, composition, or the like. For example, with regard to a component, the term means "X containing A as a main component" or the like. It is needless to say that even the term "silicon member" is not limited to a pure silicon member but embraces a multi-element alloy such as SiGe alloy containing silicon as a main component or a member containing, in addition, another additive and the like.

Similarly, it is needless to say that the term "silicon oxide film", "silicon oxide-based insulating film", or the like means not only a relatively pure undoped silicon oxide (undoped silicon dioxide) insulating film but also another insulating film having silicon oxide as a main component thereof. For example, a silicon oxide-based insulating film doped with an impurity such as TEOS-based silicon oxide, PSG (phosphorus silicate glass), or BPSG (borophosphosilicate glass) insulating film is also a silicon oxide film. Additional examples of the silicon oxide film or silicon oxide-based insulating film include a thermal oxide film, a CVD oxide film, and a film obtained by the method of application such as SOG (spin on glass) and nano-clustering silica (NSC) films. Further, low-k insulating films such as FSG (fluorosilicate glass), SiOC (silicon oxycarbide), carbon-doped silicon oxide, and OSG (organosilicate glass) films are also silicon oxide films or silicon oxide-based insulating films. Still further, silica-based low-k insulating films (porous insulating films, in which the term "porous" embraces molecularly porous) obtained by introducing voids into a member similar to those mentioned above are silicon oxide films or silicon oxide-based insulating films.

Not only the silicon oxide-based insulating films but also silicon nitride-based insulating films are silicon-based insulating films ordinarily used in semiconductor fields. Examples of materials belonging to silicon nitride-based insulating films include SiN, SiCN, SiNH, and SiCNH. The term "silicon nitride" as used herein means both SiN and SiNH unless otherwise specifically indicated that it is not. Similarly, the term "SiCN" means both SiCN and SiCNH unless otherwise specifically indicated that it does not.

Although SiC has a property similar to that of SiN, SiON (SiOC, SiOCN) needs to be classified as a silicon oxide-based insulating film in many cases. When SiON is used as an etch stop film or a reference light reflection accelerating film, it has a property similar to SiC, SiN, or the like. These oxides and nitrides (carbides, carbonitrides) are therefore classified, depending on which is the main component of them.

Silicon nitride-based insulating films such as silicon nitride films are frequently used as an etch stop film in SAC (self-aligned contact) technology, that is, a CESL (contact etch-stop layer). They are also used as a stress imparting film in SMT (stress memorization technique).

Similarly, the term "nickel silicide" usually means nickel monosilicide but it embraces not only relatively pure one but also alloy, mixed crystal, or the like having nickel monosilicide as a main constituting component. The silicide may be not only nickel silicide but also cobalt silicide, titanium silicide, tungsten silicide or the like which has conventionally been used successfully. As a metal film for silicidation, as well as a Ni (nickel) film, for example, a Ni—Pt alloy film (an alloy film between Ni and Pt), a Ni—V alloy film (alloy film between Ni and V), an Ni—Pd alloy film (alloy film between Ni and Pd), an Ni—Yb alloy film (alloy film between Ni and Yb), or an Ni—Er alloy film (alloy film between Ni and Er) can be used. Such a silicide having nickel as a main metal element thereof will hereinafter be called "nickel-based silicide", collectively.

3. The term "wafer" typically means a single-crystal silicon wafer on which a semiconductor integrated circuit device (which will equally apply to a semiconductor device or an electronic device) is formed. It is needless to say that it also embraces a composite wafer of an insulating substrate and a semiconductor layer or the like, such as an epitaxial wafer, an SOI substrate, or an LCD glass substrate.

4. Preferred examples of the shape, position, attribute, and the like will be shown below, however, it is needless to say that the shape, position, attribute, and the like are not strictly limited to these preferred examples unless otherwise specifically indicated or apparent from the context that they are strictly limited to these preferred examples. Therefore, for example, the term "square" embraces "substantially square"; the term "orthogonal" embraces "substantially orthogonal" and the term "coincide with" embraces "substantially coincide with". This also applies to the terms "parallel" and "right angle". For example, a position away by about 10 degrees from a complete parallel position belongs to the term "parallel".

The term "whole region", "overall region", "entire region", or the like embraces "substantially whole region", "substantially overall region", "substantially entire region" or the like. For example, the term "whole region", "overall region", or "entire region" embraces a portion of the region accounting for 80% or more of the area thereof. This also applies to "whole circumference", "whole length", or the like.

Further, with regard to the shape of a member or the like, the term "rectangular" embraces "substantially rectangular". For example, when a member has a rectangular portion and an unrectangular portion and an area of the latter portion is less than about 20% of the whole area, this member can be regarded rectangular. This also applies to the term "circular" or the like. In this case, when a circular body is divided, a portion having this divided component portion inserted or exerted is a part of the circular body.

With regard to the term "periodic", the term "periodic" embraces "substantially periodic". When a difference in periodicity of individual components is less than about 20%, these components are regarded "periodic". Further, when less than about 20% of the components to be analyzed are outside the above range, these components can be regarded "periodic" as a whole.

The definition in this section is a general one. When a different definition is applied to the following individual descriptions, priority is given to the definition used in the individual descriptions. With regard to a portion not specified in the individual descriptions, the definition or specification in this section is effective unless otherwise definitely denied.

5. When reference is made to any specific numeric value or amount, the specific numeric value or amount may be exceeded or may be underrun unless otherwise particularly specified, limited to the number theoretically, or apparent from the context that it is not exceeded or underrun.

6. The term "LDMOSFET" (lateral double-diffused MOSFET), a main objective in the present application, has historically meant a lateral MOSFET having a gate length determined by double diffusion, but now it widely embraces a lateral MOSFET having, on the surface side thereof, a source, a drain, and a gate irrespective of double diffusion. Needless to say, it embraces a MOSFET having, on the surface side thereof, a source, a drain, and a gate and having, on the back side surface thereof, one of such electrodes formed using a sinker, a buried plug, or the like. In the present application, the term "LDMOSFET" is used in the latter meaning (in a broad sense). The term LDMOSFET, that is, an objective of the present application, widely embraces such a lateral MOSFET whether it is a single transistor or an integrated circuit. In the present application, as one example of the LDMOSFET, mainly a P channel type LDMOSFET will be described specifically, but this description can also be applied to an N channel type LDMOSFET.

In addition, it is needless to say that as a high breakdown voltage transistor ("high breakdown voltage transistor and the like" includes a high breakdown voltage transistor and a power device), various lateral MOSFETS can be used and further, vertical MOSFETS can be used in combination. In addition, as the high breakdown voltage transistor and the like, IGBT (insulated gate bipolar transistor) and the like can also be used in combination.

The term "STI (shallow trench isolation) structure", "STI insulating film", "STI process", or the like as used herein does not mean only a standard STI process, that is, a non-self-aligned STI (N-STI: normal-STI) process, self-aligned STI process (SA-STI, self-aligned STI) process, or the like. It widely embraces an element isolation process or the like which is different from a LOCOS (local oxidation or silicon) process or DTI (deep trench isolation) and is an element isolation technology or the like using filling of a trench with an insulating film and planarization of the film in combination. A modified STI process such as formation process of a drain offset STI insulating film 25 (refer to FIG. 15) is therefore included in the STI process described herein.

The term "SA-STI" as used herein widely means not only a process for a flash memory or the like but also an STI process in which polysilicon is laid on the lower layer portion of a hard mask.

[Details of Embodiment]

The embodiments will next be described more specifically. In all the drawings the same or like members will be identified by the same or like symbols or reference numerals and overlapping descriptions will be omitted in principle.

In the accompanying drawings, hatching or the like is sometimes omitted even from the cross-section when it makes the drawing complicated or when a member can be distinguished clearly from a vacant space. In relation thereto, even a planarly closed hole may be shown without a background contour thereof when it is obvious from the description or the like. On the other hand, hatching may be added even to a drawing which is not a cross section, in order to clearly show that it is not a vacant space.

With regard to alternative naming, when one of two members or the like is called "first" and the other is called "second", they are sometimes named according to the typical embodiment. It is needless to say, however, even when one of two members is called "first member", their naming is not limited to this choice.

1. Description on a main process of a basic example of a method of manufacturing a semiconductor integrated circuit device according to First Embodiment of the present application (mainly, FIGS. 1 to 31)

In the following example, a process using an epitaxial Si wafer (which will hereinafter be called "P type Si epitaxial wafer") obtained by forming, on a P type single crystal silicon wafer (semiconductor substrate), a P type Si epitaxial wafer (the epitaxial layer may be an Si-based epitaxial layer such as SiGe epitaxial layer) having an impurity concentration lower than that of the P type single crystal silicon wafer will be described as one example. The wafer may be a bulk Si-based wafer as well as the epitaxial Si-based wafer. The substrate structure may be that obtained by forming an N type Si epitaxial layer or the like on a P type semiconductor substrate or forming an N type Si epitaxial layer, a P type Si epitaxial layer, or the like on an N type semiconductor substrate. The structure of a semiconductor substrate may be a P type or N type bulk wafer as well as the epitaxial wafer. Further, the structure of a semiconductor substrate may be an SOI wafer as shown in Section 7 or the like as well the epitaxial wafer or bulk wafer.

As an element isolation structure in a wide region, a combined structure (which will hereinafter be called "DTI isolation") of deep trench isolation (DTI) and junction isolation will be shown as an example. As an element isolation structure in a narrow region, shallow trench isolation (STI) or an isolation structure based thereon (they will be called "STI structure", collectively) is used. The element isolation structure in a wide region may however be junction isolation of various types or "SOI isolation" using DTI isolation and SOI isolation in combination, as well as DTI isolation.

In general, a power IC (integrated circuit) has a plurality of various N type and P type power MOSFETs (or MISFETs) constituting a high breakdown voltage circuit, more specifically, a high breakdown voltage transistor, N type and P type low breakdown voltage MISFETs constituting a CMOS control circuit or the like, a bipolar transistor, and the like. In the following example, however, in order to avoid complication, mainly a P channel type LDMOSFET and each of N type and P type low breakdown voltage MISFETs will be described specifically as an example. The following example can therefore be applied to not only a P channel type LDMOSFET but also an N channel type LDMOSFET.

In the power IC or power system IC to be described next, a high breakdown voltage circuit corresponds to various driver circuits, amplifier circuits, level shift circuits, various switching circuits, and the like, while a low breakdown voltage circuit corresponds to a digital or analogue control circuit that controls these circuits.

Further, a gate process of a high breakdown voltage device region and a low breakdown voltage device region will be described specifically with a gate first process as an example. It is needless to say that as a gate process of a low breakdown voltage device region, a gate last process or an intermediate process therebetween may be used.

A gate insulating film will hereinafter be described specifically while using, as an example thereof, a gate insulating film using mainly a silicon oxide film (a silicon oxynitride film or a composite film of them) obtained by thermal oxidation. It is however needless to say that a silicon oxide film, a silicon oxynitride film, a high dielectric constant insulating film, or the like obtained using CVD (chemical vapor deposition) or using CVD and thermal oxidation in combination may be used.

A gate electrode will hereinafter be described specifically while using mainly a polysilicon-based gate electrode as an example. It is needless to say that a so-called metal gate electrode (including a composite film with a polysilicon-based gate electrode) may be used.

Figure 2:
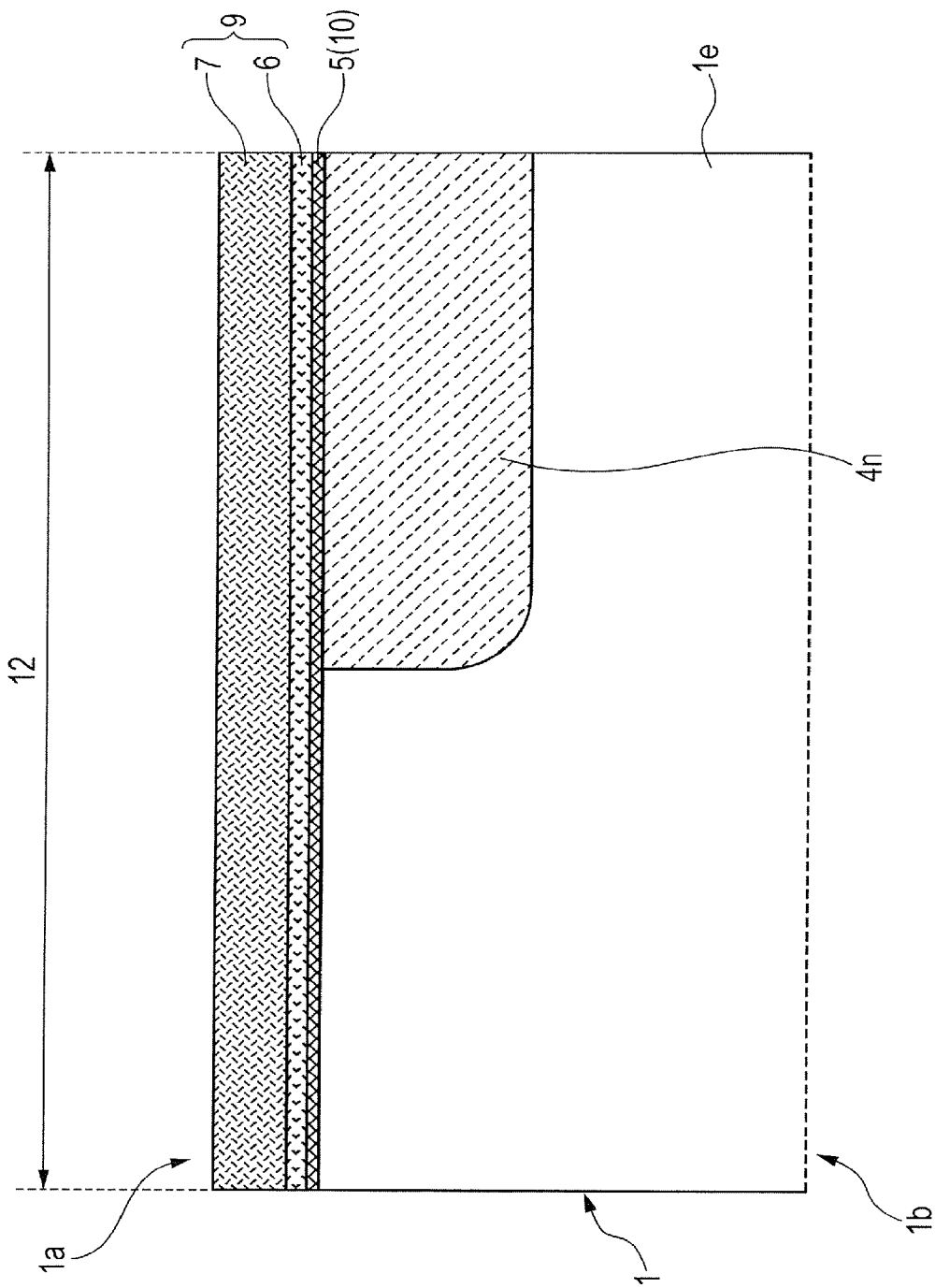
FIG. 2 is a device cross-sectional view of a low breakdown voltage device region during the wafer process (a hard mask primary processing step) for describing the method of manufacturing a semiconductor integrated circuit device according to First Embodiment of the present application.

FIG. 1 is a device cross-sectional view of a high breakdown voltage device region during a wafer process (a hard mask primary processing step) for describing a method of manufacturing a semiconductor integrated circuit device according to First Embodiment of the present application. FIG. 2 is a device cross-sectional view of a low breakdown voltage device region during the wafer process (a hard mask primary processing step) for describing the method of manufacturing a semiconductor integrated circuit device according to First Embodiment of the present application. FIG. 3 is a device cross-sectional view of the high breakdown voltage device region during the wafer process (a step of forming a sidewall silicon oxide film-based insulating film for processing) for describing the method of manufacturing a semiconductor integrated circuit device according to First Embodiment of the present application. FIG. 4 is a device cross-sectional view of the high breakdown voltage device region during the wafer process (a step of forming a sidewall insulating film for processing) for describing the method of manufacturing a semiconductor integrated circuit device according to First Embodiment of the present application. FIG. 5 is a device cross-sectional view of the high breakdown voltage device region during the wafer process (an offset drain shallow trench etching step) for describing the method of manufacturing a semiconductor integrated circuit device according to First Embodiment of the present application. FIG. 6 is a device cross-sectional view of the high breakdown voltage device region during the wafer process (a step of removing the sidewall insulating film for processing) for describing the method of manufacturing a semiconductor integrated circuit device according to First Embodiment of the present application. FIG. 7 is a device cross-sectional view of the high breakdown voltage device region during the wafer process (a step of etching a shallow trench of an element isolation portion or the like) for describing the method of manufacturing a semiconductor integrated circuit device according to First Embodiment of the present application. FIG. 8 is a device cross-sectional view of the low breakdown voltage device region during the wafer process (a step of etching a shallow trench of an element isolation portion or the like) for describing the method of manufacturing a semiconductor integrated circuit device according to First Embodiment of the present application. FIG. 9 is a device cross-sectional view of the high breakdown voltage device region during the wafer process (an inner wall oxide film formation step) for describing the method of manufacturing a semiconductor integrated circuit device according to First Embodiment of the present application. FIG. 10 is a device cross-sectional view of the low breakdown voltage device region during the wafer process (an inner wall oxide film formation step) for describing the method of manufacturing a semiconductor integrated circuit device according to First Embodiment of the present application. FIG. 11 is a device cross-sectional view of the high breakdown voltage device region during the wafer process (a buried insulating film formation step) for describing the method of manufacturing a semiconductor integrated circuit device according to First Embodiment of the present application. FIG. 12 is a device cross-sectional view of the low breakdown voltage device region during the wafer process (a buried insulating film formation step) for describing the method of manufacturing a semiconductor integrated circuit device according to First Embodiment of the present application. FIG. 13 is a device cross-sectional view of the high breakdown voltage device region during the wafer process (a CMP step) for describing the method of manufacturing a semiconductor integrated circuit device according to First Embodiment of the present application. FIG. 14 is a device cross-sectional view of the low breakdown voltage device region during the wafer process (a CMP step) for describing the method of manufacturing a semiconductor integrated circuit device according to First Embodiment of the present application. FIG. 15 is a device cross-sectional view of the high breakdown voltage device region during the wafer process (a buried insulating film etch-back step) for describing the method of manufacturing a semiconductor integrated circuit device according to First Embodiment of the present application. FIG. 16 is a device cross-sectional view of the low breakdown voltage device region during the wafer process (a buried insulating film etch-back step) for describing the method of manufacturing a semiconductor integrated circuit device according to First Embodiment of the present application. FIG. 17 is a device cross-sectional view of the high breakdown voltage device region during the wafer process (a hard mask removal step) for describing the method of manufacturing a semiconductor integrated circuit device according to First Embodiment of the present application. FIG. 18 is a device cross-sectional view of the low breakdown voltage device region during the wafer process (a hard mask removal step) for describing the method of manufacturing a semiconductor integrated circuit device according to First Embodiment of the present application. FIG. 19 is a device cross-sectional view of the high breakdown voltage device region during the wafer process (a gate polysilicon film formation step) for describing the method of manufacturing a semiconductor integrated circuit device according to First Embodiment of the present application. FIG. 20 is a device cross-sectional view of the low breakdown voltage device region during the wafer process (a gate polysilicon film formation step) for describing the method of manufacturing a semiconductor integrated circuit device according to First Embodiment of the present application. FIG. 21 is a device cross-sectional view of the high breakdown voltage device region during the wafer process (a gate electrode processing step) for describing the method of manufacturing a semiconductor integrated circuit device according to First Embodiment of the present application. FIG. 22 is a device cross-sectional view of the low breakdown voltage device region during the wafer process (a gate electrode processing step) for describing the method of manufacturing a semiconductor integrated circuit device according to First Embodiment of the present application. FIG. 23 is a device cross-sectional view of the low breakdown voltage device region during the wafer process (a step of introducing an LDD region or the like) for describing the method of manufacturing a semiconductor integrated circuit device according to First Embodiment of the present application. FIG. 24 is a device cross-sectional view of the high breakdown voltage device region during the wafer process (a gate sidewall formation step) for describing the method of manufacturing a semiconductor integrated circuit device according to First Embodiment of the present application. FIG. 25 is a device cross-sectional view of the low breakdown voltage device region during the wafer process (a gate sidewall formation step) for describing the method of manufacturing a semiconductor integrated circuit device according to First Embodiment of the present application. FIG. 26 is a device cross-sectional view of the high breakdown voltage device region during the wafer process (a P type high-concentration source-drain region introduction step) for describing the method of manufacturing a semiconductor integrated circuit device according to First Embodiment of the present application. FIG. 27 is a device cross-sectional view of the low breakdown voltage device region during the wafer process (an N type and P type high-concentration source-drain regions introduction step) for describing the method of manufacturing a semiconductor integrated circuit device according to First Embodiment of the present application. FIG. 28 is a device cross-sectional view of the high breakdown voltage device region during the wafer process (a salicide step) for describing the method of manufacturing a semiconductor integrated circuit device according to First Embodiment of the present application. FIG. 29 is a device cross-sectional view of the low breakdown voltage device region during the wafer process (a salicide step) for describing the method of manufacturing a semiconductor integrated circuit device according to First Embodiment of the present application. FIG. 30 is a device cross-sectional view of the high breakdown voltage device region during the wafer process (a premetal insulating layer formation step) for describing the method of manufacturing a semiconductor integrated circuit device according to First Embodiment of the present application. FIG. 31 is a device cross-sectional view of the low breakdown voltage device region during the wafer process (a premetal insulating layer formation step) for describing the method of manufacturing a semiconductor integrated circuit device according to First Embodiment of the present application. Based on these drawings, a main process of the method of manufacturing a semiconductor integrated circuit device according to the present application will be described. In the examples shown in FIGS. 1 and 2, FIGS. 7 and 8, FIGS. 9 and 10, FIGS. 11 and 12, FIGS. 13 and 14, FIGS. 15 and 16, FIGS. 17 and 18, FIGS. 19 and 20, FIGS. 21 and 22, FIGS. 24 and 25, FIGS. 28 and 29, and FIGS. 30 and 31, steps corresponding to each other are carried out simultaneously. They may however be selectively carried out separately as needed. In the example shown in FIGS. 26 and 27, steps corresponding to each other are carried out simultaneously, but when they are different in the concentration of an impurity region or implantation energy, they may be carried out separately.

Based on FIGS. 1 and 2, steps until the hard mask processing step for the formation of a shallow trench will be described briefly. The introduction order of an impurity region is only one example and can be changed freely as needed.

A P type Si epitaxial wafer 1 is provided and as shown in FIG. 1, in a high breakdown voltage device region 11 (first region), a P type deep well region 3p which will be a P type offset drain region 23p (P type drift region) is introduced into a surface 1a (main surface opposite to a back surface 1b of a wafer 1) of a P type epitaxial region 1e, for example, by using conventional lithography and ion implantation in combination.

Next, as shown in FIG. 1, in the high breakdown voltage device region 11, a P type well region 4p which will be a P type low-concentration drain region 14p is introduced into the surface 1a of the P type epitaxial region 1e, for example, by using conventional lithography and ion implantation in combination.

Next, as shown in FIG. 1, in the high breakdown voltage device region 11, an N type well region 4n which will be an N type body region 14n is introduced into the surface 1a of the P type epitaxial region 1e, for example, by using conventional lithography and ion implantation in combination. At the same time, as shown in FIG. 2, in a low breakdown voltage device region 12 (second region), an N type well region 4n for the formation of a P channel type transistor is introduced into the surface 1a of the P type epitaxial region 1e, for example, by using conventional lithography and ion implantation in combination.

Next, as shown in FIGS. 1 and 2, an underlying insulating film 5 which will be a gate insulating film 10 is formed on almost the entirety of the surface 1a of the wafer 1. The term "almost" is used because such an insulating is sometimes not formed (or once formed and then removed) around the wafer or in a region where the insulating film cannot be formed for a particular reason (which will equally apply hereinafter to a similar case). Preferred examples of the underlying insulating film 5 include thermal oxide films (for example, a silicon oxide film) having a thickness of about 8 nm.

Next, as shown in FIGS. 1 and 2, an underlying polysilicon film 6 is formed as a portion (underlying portion) of a hard mask film 9 on almost the entirety of the surface 1a of the wafer 1, for example, by CVD (chemical vapor deposition) (using, for example, a $SH_4/N_2$ gas or the like as a film forming gas). The thickness of the underlying polysilicon film 6 is preferably, for example, about 20 nm. This underlying polysilicon film 6 contributes to a so-called self-aligned STI process in burying an interelement STI insulating film or the like.

Next, as shown in FIGS. 1 and 2, a silicon nitride-based hard mask film 7 (for example, a silicon nitride film) is formed as a portion (main portion) of the hard mask film 9 on almost the entirety of the surface 1a of the wafer 1, for example, by low-pressure CVD (using a $SiH_2Cl_2/HN_3/N_2$ gas or the like as a film forming gas). The thickness of the silicon nitride-based hard mask film 7 is preferably for example about 130 nm.

Next, as shown in FIGS. 1 and 2, in the high breakdown voltage device region 11, the hard mask film 9 is processed using conventional lithography and anisotropic dry etching in combination while using the underlying insulating film 5 as an etching stopping layer to form an opening 8 (first opening). A gas used in anisotropic dry etching of the silicon nitride-based hard mask film 7 is preferably, for example, $SF_6/CHF_3$. On the other hand, a gas used in anisotropic dry etching of the underlying polysilicon film 6 is preferably, for example, $HBr/O_2$.

Next, as shown in FIG. 3, a sidewall silicon oxide-based insulating film 15 for processing is formed on almost the entirety of the surface 1a of the wafer 1, for example, by CVD (using an $O_3$/TEOS gas or the like as a film forming gas) or the like. The thickness of the sidewall silicon oxide-based insulating film 15 for processing is preferably, for example, about 30 nm.

Next, as shown in FIG. 4, a sidewall insulating film 16 for processing is formed by etching back the sidewall silicon oxide-based insulating film 15 for processing and the underlying insulating film 5 with the semiconductor substrate as an etching stopper, for example, by anisotropic dry etching. The gas used in this anisotropic dry etching is preferably, for example, $C_4F_8/O_2/Ar$. The width of the sidewall insulating film 16 for processing is preferably, for example, about 30 nm.

Next, as shown in FIG. 5, an offset drain shallow trench 21 (first shallow trench) is formed in a semiconductor region surface 46 of the surface 1a of the wafer 1, for example, by anisotropic dry etching. The gas used in this anisotropic dry etching is preferably, for example, HBr/O$_2$ and etching depth is preferably, for example, about 300 nm.

Next, as shown in FIG. 6, the sidewall insulating film 16 for processing and the underlying insulating film 5 lying therebelow are removed, for example, by wet etching. The etchant to be used in this wet etching is preferably, for example, a hydrofluoric acid-based silicon oxide film etchant. Removal of the sidewall insulating film 16 for processing and the underlying insulating film 5 lying therebelow is optional insofar as they do not obstruct subsequent burying or the like and they may be left as are. When they are left as are, the process becomes simpler. When they are removed, a drain offset STI insulating film 25 (FIG. 17) can have a uniform quality or the like.

Next, as shown in FIGS. 7 and 8, openings 18a and 18b (second openings) are formed in the hard mask film 9 and the underlying insulating film 5, for example, by using conventional lithography (using a patterned shallow trench processing resist film 17 for an element isolation portion or the like) and anisotropic dry etching in combination. Then, without any change, shallow trenches 22a and 22b (second shallow trenches) for an element isolation portion or the like are formed in the semiconductor region surface 46 of the surface 1a of the wafer 1. Then, the resist film 17 which becomes unnecessary is removed, for example, by ashing. In this anisotropic dry etching, for example, the following gas is used. A gas used for the silicon nitride-based hard mask film 7 is preferably, for example, SF$_6$/CHF$_3$; that for the underlying polysilicon film 6 is preferably, for example, HBr/O$_2$; that for the underlying insulating film 5 is preferably, for example, CF$_4$/CHF$_3$; and that for the semiconductor substrate 1 is preferably for example, HBr/O$_2$. The depth of the shallow trenches 22a and 22b is preferably, for example, about 300 nm, which is similar to that of the offset drain shallow trench 21.

Next, as shown in FIGS. 9 and 10, an inner wall oxide film 19 is formed on at least an exposed portion of the semiconductor region surface 46 of the surface 1a of the wafer 1, for example, by thermal oxidation. The thickness of the inner wall oxide film 19 is preferably, for example, about 10 nm. As a method of the thermal oxidation, thermal oxidation treatment or the like, for example, under reduced pressure atmosphere (mixed atmosphere containing oxygen and hydrogen as main components) is preferred. As the method of thermal oxidation, conventional vapor atmosphere thermal oxidation method or another thermal oxidation method may be used as well as so-called in-situ vapor generation method.

Next, as shown in FIGS. 11 and 12, a silicon oxide-based insulating film is formed as a buried insulating film 24 on almost the entire surface on the surface 1a side of the wafer 1, for example, by HDP-CVD (high density plasma chemical vapor deposition). The thickness of the buried insulating film 24 is preferably, for example, about 550 nm. A method other than HDP-CVD may be used as the film formation method. The openings 8, 18a, and 18b in the hard mask film and the shallow trenches 21, 22a, and 22b are filled with the buried insulating film 24.

Next, as shown in FIGS. 13 and 14, the buried insulating film 24 outside the openings 8, 18a, and 18b and the shallow trenches 21, 22a, and 22b in the hard mask film is removed, for example, by CMP (chemical mechanical polishing) to planarize the surface 1a.

Next, as shown in FIGS. 15 and 16, a silicon oxide-based insulating film such as the buried insulating film 24 in the surface 1a of the wafer 1 is etched back by wet etching (for example, with a hydrofluoric acid-based etchant for etching of a silicon oxide-based insulating film) so as to leave the silicon oxide-based insulating film on the inner wall oxide film 19. The thickness of the silicon oxide-based insulating film which has remained after etch back is preferably, for example, about 15 nm (thickness including the inner wall oxide film 19 is about 25 nm). By this etch back, the shallow trenches 22a and 22b (second shallow trenches) for element isolation portion are filled with interelement STI insulating films 26a and 26b. On the other hand, the offset drain shallow trench 21 (first shallow trench) is filled with a drain offset STI insulating film 25. As shown in FIG. 15, the drain offset STI insulating film 25 is comprised of a main portion 25c in and on the offset drain shallow trench 21 and a drain side portion 25d and a source side portion 25s which are contiguous to the main portion and present outside the offset drain shallow trench 21. The thickness of the drain side portion 25d and the source side portion 25s, that is, both end portions 25d and 25s is thinner than the thickness of the main portion 25c.

As shown in FIGS. 17 and 18, the silicon nitride-based hard mask film 7 (FIGS. 15 and 16) which is a main portion of the hard mask film 9, is selectively removed, for example, by wet etching (for example, with hot phosphoric acid).

Next, as shown in FIGS. 19 and 20, a gate polysilicon film 27 which will be a main gate electrode film is formed on almost the entire surface on the surface 1a side of the wafer 1, for example, by CVD. This means that the underlying polysilicon film 6 and the gate polysilicon film 27 together include a main portion of a gate electrode film. The thickness of the gate polysilicon film 27 is preferably, for example, about 140 nm.

Next, as shown in FIGS. 21 and 22, the gate polysilicon film 27 and the underlying polysilicon film 6 are processed, for example, by using conventional lithography and anisotropic dry etching in combination. As a result, as shown in FIG. 21, a gate electrode 20p (gate electrode of a high breakdown voltage transistor) of a P channel type high breakdown voltage LDMOSFET is formed from the upper portion of the gate insulating film 10 in a source-side active region 31 (first active region) adjacent to the drain offset STI insulating film 25 to the upper portion of the drain offset insulating film 25. On the other hand, as shown in FIG. 22, a gate electrode 40p (gate electrode of a low breakdown voltage transistor, a second gate electrode) of a P channel type low breakdown voltage MISFET is formed on the gate insulating film 10 in an active region 51p (second active region) adjacent to the shallow trench 22b (second shallow trench) of an element isolation portion or the like. Further, as shown in FIG. 22, a gate electrode 40n (gate electrode of a low breakdown voltage transistor) of an N channel low breakdown voltage MISFET is formed on the gate insulting film 10 in the active region 51n, similarly. The width (gate length) of the gate electrode 20p depends on a technology node, but in the case where the low breakdown voltage transistor has a gate length of about 80 nm, it is preferably, for example, about 2.6 μm. The gate electrodes 40n and 40p have a width of preferably, for example, about 80 nm.

In FIGS. 21 and 22 and drawings thereafter, a residual film of the underlying insulating film 5 on the active region not covered with the gate electrode or a thin-film surface oxide film similar to it such as sacrificial oxide film for ion implantation is not shown to avoid complications unless otherwise required.

Next, as shown in FIG. 23, in the low breakdown voltage device region 12, an N type LDD (lightly doped drain) region 32n and a p type LDD region 32p are introduced successively, for example, by ion implantation Next, as shown in FIGS. 24 and 25, for example, similar to the above-mentioned step (FIGS. 3 and 4), a gate sidewall insulating film 33 (a silicon oxide-based insulating film, a silicon nitride-based insulating film, or a composite film thereof from the standpoint of a material) is formed around the gate electrodes 20p, 40n, and 40p.

Next, as shown in FIGS. 26 and 27, a P type high-concentration drain region 34p, a P type high-concentration source region 35p, and a P type high-concentration source drain region 36p are introduced, for example, by ion implantation. As shown in FIG. 27, an N type high-concentration source drain region 36n is introduced, for example, by ion implantation. Needless to say, the above-mentioned ion implantation may be carried out in any order.

Next, as shown in FIGS. 28 and 29, silicide films 37d, 37ds, 37g, and 37s are formed, for example, by salicide process. The silicide films are preferably, for example, a cobalt silicide film. As the silicide film, a nickel silicide film, a platinum silicide film, a titanium salicide film, or another silicide film as well as the cobalt silicide film can be used.

Next, as shown in FIGS. 30 and 31, a silicon nitride-based premetal insulating film 41 (for example, a silicon nitride film) is formed as an etch stop film or the like on almost the entire surface on the side of the surface 1a of the wafer 1, for example, by CVD. Next, a silicon oxide-based premetal insulating film 42 (for example, a silicon oxide film) thicker than the silicon nitride-based premetal insulating film 41 is formed on almost the entire surface on the silicon nitride-based premetal insulating film 41, for example, by CVD. Next, a contact hole 47 is formed in the silicon oxide-based premetal insulating film 42 and the silicon nitride-based premetal insulating film 41 and for example, a tungsten plug 43 is buried in the contact hole. Then, a multilayered copper-based buried wiring, that is, damascene wiring layer or the like is formed on the silicon oxide-based premetal insulating film 42 as needed, followed by formation of an external coupling pad (aluminum-based pad, copper-based pad, or the like) on the uppermost layer. If necessary, a bump electrode (solder bump, copper bump, silver bump, gold bump, or the like) is formed on the external coupling pad. The wafer 1 is then divided into individual chips 2 by dicing or the like.

As described above, impact ionization or formation of divots can be suppressed by forming, as a final structure, a structure in which the drain offset STI insulating film 25 (FIG. 30) in the high breakdown voltage device region 11 extends to the active region. Due to the final structure in which the drain offset STI insulating film 25 (FIG. 30) in the high breakdown voltage device region 11 (refer to, for example, FIG. 30) extends to the active region, deterioration of a gate insulating film caused by invasion of high energy carriers generated by impact ionization into the end portion of the active region, which leads to deterioration in reliability, can be prevented. In addition, without divots, deterioration in reliability due to the electric field concentration at the end portion of the active region and undesired thinning of the gate insulating film which will otherwise occur in the conventional STI process can be prevented.

On the other hand, as in the above-mentioned embodiment, when an SA-STI (self-aligned-STI) process is used in the low breakdown voltage device region 12 (refer to, for example, FIG. 31), high integration and also suppression of divot formation can be achieved.

As in the above-mentioned embodiment, using an STI process in both the high breakdown voltage device region 11 (refer to, for example, FIG. 30) and the low breakdown voltage device region 12 (refer to, for example, FIG. 31) enables effective reduction in heat treatment time compared with combined use of a LOCOS process and an STI process.

This means that by using STI processes having respectively different systems for the drain offset STI insulating film 25 (FIG. 30) of the high breakdown voltage device region 11 (refer to, for example, FIG. 30) and another STI insulating film, the most suited processes can be used for these isolation insulating films, respectively. As a result, these isolation insulating films can each have the most suited structure.

By using STI processes having respectively different systems for the drain offset STI insulating film 25 (FIG. 30) of the high breakdown voltage device region 11 (refer to, for example, FIG. 30) and the STI insulating film of the low breakdown voltage device region 12 (refer to, for example, FIG. 31), the most suited processes can be used for these isolation insulating films, respectively. As a result, these isolation insulating films can each have the most suited structure. It is also effective for miniaturization of the low breakdown voltage device region 12 (refer to, for example, FIG. 31).

2. Description on a modification example (Modification Example 1: additional process to isotropic substrate etching), in a formation process of a trench to be filled with an offset drain isolation insulating film, of the method of manufacturing a semiconductor integrated circuit device according to First Embodiment of the present application (mainly, FIG. 32)

The example described in this section is a modification example in which the trench etching step of the basic example described referring to FIG. 5 in Section 1 has been modified. In the present example, the other portion is similar to that described in Section 1 so that only a different portion will be described in principle.

FIG. 32 is a device cross-sectional view of a high breakdown voltage device region during a wafer process (an additional isotropic etching step) following the step of FIG. 5 for describing a modification example (Modification Example 1), in hard mask, of the method of manufacturing a semiconductor integrated circuit device according to First Embodiment of the present application. Based on this drawing, the modification example (Modification Example 1), in a formation process of a trench to be filled with an offset drain isolation insulating film, of the method of manufacturing a semiconductor integrated circuit device according to First Embodiment of the present application will be described. The steps until the step of FIG. 4 are same so that a description is started from the step corresponding to FIG. 5.

In the trench etching step of FIG. 5, single anisotropic dry etching step is used. In this modification example, however, a two-stage step (or multi-stage step) comprised of anisotropic dry etching as a first step and isotropic dry etching as a second step is used. This means that in FIG. 5, after anisotropic dry etching is carried out as a first step, isotropic dry etching is performed as a second step as shown in FIG. 32. The etching depth of anisotropic dry etching as the first step is preferably, for example, about 270 nm. The etching depth of isotropic dry etching as the second step is preferably, for example, about 30 nm. In this case, an overhang width Wo becomes about 30 nm. In this example, therefore, the width Wt of a trench (a first trench width) becomes wider than the width Ws between sidewall insulating films for processing. Further, the bottom end portion of the offset drain shallow trench 21 (first shallow trench) has a more rounded shape compared with the shape shown in FIG. 5.

Steps after that, in other words, steps corresponding to those shown in FIGS. 6 to 31 are essentially the same.

As described above, in the example described in this section, the bottom corner portion of the drain offset isolation trench of the high breakdown voltage portion is rounded more than that in Section 1 because isotropic etching is added. Generation of hot carriers due to impact ionization can be reduced by suppressing electric field concentration in the vicinity of the bottom corner portion of the drain offset isolation trench of the high breakdown voltage portion.

3. Description on a modification example (Modification Example 2: process of adding a polysilicon film to an upper layer of a hard mask), in hard mask, of the method of manufacturing a semiconductor integrated circuit device according to First Embodiment of the present application (mainly, FIGS. 33 to 36)

The example described in this section is a modification example of the basic example described in Section 1. For example, the constitution of the hard mask film 9 shown in FIGS. 1 and 2 and the trench etching step of FIG. 5 have been modified. The other portion is similar to that described in Section 1 so that only a different portion will be described in principle.

In the low breakdown voltage device region 12, this modification example is similar to the above-mentioned embodiment except for the constitution of the hard mask film 9 so that only the high breakdown voltage device region 11 will hereinafter be described.

The example described in this section is a modification example of the basic example described in Section 1 and at the same time, a further modification example of the modification example described in Section 2. It is needless to say that the example described in this section can be applied not only to the basic example described in Section 1 but also to another modification example.

FIG. 33 is a device cross-sectional view of a high breakdown voltage device region during a wafer process (a hard mask primary processing step) following the step of FIG. 1 for describing a modification example (Modification Example 2), in hard mask, of the method of manufacturing a semiconductor integrated circuit device according to First Embodiment of the present application. FIG. 34 is a device cross-sectional view of the high breakdown voltage device region during the wafer process (a step of forming a sidewall silicon oxide-based insulating film for processing) corresponding to the step of FIG. 3 for describing the modification example (Modification Example 2), in hard mask, of the method of manufacturing a semiconductor integrated circuit device according to First Embodiment of the present application. FIG. 35 is a device cross-sectional view of the high breakdown voltage device region during the wafer process (a step of forming a sidewall insulating film for processing) corresponding to the step of FIG. 4 for describing the modification example (Modification Example 2), in hard mask, of the method of manufacturing a semiconductor integrated circuit device according to First Embodiment of the present application. FIG. 36 is a device cross-sectional view of the high breakdown voltage device region during the wafer process (an offset drain shallow trench isotropic etching step) corresponding to the step of FIG. 5 for describing the modification example (Modification Example 2), in hard mask, of the method of manufacturing a semiconductor integrated circuit device according to First Embodiment of the present application. Based on these drawings, the modification example (Modification Example 2), in hard mask, of the method of manufacturing a semiconductor integrated circuit device of First Embodiment of the present application will hereinafter be described.

Steps of this modification example until the introduction of the N type well region 4n in the description referring to FIG. 1 are similar to those of the basic example so that steps after completion of the introduction step of the N type well region 4n will hereinafter be described. As shown in FIG. 33, an underlying insulating film 5 which is to be a gate insulating film 10 is formed on almost the entirety of the surface 1a of the wafer 1. The underlying insulating film 5 is preferably, for example, a thermal oxide film (for example, a silicon oxide film) having a thickness of about 8 nm.

Next, as shown in FIG. 33, an underlying polysilicon film 6 is formed as a portion (underlying portion) of the hard mask film 9 on almost the entirety of the surface 1a of the wafer 1, for example, by CVD (using, for example, $SH_4/N_2$ as a film forming gas). The thickness of the underlying polysilicon film 6 is preferably, for example, about 20 nm. This underlying polysilicon film 6 contributes to a so-called self-aligned STI process used in burying an interelement STI insulating film or the like.

Next, as shown in FIG. 33, a silicon nitride-based hard mask film 7 (for example, a silicon nitride film) is formed as a portion (main portion) of the hard mask film 9 on almost the entirety of the surface 1a of the wafer 1, for example, by low-pressure CVD (using, for example, $SiH_2Cl_2/HN_3/N_2$ as a film forming gas). The thickness of the silicon nitride-based hard mask film 7 is preferably, for example, 90 nm.

Next, as shown in FIG. 33, a hard mask intermediate silicon oxide-based insulating film 29 is formed on almost the entire surface on the silicon nitride-based hard mask film 7, for example, by CVD (using, for example, $O_3$/TEOS as a gas). The thickness of the hard mask intermediate silicon oxide-based insulating film 29 is preferably, for example, about 10 nm.

Next, as shown in FIG. 33, a hard mask upper-half polysilicon film 28 is formed on almost the entire surface on the hard mask intermediate silicon oxide-based insulating film 29, for example, by CVD. The thickness of the hard mask upper-half polysilicon film 28 is preferably, for example, about 250 nm.

Next, as shown in FIG. 33, with the films lying immediately thereunder as an etching stopping layer, films constituting the hard mask film 9 are processed, respectively, by using conventional lithography and anisotropic dry etching in combination to form an opening 8 (first opening). A gas used in anisotropic dry etching of the hard mask upper-half polysilicon film 28 is preferably, for example, $HBr/O_2$. Similarly, a gas used in anisotropic dry etching of the hard mask intermediate silicon oxide-based insulating film 29 is preferably, for example, $CF_4/CHF_3$. Similarly, a gas used in anisotropic dry etching of the silicon nitride-based hard mask 7 is preferably, for example, $SF_6/CHF_3$. A gas used in anisotropic dry etching of the underlying polysilicon film 6 is preferably, for example, $HBr/O_2$.

Next, as shown in FIG. 34, a sidewall silicon oxide-based insulating film 15 for processing is formed on almost the entirety of the surface 1a of the wafer 1, for example, by CVD (using, for example, $O_3$/TEOS as a film forming gas). The thickness of the sidewall silicon oxide-based insulating film 15 for processing is preferably, for example, about 330 nm.

Next, as shown in FIG. 35, a sidewall insulating film 16 for processing is formed by etching back the sidewall silicon oxide-based insulating film 15 for processing and the underlying insulating film 5 by anisotropic dry etching while using the semiconductor substrate as an etching stopper. A gas used in this anisotropic dry etching is preferably, for example, $C_4F_8/O_2/Ar$. The width of the sidewall insulating film 16 for processing is preferably, for example, about 330 nm.

Next, as shown in FIG. 36, in the high breakdown voltage device region 11, an offset drain shallow trench 21 (first shallow trench) is formed in a semiconductor region surface 46 on the side of the surface 1a of the wafer 1, for example, by isotropic dry etching. A gas used in this isotropic dry etching is preferably, for example, $CF_4/O_2$. At the time of this etching, variation in trench etching can be reduced, for example, by detecting an etching endpoint while using disappearance of the hard mask upper-half polysilicon film 28 shown in FIG. 35 as a trigger.

An etching depth at this etching is preferably, for example, 300 nm. A width Wr of a portion of the substrate remaining below the sidewall is preferably, for example, 30 nm. In this example, a trench width Wt (width of first trench) becomes wider than a width Ws between the sidewall insulating films for processing. The offset drain shallow trench 21 (first shallow trench) has a bottom end portion rounder than that of FIG. 32.

Steps after that, that is, steps from FIGS. 6 to 31 are essentially similar to those of the basic example.

As described above, formation of an additional film comprised of a polysilicon film (upper layer), a silicon oxide-based insulating film (lower layer), and the like on an upper portion of the hard mask structure described in Section 1 makes it possible to form a drain offset isolation trench in a high breakdown voltage portion by using only isotropic etching mainly.

Further, this makes it possible to determine the etching endpoint at the time of etching of a drain offset isolation trench in the high breakdown voltage portion while using disappearance of the upper layer polysilicon film of the hard mask (for example, monitoring a gas type exhausted by an etching reaction of silicon) as a trigger and facilitate reduction in variation of a trench depth. In this case, since the drain offset isolation trench in the high breakdown voltage portion has almost no perpendicular portion, the structure thus obtained is ideal for suppressing impact ionization.

When importance is given to reduction in variation of a trench depth, anisotropic etching may be employed for the first half etching as in Section 2.

4. Description on a modification example (Modification Example 3: non-self-aligned STI process), in hard mask, of the method of manufacturing a semiconductor integrated circuit device according to First Embodiment of the present application (mainly, FIGS. 37 to 43)

The example described in this section is a modification example in which the constitution of the hard mask film 9 (FIG. 1) of the basic example described in Section 1 has been modified. The other portions are therefore just the same as those described in Section 1 so that only different portions will be described in principle.

In addition, the example described in this section is a modification example of the basic example described in Section 1 and at the same time, a further modification example of the modification examples described in Sections 2 and 3. It is needless to say that the example described in this Section can be applied not only to the basic example described in Section 1 but also to another modification example.

FIG. 37 is a device cross-sectional view of a high breakdown voltage device region during a wafer process (a hard mask primary processing step) corresponding to the step of FIG. 1 for describing the modification example (Modification Example 3), in hard mask, of the method of manufacturing a semiconductor integrated circuit device according to First Embodiment of the present application. FIG. 38 is a device cross-sectional view of the high breakdown voltage device region during the wafer process (a hard mask removal step) corresponding to the step of FIG. 17 for describing the modification example (Modification Example 3), in hard mask, of the method of manufacturing a semiconductor integrated circuit device according to First Embodiment of the present application. FIG. 39 is a device cross-sectional view of a low breakdown voltage device region during the wafer process (a hard mask removal step) corresponding to the step of FIG. 18 (FIG. 38) for describing the modification example (Modification Example 3), in hard mask, of the method of manufacturing a semiconductor integrated circuit device according to First Embodiment of the present application. FIG. 40 is a device cross-sectional view of the high breakdown voltage device region during the wafer process (an underlying insulating film removal step) for describing the modification example (Modification Example 3), in hard mask, of the method of manufacturing a semiconductor integrated circuit device according to First Embodiment of the present application. FIG. 41 is a device cross-sectional view of the low breakdown voltage device region during the wafer process (an underlying insulating film removal step) corresponding to the step of FIG. 40 for describing the modification example (Modification Example 3), in hard mask, of the method of manufacturing a semiconductor integrated circuit device according to First Embodiment of the present application. FIG. 42 is a device cross-sectional view of the high breakdown voltage device region during the wafer process (a gate polysilicon film formation step) corresponding to the step of FIG. 19 for describing the modification example (Modification Example 3), in hard mask, of the method of manufacturing a semiconductor integrated circuit device according to First Embodiment of the present application. FIG. 43 is a device cross-sectional view of the low breakdown voltage device region during the wafer process (a gate polysilicon film formation step) corresponding to the step of FIG. 20 (FIG. 42) for describing the modification example (Modification Example 3), in hard mask, of the method of manufacturing a semiconductor integrated circuit device according to First Embodiment of the present application. Based on these drawings, the modification example (Modification Example 3), in hard mask, of the method of manufacturing a semiconductor integrated circuit device according to First Embodiment of the present application will be described.

In the example of FIG. 1, the underlying insulating film 5 (gate insulating film 10) and the silicon nitride-based hard mask film 7 have therebetween the underlying polysilicon film 6, while in the present modification example, as shown in FIG. 37, the hard mask film 9 does not have the underlying polysilicon film 6 as a portion thereof. This means that an underlying insulating film 5 (not a gate insulating film) has a silicon nitride-based hard mask 7 directly thereon. The process of the present modification example corresponding to FIG. 1 is therefore as described below. Steps until introduction of the N type well region 4n described referring to FIG. 1 are the same so that a description will be started from a step after completion of the introduction step of the N type well region 4n.

Described specifically, an underlying insulating film 5 is formed on almost the entirety of the surface 1a of the wafer 1 as shown in FIG. 37. The underlying insulating film 5 is preferably, for example, a thermal oxide film (for example, a silicon oxide film) having a thickness of about 10 nm.

Next, as shown in FIG. 37, a silicon nitride-based hard mask film 7 (for example, a silicon nitride film) is formed as a portion (main portion) of the hard mask film 9 on almost the entirety of the surface 1a of the wafer 1, for example, by low-pressure CVD (using, for example, $SiH_2Cl_2/HN_3/N_2$ as a film forming gas). The thickness of the silicon nitride-based hard mask film 7 is preferably, for example, 130 nm.

Next, as shown in FIG. 37, in the high breakdown voltage device region 11, the hard mask film 9 is processed to form an opening 8 (first opening) by using conventional lithography and anisotropic dry etching in combination and using the underlying insulating film 5 as an etching stopper layer. A gas used for anisotropic dry etching of the silicon nitride-based hard mask film 7 is preferably, for example, $SF_6/CHF_3$.

Steps after that are essentially the same as those of FIGS. 2 to 16 so that the description will be continued from the steps after those of FIGS. 17 and 18. FIGS. 38 and 39 show the view after removal of the hard mask film 9.

Next, as shown in FIGS. 40 and 41, the underlying insulating film 5 (refer to FIGS. 17 and 18) is removed, for example, by wet etching (with, for example, a hydrofluoric acid-based silicon oxide film etchant).

Next, as shown in FIGS. 42 and 43, a gate insulating film 10 (for example, a silicon oxide film, an oxynitride film, or a composite film thereof) is formed on at least a semiconductor region surface 46 in active regions 31, 48, 51n, and 51p on the side of the surface 1a of the wafer 1, for example, by thermal oxidation (including oxynitriding). The thickness of the gate insulating film 10 is preferably, for example, 8 nm.

Next, as shown in FIGS. 42 and 43, a gate polysilicon film 27 is formed on almost the entire surface on the side of the surface 1a of the wafer 1, for example, by CVD. The thickness of the gate polysilicon film 27 is preferably, for example, about 160 nm.

The process thereafter is essentially the same as that described in from FIGS. 21 to 31.

As described above, in all the examples described in Sections 1 to 3 (and also, examples described later in Section 5 and 6), an SA-STI process is employed as the STI process. In the example described in this Section, on the other hand, an N-STI (normal STI) is employed. In this case, defects such as divots may be formed in the upper side portion of the STI insulating film (normal STI insulating film) other than the drain offset isolation insulating film in the high breakdown voltage portion. A high voltage is not applied to the normal STI insulating film so that even in this case, problems occur relatively infrequently. Such a process therefore can reduce a production cost further compared with the SA-STI process.

5. Description on a modification example (Modification Example 4: hydrogen annealing additional process), in corner rounding of a trench to be filled with an offset drain isolation insulating film, of the method of manufacturing a semiconductor integrated circuit device according to First Embodiment of the present application (mainly, FIG. 44)

The example described in this section is a modification example in a step between the steps of the basic example described in Section 1 referring to FIGS. 6 and 7. The other steps are just the same as those described in Section 1 so that in this section, only a different portion will be described in principle.

The example described in this section is a modification example of the basic example described in Section 1 and at the same time, a further modification example of the respective modification examples described in Sections 2 to 4. It is needless to say that the example described in this section can be applied not only to the basic example described in Section 1 but also to the other modification examples.

FIG. 44 is a device cross-sectional view of a high breakdown voltage device region during a wafer process (a step of removing the sidewall insulating film for processing) corresponding to the step of FIG. 6 for describing a modification example (Modification Example 4), in corner rounding of a trench to be filled with an offset drain isolation insulating film, of the method of manufacturing a semiconductor integrated circuit device according to First Embodiment of the present application. Based on this drawing, the modification example (Modification Example 4), in corner rounding of a trench to be filled with an offset drain isolation insulating film, of the method of manufacturing a semiconductor integrated circuit device according to First Embodiment of the present application will be described.

In this example, an additional step is inserted between the steps of the basic examples described in FIGS. 6 and 7. As shown in FIG. 44, the bottom end portion of a trench such as the offset drain shallow trench 21 (first shallow trench) or the like is rounded, for example, by subjecting the wafer 1 on the side of the surface 1a to high-temperature annealing treatment. The high-temperature annealing treatment is carried out preferably, for example, under the following conditions: atmosphere: hydrogen atmosphere (atmospheric pressure: for example, about 5 kPa), temperature: 1000° C., and treatment time: about 3 minutes.

As described above, in this example, a trench to be filled with an offset drain isolation insulating film is rounded at the corner thereof, for example, by carrying out high-temperature annealing immediately after trench etching and thereby accelerating re-arrangement of silicon atoms.

This contributes to reduction in impact ionization in the vicinity of the corner of the trench to be buried with an offset drain isolation insulating film.

6. Description on a modification example (Modification Example 5: STI trench simultaneous process for portions including an offset portion), in a formation process of a trench to be filled with an offset drain isolation insulating film, in the method of manufacturing a semiconductor integrated circuit device according to First Embodiment of the present application (mainly, FIGS. 45 to 48)

The example described in this section is a modification example of the process of the basic example described in Section 1 referring to FIGS. 5, 6, 7, and 8. The other steps are just the same as those described in Section 1 so that in this section, only a different portion will be described in principle.

The example described in this section is a modification example of the basic example described in Section 1 and at the same time, a further modification example of the respective modification examples described in Sections 2 to 5. It is needless to say that the example described in this section can be applied not only to the basic example described in Section 1 but also to the other modification examples.

FIG. 45 is a device cross-sectional view of a high breakdown voltage device region during a wafer process (a hard mask secondary processing step) corresponding to the step of FIG. 7 (first half part) for describing the modification example (Modification Example 5), in a formation process of a trench to be filled with an offset drain isolation insulating film, of the method of manufacturing a semiconductor integrated circuit device according to First Embodiment of the present application. FIG. 46 is a device cross-sectional view of a low breakdown voltage device region during the wafer process (a hard mask secondary processing step) corresponding to the step of FIG. 45 for describing the modification example (Modification Example 5), in a formation process of a trench to be filled with an offset drain isolation insulating film, of the method of manufacturing a semiconductor integrated circuit device according to First Embodiment of the present application. FIG. 47 is a device cross-sectional view of the high breakdown voltage device region during the wafer process (a shallow trench simultaneous etching step) corresponding to the step of FIG. 7 (latter half part) for describing the modification example (Modification Example 5), in a formation process of a trench to be filled with an offset drain isolation insulating film, of the method of manufacturing a semiconductor integrated circuit device according to First Embodiment of the present application. FIG. 48 is a device cross-sectional view of the low breakdown voltage device region during the wafer process (a shallow trench simultaneous etching step) corresponding to the step of FIG. 47 for describing the modification example (Modification Example 5), in a formation process of a trench to be filled with an offset drain isolation insulating film, of the method of manufacturing a semiconductor integrated circuit device according to First Embodiment of the present application. Based on these drawings, the modification example (Modification Example 5), in a formation process of a trench to be filled with an offset drain isolation insulating film, of the method of manufacturing a semiconductor integrated circuit device according to First Embodiment of the present application will be described.

In FIGS. 5, 6, 7, and 8, the shallow trenches 22a and 22b (second shallow trenches) of the element isolation portion and the like are etched while having the shallow trench processing resist film 17 of the element isolation portion and the like. In addition, the offset drain shallow trench 21 (first shallow trench) and the shallow trenches 22a and 22b (second shallow trenches) of the element isolation portion and the like are etched separately.

In this example, on the other hand, after formation of openings 18a and 18b (second openings) of the hard mask film in the hard mask film 9 by making use of the shallow trench processing resist film 17, the shallow trench processing resist film 17 is removed. Then, etching of the shallow trenches 21, 22a, and 22b are performed simultaneously. Described specifically, it is performed as follows. Steps described referring to FIGS. 1 to 6 and 9 to 31 are essentially the same so that only steps corresponding to FIGS. 5, 6, 7, and 8 will next be described.

As shown in FIGS. 45 and 46, openings 18a and 18b (second openings) are formed in the hard mask film 9 and the underlying insulating film 5 by using conventional lithography (using a patterned shallow trench processing resist film 17 of the element isolation portion and the like) and anisotropic dry etching in combination. A gas used in this anisotropic dry etching is, for example, as follows. The gas used in etching of the silicon nitride-based hard mask film 7 is preferably, for example, $SF_6/CHF_3$, that used for etching of the underlying polysilicon film 6 is preferably, for example, $HBr/O_2$, and that used for etching of the underlying insulating film 5 is preferably, for example, $CF_4/CHF_3$. The resist film 17 which becomes unnecessary is then removed, for example, by asking.

Next, as shown in FIGS. 47 and 48, shallow trenches 21, 22a, and 22b are then formed in the semiconductor region surface 46 of the surface 1a of the wafer 1, for example, by anisotropic dry etching. A gas to be used in this anisotropic dry etching is preferably, for example, $HBr/O_2$. The depth of the shallow trenches 21, 22a, and 22b is preferably, for example, about 300 nm.

As described above, in the example shown in any of Sections 1 to 5, etching steps for the trench to be filled with a drain offset isolation insulating film and another trench to be filled with an STI insulating film in the high breakdown voltage portion are performed separately, while in the example of this section, these etching steps are performed simultaneously to simplify the process.

The surface of the wafer becomes more flat in this example compared with that shown in FIGS. 7 and 8, which is advantageous because it enables thinning of a resist and improvement in the processing accuracy of the low breakdown voltage device region 11 (FIG. 46).

7. Complementary description and general consideration on the embodiments (including the modification examples) (mainly, FIGS. 49 to 54).

FIG. 49 is a process block flow chart for describing the outline of the method of manufacturing a semiconductor integrated circuit device according to First Embodiment of the present application. FIG. 50 is a whole chip top view showing one example of a chip layout in First Embodiment (including modification examples) of the present application. FIG. 51 is a schematic cross-sectional view (DTI isolation structure) of a device corresponding to the A-B cross-section of FIG. 50 showing one example of an element isolation structure and the like in First Embodiment (including modification examples) of the present application. FIGS. 1, 3 to 7, 9, 11, 13, 15, 17, 19, 21, 24, 26, 28, and 30 correspond to the cross-section cutout portion R3 of the high breakdown voltage device region of FIG. 51, while FIGS. 2, 8, 10, 12, 14, 16, 18, 20, 22, 23, 25, 27, 29 and 31 correspond to the cross-section cutout portion R4 of the low breakdown voltage device region of FIG. 51. FIG. 52 is an enlarged chip top view of an upper-surface cutout portion R1 of the high breakdown voltage region shown in FIG. 50. FIG. 53 is an enlarged chip top view of an upper-surface cutout portion R2 of the low breakdown voltage region shown in FIG. 50. FIG. 54 is a schematic cross-sectional view (DTI & SOI isolation structures) of a device corresponding to the A-B cross-section of FIG. 50 showing another example of the element isolation structure and the like in First Embodiment (including modification examples) of the present application. Based on these drawings, complementary description and general consideration on the embodiment (including the modification examples) will be performed.

(1) Complementary Description and Consideration on the Problems of the Technology Used in First Embodiment (Including Modification Examples)

As described above, in the high breakdown voltage MOSFET and the like (for example, LDMOSFET), using a LOCOS field insulating film or the like for element isolation or another isolation prolongs treatment steps and thereby increases a production cost. Present inventors have revealed that using an STI field insulating film or the like, on the other hand, generates high energy electrons due to impact ionization in the vicinity of the bottom corner portion of a drain isolation insulating film and the high breakdown voltage MOSFET or the like thus obtained has deteriorated reliability. Such a tendency is particularly marked in a high breakdown voltage P type LDMOSFET.

It is the common practice to use, in a 90-nm generation power integrated circuit (device obtained by integrating a power MOSFET, CMISFET, bipolar transistor, and the like if necessary), a LOCOS structure for a high breakdown voltage portion and an STI structure for a low breakdown voltage portion. Investigation by the present inventors has however revealed that since the LOCOS structure includes a heat treatment step which requires a long treatment time, using this structure is disadvantageous in cost.

When an STI isolation structure or the like is used simply for a high breakdown voltage portion, however, a high breakdown voltage transistor such as LDMOSFET has deteriorated reliability due to fracture of a gate insulating film on a drain side. As described above, this tendency is particularly marked in a high breakdown voltage P type LDMOSFET. As described above, reasons of it are as follows: (a) generation of hot carriers due to impact ionization in the vicinity of the bottom corner portion of a drain offset isolation insulating film; and (b) substantial thinning of a gate insulating film and electric field concentration due to divots at the upper side of a drain-side isolation insulating film.

With regard to the reason (a), it has been revealed by simulation and the like that generation of hot carriers can be reduced by rounding the bottom corner portion of the drain offset isolation insulating film, in other words, rounding the corner portion of the bottom of the trench at this portion.

With regard to the reason (b), it is presumed that generation of divots can be suppressed by using a structure or process which does not cause divots and the like. As a countermeasure against it, an SA-STI structure is effective, but its advantage is presumed to be relatively small in cost performance because the LOCOS structure can originally overcome the problems (a) and (b).

The above-mentioned embodiment (including modification examples) has therefore a device structure and process capable of suppressing generation of divots and the like whether or not it uses an SA-STI structure. The above-mentioned embodiment (including modification examples) makes various devices for rounding the bottom corner portion of a trench in order to overcome the problem (a).

(2) Description on the Outline of the Method of Manufacturing a Semiconductor Integrated Circuit Device According to First Embodiment (Mainly FIG. 49)

The outline of the method of manufacturing a semiconductor integrated circuit device according to First Embodiment includes the following steps as shown in FIG. 49. Described specifically, included are (a) a step of forming a hard mask film on a first main surface of a semiconductor wafer and forming a first opening in the hard mask film in a first region on the first main surface (hard mask primary processing step 101); (b) a step of forming a sidewall insulating film on the side surface of the hard mask film of the first opening (sidewall formation step 102); (c) a step of forming a first shallow trench in a semiconductor region surface of the first main surface in the first opening with the hard mask film and the sidewall insulating film as a mask; (d) after the step (c), a step of oxidizing at least an exposed portion of the inner surface of the first shallow trench and the semiconductor region surface on the first main surface in the first opening (oxidation step 104 of inner wall and the like); (e) after the step (d), burying the first shallow trench and the first opening with an insulating film (insulating film burying step 105); (f) after the step (e), a step of removing the insulating film outside the first shallow trench so as to leave the insulating film outside the first shallow trench in the first opening and thereby forming a drain offset STI insulating film inside and outside the first shallow trench (buried insulating film removal step 016); and (g) after the step (f), a step of forming a first gate electrode from an upper portion of the gate insulating film in a first active region contiguous to the drain offset STI insulating film to an upper portion of the drain offset insulating film (gate electrode formation step).

The high breakdown voltage MOSFET obtained using the above method can have improved reliability.

One of the characteristics of the semiconductor device according to the above embodiment is that it uses an STI structure as the isolation structure (that is, the drain offset STI insulating film) in the drain offset region of the high breakdown voltage portion. This makes it possible to effectively decrease the heat treatment time in manufacturing the device.

The following are the other characteristics of the process or structure of the manufacturing method according to the above embodiment (including modification examples) and the device manufactured thereby (the following characteristics can be used either singly or in combination). (i) Drain offset isolation (drain offset STI insulating film) in the high breakdown voltage portion and element-element isolation in the CMOS low breakdown voltage device region each use an STI structure. (ii) In addition, the isolation oxide film for drain offset isolation in the high breakdown voltage portion extends (elongates) in the direction of the active region. (iii) Further, the drain offset isolation (drain offset STI insulating film) has, at the bottom corner portion thereof, a round structure. This means that it has, at the bottom end portion of the trench, a round structure.

The mechanism of them will next be described briefly. Since hot carriers due to impact ionization are likely to travel along the sidewall of the isolation oxide film so that the gate insulating film at the end portion of the active region is likely to be broken. When the isolation oxide film extends in the direction of the active region, on the other hand, a gate breakdown voltage is improved because of the presence of the isolation oxide film having a certain thickness on the sidewall of the isolation oxide film.

In this structure (structure of drain offset STI insulating film), the isolation oxide film has no divots at the upper-end side portion of the isolation oxide film so that the gate insulating film does not become thin at the end portion of the active region and similarly, a gate breakdown voltage is improved.

Further, the rounded bottom corner portion of the drain offset isolation, that is, the rounded bottom end portion of the trench thereat is effective for suppressing impact ionization due to field effect concentration at the isolation corner portion.

(3) Description on One Example of the Chip Layout of First Embodiment (Including Modification Examples) (Mainly, FIG. 50)

One example of the chip layout of First Embodiment (including modification examples) is shown in FIG. 50. As shown in FIG. 50, a semiconductor chip 2 has, on the surface 1a thereof, for example, a high breakdown voltage device region 11 (first region) and a low breakdown voltage device region 12 (second region), isolated from each other, for example, by DTI (deep trench isolation) regions 38a and 38b, that is, deep trench isolation regions. The high breakdown voltage device region 11 has, for example, a high breakdown voltage device. The low breakdown voltage device region 12 has, on the other hand, for example, a CMIS control circuit such as CMIS logic circuit and CMIS analogue circuit, each comprised of a low breakdown voltage device having a breakdown voltage lower than that of the high breakdown voltage device.

(4) Description on a Global Specific Example 1 (Deep Trench Isolation) of the Chip Cross-Section of First Embodiment (Including Modification Examples) (Mainly, FIG. 51)

Next, one example of the A-B cross-section of FIG. 50 is shown in FIG. 51. The cross-section cutout portion R3 of the high breakdown voltage device region of FIG. 51 corresponds to FIGS. 1, 3 to 7, 9, 11, 13, 15, 17, 19, 21, 24, 26, 28, 30, 33-38, 40, 42, 45, and 47.

The DTI (deep trench isolation) structure described below is typically obtained by covering the inner surface of a trench having a relatively narrow width with a silicon oxide-based insulating film or the like and filling the remaining space with polysilicon or the like. The DTI structure is advantageous in a relatively high integration degree, but needless to say, it is not essential. Further, it is needless to say that the structure shown here is only one example and there are various modifications of it.

As shown in FIG. 51, for example, a P type semiconductor substrate is (single crystal silicon semiconductor substrate layer) of a semiconductor chip 2 has, on the side of a surface 1a, for example, a P type epitaxial region 1e (P type epitaxial layer) having a concentration lower than that of the substrate.

First, the high breakdown voltage device region 11 will be described mainly. The P type semiconductor substrate 1s and the P type epitaxial region 1e have therebetween a buried N type region 39 for electrical isolation or the like. A DTI region 38a reaches the P type semiconductor substrate is (also a DTI region 38b reaches it) and constitutes a portion of an isolation structure. The P type epitaxial region 1e has, in and over a semiconductor region surface, various element regions of a P channel type high breakdown voltage LDMOSFET (Qhp). Described specifically, the semiconductor region surface has, for example, an N type body region 14n comprised of an N type well region 4n and a P type offset drain region 23p comprised of a P type deep well region 3p. Further, the N type body region 14n has, in the surface thereof, a P type high-concentration source region 35p and the P type offset drain region 23p has, in the surface thereof, a P type high-concentration drain region 34p. The P type high-concentration drain region 34p and the P type high-concentration source region 35p have, in the semiconductor region surface therebetween, a drain offset STI insulating film 25. The P channel type high breakdown voltage LDMOSFET (Qhp) has, in the semiconductor region surface at the periphery thereof, an interelement STI insulating film 26a. The N type body region 14n has, in the surface thereof, an N type body contact region 44n. Still further, the semiconductor region surface has thereon a gate electrode 20p via the gate insulating film 10.

Next, the low breakdown voltage device region 12 will be described mainly. The P type epitaxial region 1e has, in and over a semiconductor region surface, various element regions of an N channel type low breakdown voltage MISFET (Qcn) and a P channel type low breakdown voltage MISFET (Qcp). Described specifically, the semiconductor region surface has therein, for example, an N type well region 4n constituting the main part of the P channel type low breakdown voltage MISFET (Qcp) and this well region has, in the surface thereof, P type high-concentration source drain regions 36p of the P channel type low breakdown voltage MISFET (Qcp). On the other hand, the P type epitaxial region 1e has, on the surface thereof, N type high-concentration source drain regions 36n of the N channel type low breakdown voltage MISFET (Qcn). The P type high-concentration source drain regions 36p have, on the semiconductor region surface therebetween, a gate electrode 40p via the gate insulating film 10. The N type high-concentration source drain regions 36n have, on the semiconductor region surface therebetween, a gate electrode 40n via the gate insulating film 10. Further, the P channel type low breakdown voltage MISFET (Qcp) and the N channel type low breakdown voltage MISFET (Qcn) have, in the semiconductor region surface therebetween and in the semiconductor region surface at the periphery thereof, an interelement STI insulating film 26b.

(5) Description on One Example of a Planar Structure of a P Type LDMOSFET (Lateral P Channel Power MOSFET) of First Embodiment (Including Modification Examples) (Mainly, FIG. 52)

An enlarged plan view of the upper surface cutout portion R1 of the high breakdown voltage device region in FIG. 50 is shown in FIG. 52. FIGS. 1, 3 to 7, 9, 11, 13, 15, 17, 19, 21, 24, 26, 28, 30, 33 to 38, 40, 42, 45, and 47 are cross-sectional views corresponding to the C-D cross-section of FIG. 52.

As shown in FIG. 52, when the main element portions of the P channel type high breakdown voltage LDMOSFET (Qhp) are viewed two-dimensionally, they have a cyclic or a multiple connecting structure. Described specifically, in this example, the drain offset STI insulating film 25, the source-side active region 31 (first active region), the gate electrode 20p of the P channel type high breakdown voltage LDMOSFET, the P type high-concentration source region 35p, the interelement STI insulating film 26a, and the like have a cyclic structure (multiple connecting structure) when viewed two-dimensionally.

In this example, however, the P type high-concentration drain region 34p and the like located at the center portion has a single connecting structure when viewed two dimensionally.

In other words, the main element portions of the P channel type high breakdown voltage LDMOSFET (Qhp) constituting a cyclic structure have essentially, for example, a cross-section as shown in FIG. 30 over the entire circumference of the cyclic structure. Such a cyclic structure or the like is not essential, but it simplifies the device structure and further, is effective for preventing undesirable reduction in breakdown voltage.

(6) Description on One Example of the Planar Structure of a Core CMISFET of First Embodiment (Including Modification Examples) (Mainly, FIG. 53)

An enlarged plan view of the upper surface cutout portion R2 of the low breakdown voltage device region of FIG. 50 is shown in FIG. 53. FIGS. 2, 8, 10, 12, 14, 16, 18, 20, 22, 23, 25, 27, 29, 31, 39, 41, 43, 46, and 48 are cross-sectional views corresponding to the E-F cross-section of FIG. 53.

As FIG. 53, the interelement STI insulating film 26b has therein (in a region surrounded therewith), active regions 51n and 51p. The active region 51n has therein the gate electrode 40n of the N channel type low breakdown voltage MISFET and it is located so as to cross the active region longitudinally. The region 51p has therein the gate electrode 40p of the P channel type low breakdown voltage MISFET and it is located so as to cross the region longitudinally. The gate electrodes 40n and 40p have, at the periphery thereof, the gate sidewall insulating film 33 and the gate electrodes 40n and 40p have, on both sides thereof, the N type high-concentration source drain region 36n and the P type high-concentration source drain region 36p.

(7) Description on Global Specific Example 2 (SOI Isolation) of the Chip Cross-Section of First Embodiment (Including Modification Examples) (Mainly, FIG. 54)

As the global structure of the chip cross-section of First Embodiment (including modification examples), various structures can be used as well as that shown in FIG. 51. An example using SOI isolation is shown in FIG. 54. This example is a modification example of FIG. 51 and only a difference will be shown below in principle.

In the example of FIG. 51, electrical isolation in the high breakdown voltage device region 11 is achieved by making use of the buried N type region 39 and the like. In the present example, on the other hand, as shown in FIG. 54, the buried N type region 39 is replaced by a buried insulating film 45 which is provided on almost the entire surface between the P type semiconductor substrate layer 1s and the P type epitaxial region 1e. This means that DTI regions 38a and 38b (deep trench isolation regions) reach the buried insulating film 45 and the buried insulating film 45 and the DTI regions 38a and 38b (deep trench isolation regions) reach the buried insulating film 45 and the buried insulating film 45 and the DTI regions 38a and 38b include an isolation structure. Almost the whole region on this isolation structure is an SOI region, in other words, has an SOI structure. The term "almost" is used because a portion of this region is sometimes used as a bulk region.

8. Summary

The invention made by the present inventors has been described specifically based on the embodiment. It is needless to say that the present invention is not limited to or by it but can be changed without departing from the gist of the invention.

For example, in the above embodiment, the multilayer wiring has been described specifically with a copper-based buried wiring as a main example. It is however needless to say that a non-buried wiring (aluminum-based or refractory metal-based wiring) can also be used as the multilayer wiring.

In the above embodiment, the high breakdown voltage MOSFET has been described specifically with LDMOSFET as a main example. It is needless to say that it can be applied similarly to a high breakdown voltage MOSFET of another type having a drain offset structure.

What is claimed is:

1. A semiconductor device comprising:
a substrate having a main surface including a first region and a second region, the first region having a first portion, a second portion and a third portion sequentially, the second region having a fourth portion and a fifth portion adjacently;
a first shallow trench in the substrate at the first portion;
a first insulation film formed in the first shallow trench;
a second insulation film formed on the main surface of the substrate at the third portion;
a first gate electrode formed on the first insulation film and the second insulation film;
a first semiconductor region and a second semiconductor region formed in the main surface of the substrate at both sides of the first gate electrode; and
a second shallow trench in the substrate at the fourth portion;
a third insulation film formed in the second shallow trench; and
a second gate electrode formed over the main surface of the substrate at the fifth portion,
wherein the first insulating film extends on the main surface of the substrate at the second portion,
wherein the third insulating film is formed in the second shallow trench at the fourth portion and does not extend on the main surface of the substrate in the fifth portion,
wherein the depth of the first shallow trench is equal to that of the second shallow trench, and
wherein the first gate electrode is formed over the first insulating film at the second portion contiguous to the first shallow trench.

2. A semiconductor device according to claim 1, wherein the depth of the first insulating film at the second portion is greater than that of the third insulating film at the fifth portion.

3. A semiconductor device according to claim 1, wherein the first insulating film and the third insulating film are silicon oxide films.

4. A semiconductor device according to claim 1, wherein the first gate electrode and the second gate electrode are poly-silicon electrodes.

* * * * *